United States Patent
Shimoshikiryoh et al.

(10) Patent No.: US 10,545,381 B2
(45) Date of Patent: Jan. 28, 2020

(54) LIQUID CRYSTAL DISPLAY PANEL AND MANUFACTURING METHOD THEREOF

(71) Applicant: SHARP KABUSHIKI KAISHA, Sakai, Osaka (JP)

(72) Inventors: Fumikazu Shimoshikiryoh, Sakai (JP); Takehisa Yoshida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/764,958

(22) PCT Filed: Sep. 26, 2016

(86) PCT No.: PCT/JP2016/078138
§ 371 (c)(1),
(2) Date: Mar. 30, 2018

(87) PCT Pub. No.: WO2017/057208
PCT Pub. Date: Apr. 6, 2017

(65) Prior Publication Data
US 2018/0275436 A1    Sep. 27, 2018

(30) Foreign Application Priority Data
Oct. 2, 2015  (JP) .................. 2015-197074

(51) Int. Cl.
*G02F 1/1337* (2006.01)
*G02F 1/1335* (2006.01)
(Continued)

(52) U.S. Cl.
CPC ...... *G02F 1/1337* (2013.01); *G02F 1/133514* (2013.01); *G02F 1/133528* (2013.01);
(Continued)

(58) Field of Classification Search
CPC ............ G02F 1/1337; G02F 1/133514; G02F 1/133528; G02F 1/134336;
(Continued)

(56) References Cited

U.S. PATENT DOCUMENTS

2009/0284703 A1  11/2009  Shoraku et al.
2010/0034989 A1   2/2010  Choi et al.
(Continued)

FOREIGN PATENT DOCUMENTS

JP    2010-039492 A    2/2010
JP    2011-028013 A    2/2011
(Continued)

*Primary Examiner* — Charles S Chang
(74) *Attorney, Agent, or Firm* — ScienBiziP, P.C.

(57) ABSTRACT

A liquid crystal display panel, a pixel electrode in each of the pixels includes a first linear electrode group extending parallel to an azimuth of approximately 45°, a second linear electrode group extending parallel to an azimuth of approximately 135°, a third linear electrode group extending parallel to an azimuth of approximately 225°, and a fourth linear electrode group extending parallel to an azimuth of approximately 315°. One of the first alignment film and the second alignment film includes a first alignment region provided with a pre-tilt angle at an azimuth of approximately 225°, a third alignment region provided with a pre-tilt angle at an azimuth of approximately 45°, and a region provided with substantially no pre-tilt angle or a pre-tilt angle at an azimuth approximately perpendicular to the linear electrode group on which the region is superimposed. The other of the first alignment film and the second alignment film includes a second alignment region provided with a pre-tilt angle at an azimuth of approximately 135°, a fourth alignment region provided with a pre-tilt angle at an azimuth of approximately 315°, and a region provided with substantially no pre-tilt angle or a pre-tilt angle at an azimuth approximately per-
(Continued)

pendicular to the linear electrode group on which the region is superimposed.

11 Claims, 50 Drawing Sheets

(51) Int. Cl.
*G02F 1/1343* (2006.01)
*H01L 27/12* (2006.01)
(52) U.S. Cl.
CPC ...... *G02F 1/134336* (2013.01); *H01L 27/124* (2013.01); *G02F 2001/133746* (2013.01); *G02F 2201/123* (2013.01)
(58) Field of Classification Search
CPC ... G02F 2001/133746; G02F 2201/123; H01L 27/124

USPC ........................................................ 349/129
See application file for complete search history.

(56) References Cited

U.S. PATENT DOCUMENTS

| | | |
|---|---|---|
| 2011/0019142 A1 | 1/2011 | Inoue et al. |
| 2011/0032464 A1* | 2/2011 | Shin ................. G02F 1/133753 349/123 |
| 2012/0002144 A1 | 1/2012 | Shoraku et al. |
| 2013/0114029 A1 | 5/2013 | Shoraku et al. |

FOREIGN PATENT DOCUMENTS

| | | |
|---|---|---|
| JP | 2011-085738 A | 4/2011 |
| JP | 5184618 B2 | 4/2013 |

* cited by examiner

Alignment direction near TFT

Alignment direction near CF

Fig. 6

TFT substrate

| First | | | Second | | | Combined |
|---|---|---|---|---|---|---|
| Alignment direction | Exposure direction | Scanning direction | Alignment direction | Exposure direction | Scanning direction | Alignment direction |
| | Polarization axis rotated by 45° | | | Polarization axis rotated by 45° | | |

Fig. 7

CF substrate

| First | | | Second | | | Combined |
|---|---|---|---|---|---|---|
| Alignment direction | Exposure direction | Scanning direction | Alignment direction | Exposure direction | Scanning direction | Alignment direction |
| | Polarization axis rotated by 45° | | | Polarization axis rotated by 45° | | |

(a) Polarization axis rotated by 45°

(b)

Fig. 41
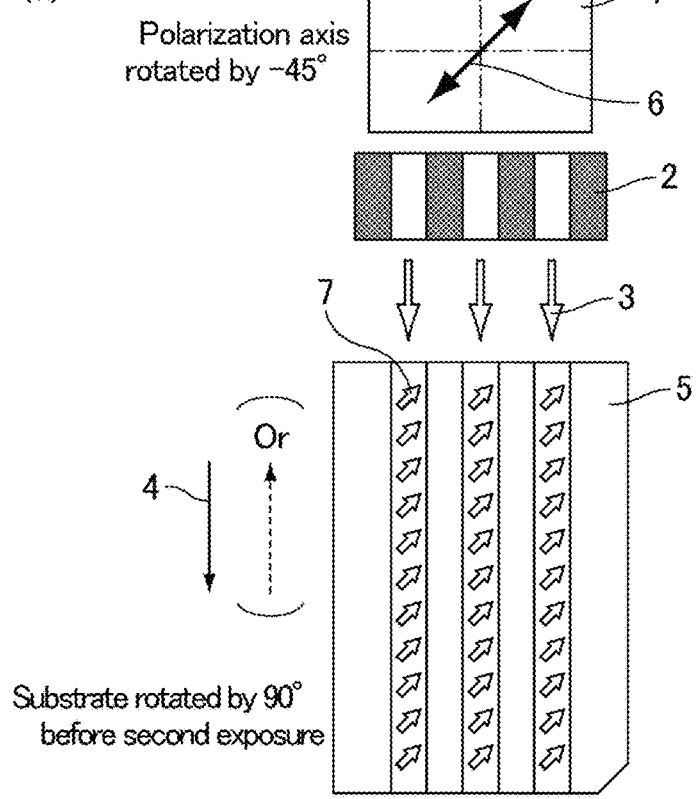
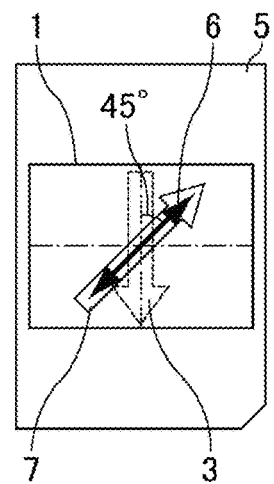

Fig. 45

TFT substrate

| | First | | | | Second | | | | Third | | | | Fourth | | Combined |
|---|---|---|---|---|---|---|---|---|---|---|---|---|---|---|---|
| Alignment direction | Exposure direction | Scanning direction | | Alignment direction | Exposure direction | Scanning direction | | Alignment direction | Exposure direction | Scanning direction | | Alignment direction | Exposure direction | Scanning direction | Alignment direction |
| | Polarization axis rotated by 45° | | | | Polarization axis rotated by 45° | | | | Polarization axis rotated by 45° | | | | Polarization axis rotated by 45° | | |

Fig. 46

Alignment direction near TFT

Alignment direction near CF

Fig. 58

Alignment direction near TFT

Alignment direction near CF

LIQUID CRYSTAL DISPLAY PANEL AND MANUFACTURING METHOD THEREOF

TECHNICAL FIELD

The present invention relates to liquid crystal display panels and manufacturing methods thereof. More specifically, the present invention relates to a liquid crystal display panel that exhibits a high transmittance and enhanced response characteristics, can sufficiently remove a mark left by pushing with a finger, and is easily manufacturable; and a manufacturing method thereof.

BACKGROUND ART

Liquid crystal display panels have a configuration in which a liquid crystal display element is held between paired glass substrates, for example, and have characteristics such as thin profile, light weight, and low power consumption. Having such characteristics, liquid crystal display panels are indispensable for products used in daily life and business, such as automotive navigation systems, electronic book readers, digital photo frames, industrial equipment, televisions, personal computers, smartphones, and tablet PCs. For these applications, liquid crystal display panels in various modes have been developed which employ electrode arrangements and substrate designs to vary the optical characteristics of liquid crystal layers.

Recent display modes for liquid crystal display panels include vertical alignment (VA) modes which align liquid crystal molecules having negative anisotropy of dielectric constant in the direction perpendicular to the substrate surfaces. Vertical alignment mode liquid crystal display panels are used in the applications described above owing to their wide viewing angle. In particular, the following liquid crystal display panels have been put into practical use: multi-domain vertical alignment (MVA) liquid crystal display panels in which one of the substrates is provided with electrode slits and the other is provided with projections, as alignment control structures, for pixel division (alignment division); and patterned vertical alignment (PVA) mode liquid crystal display panels in which both of the substrates are provided with electrode slits for pixel division (alignment division).

The MVA mode and the PVA mode, however, can still be improved in that their response speed is low. In other words, upon application of high-level voltage to switch the mode from black to white, only liquid crystal molecules near the electrode slits and projections react instantly and liquid crystal molecules away from these alignment control structures are slow to respond.

In order to increase the response speed, it is effective to provide an alignment film to the entire surface of each substrate, perform alignment treatment on the films, and provide a pre-tilt angle to liquid crystal molecules in advance. Also in the VA mode, by slightly tilting liquid crystal molecules in advance from the vertical alignment films, liquid crystal molecules can be easily tilted when voltage is applied to the liquid crystal layer, and thus the response speed can be increased.

Examples of a VA mode liquid crystal display device utilizing vertical alignment films whose alignment treatment directions on the substrates are perpendicular to each other to give a twist structure to liquid crystal molecules include a liquid crystal display device disclosed in Patent Literature 1. The liquid crystal display device includes a vertical alignment liquid crystal layer; a first substrate and a second substrate; a first electrode, which is arranged on the first substrate so as to face the liquid crystal layer; a second electrode, which is arranged on the second substrate so as to face the liquid crystal layer; and at least one alignment film, which is arranged in contact with the liquid crystal layer, wherein either the first substrate or the second substrate includes an opaque member, which includes an opaque portion for shielding an intersection between a boundary area of each of the first, second, third and fourth liquid crystal domains, which is adjacent to another one of the liquid crystal domains, and one of the first, second, third and fourth edge portions from incoming light.

Examples of a VA mode liquid crystal display device having a four-division alignment structure in which a pre-tilt angle is provided to liquid crystal molecules in advance include a liquid crystal display device disclosed in Patent Literature 2. The liquid crystal display device includes two polarizing plates whose polarization axes are perpendicular to each other; and multiple pixels. In the display device, the pixels each include a liquid crystal layer containing a nematic liquid crystal material whose anisotropy of dielectric constant is negative, a first electrode, a second electrode facing the first electrode across the liquid crystal layer, and paired vertical alignment films disposed between the first electrode and the liquid crystal layer and between the second electrode and the liquid crystal layer. The first electrode includes a main portion and multiple branch portions coupled with the main portion. The branch portions include a first group with multiple first branches extending in the first azimuth direction in stripes, a second group with multiple second branches extending in the second azimuth direction in stripes, a third group with multiple third branches extending in the third azimuth direction in stripes, and a fourth group with multiple fourth branches extending in the fourth azimuth direction in stripes. A difference between any two of the first azimuth, second azimuth, third azimuth, and fourth azimuth is approximately equal to an integer multiple of 90°, and the azimuths form an angle of approximately 45° with the polarization axes of the two polarizing plates. When no voltage is applied to the liquid crystal layer, the pre-tilt azimuths of liquid crystal molecules near the paired respective vertical alignment films are defined by the paired vertical alignment films.

CITATION LIST

Patent Literature

Patent Literature 1: JP 5184618 B
Patent Literature 2: JP 2011-85738 A

SUMMARY OF INVENTION

Technical Problem

However, the liquid crystal display panel disclosed in Patent Literature 1 (such a liquid crystal display panel is also referred to as a four-domain-reverse twisted nematic (4D-RTN) alignment liquid crystal display panel because the alignment region in a pixel is divided into four and the alignment treatment directions on the substrates are perpendicular to each other) has the following problems (1) and (2) caused by increase in definition of pixels in recent liquid crystal display panels.

(1) The proportion of irregular alignment regions in a pixel has increased, and thus the alignment needs to be more stabilized (for example, see FIG. 51). (2) In the 4D-RTN alignment liquid crystal display panel disclosed in Patent Literature 1, fylfot dark lines are generated and thus the transmittance and response performance need to be enhanced.

These problems (1) and (2) are presumed to be due to the following factors [1] and [2].

[1] The twist angle is greater than 90° between the alignment direction of liquid crystal molecules LC1 affected by an oblique electric field generated in the pixel edge portion shown in FIG. 52 (liquid crystal molecules on the outline of the quadrangular pixel) and the alignment direction of liquid crystal molecules LC2 surrounded by a dot-dashed line in a domain in which liquid crystal molecules are stably aligned. This produces irregular alignment regions (dark line edge portions) surrounded by dashed lines, leading to alignment disorder. Furthermore, reduction in pixel size causes the width of an irregular alignment region to be about 10 μm, which increases the proportion of irregular alignment regions and may eventually destabilize the alignment in the entire pixel. [2] The width of irregular alignment regions and the other dark line main portions shown in FIG. 52 is about 10 μm. With this structure, reduction in pixel size decreases the proportion of regions other than the dark lines, possibly decreasing the transmittance and response performance.

Patent Literature 2 also discloses in FIG. 6 and FIG. 7 an alignment treatment method of the embodiment of Patent Literature 2. This alignment treatment method, however, fails to produce a liquid crystal display device with reduced fylfot dark lines.

FIG. 72 is a conceptual view showing pre-tilt directions of liquid crystal molecules provided by first exposure, second exposure, and both of the exposure treatments of a photo-alignment film of a thin-film transistor (TFT) substrate, together with exposure directions and scanning directions, in each pixel in the liquid crystal display device shown in FIG. 6 of Patent Literature 2. FIG. 73 is a conceptual view showing pre-tilt directions of liquid crystal molecules provided by first exposure, second exposure, and both of the exposure treatments of a photo-alignment film of a color filter (CF) substrate, together with exposure directions and scanning directions, in each pixel in the liquid crystal display device shown in FIG. 7 of Patent Literature 2. FIG. 74 is a conceptual view showing liquid crystal layer alignment achieved by the photo-alignment film of the TFT substrate in FIG. 72 and the photo-alignment film of the CF substrate in FIG. 73 in combination.

Since the exposure direction and the scanning direction are parallel to each other in the alignment treatment method shown in FIG. 72 and FIG. 73, a conventional exposure device can be used. The liquid crystal layer alignment achieved by this alignment method, however, is not radial alignment with reduced fylfot dark lines (for example, the alignment direction of liquid crystal molecules shown in FIG. 12(b) of Patent Literature 2), as shown in FIG. 74.

FIG. 7 of Patent Literature 2 is a view showing the exposure direction and the scanning direction for the CF substrate from the alignment film surface of the photo-alignment film (view with the photo-alignment film surface facing up). Meanwhile, FIG. 72 and FIG. 73 each show the exposure direction and the scanning direction viewed from the top surface (surface facing the viewer) of the liquid crystal display panel including the TFT substrate and the CF substrate bonded to each other as in the other drawings of the present invention. FIG. 72 is a view with the alignment film surface of the photo-alignment film on the TFT substrate facing up. FIG. 73 is a view with the alignment film surface of the photo-alignment film on the CF substrate facing down.

Moreover, although FIG. 12(b) of Patent Literature 2 discloses a 4D-RTN alignment liquid crystal display panel providing radial alignment as a conventional technology, such a 4D-RTN alignment liquid crystal display panel has the following problems (3) and (4).

(3) Electrodes provided with slits (slit electrodes) as shown in FIG. 1(a) of Patent Literature 2 can be used to reduce the width of a cross-shaped dark line generated in the center portion of a pixel. This configuration, however, may inhibit removal of a mark left by pushing with a finger, and thus needs to be improved so as to be able to remove a mark left by pushing with a finger. (4) The 4D-RTN alignment liquid crystal display panel shown in FIG. 12(b) of Patent Literature 2 as a conventional technology can reduce fylfot dark lines. However, such a display panel is difficult to produce with a conventional photo-alignment exposure device (apparatus for manufacturing a liquid crystal panel) and thus the display panel requires development of a new exposure device. Moreover, such an exposure device is difficult to produce because of problems such as the size larger than that of conventional exposure devices, thereby increasing the production cost.

The problems (3) and (4) described above are presumed to be due to the following factors [3] and [4].

[3] The direction in which liquid crystal molecules are rotated for alignment by electric fields generated by a slit electrode is different from the pre-tilt direction of the liquid crystal molecules provided by photo-alignment. [4] Since the direction (exposure direction) in which liquid crystal molecules are desired to be aligned (pre-tilted) is perpendicular to the scanning direction (moving direction of the substrate) by the exposure device, exposure with a conventional exposure device is difficult.

The factor [4] is further described. FIG. 75 is a conceptual view showing pre-tilt directions of liquid crystal molecules provided by first exposure, second exposure, and both of the exposure treatments of a photo-alignment film of a TFT substrate, together with exposure directions and scanning directions, in each pixel in the liquid crystal display device described in paragraph [0040] of Patent Literature 2. FIG. 76 is a conceptual view showing pre-tilt directions of liquid crystal molecules provided by first exposure, second exposure, and both of the exposure treatments of a photo-alignment film of a CF substrate, together with exposure directions and scanning directions, in each pixel in the liquid crystal display device described in paragraph [0040] of Patent Literature 2. FIG. 77 is a conceptual view showing liquid crystal layer alignment achieved by the photo-alignment film of the TFT substrate in FIG. 75 and the photo-alignment film of the CF substrate in FIG. 76 in combination.

Radial alignment reducing fylfot dark lines shown in FIG. 77 can be achieved by the method described in paragraph [0040] of Patent Literature 2 (see FIG. 75 to FIG. 77), but the exposure direction and the scanning direction are perpendicular and not parallel to each other as shown in FIG. 75 and FIG. 76.

Patent Literature 2 itself actually does not mention scanning directions. Hence, the scanning direction (direction in which scanning can be performed) is drawn in each of FIG. 72, FIG. 73, FIG. 75, and FIG. 76 on the assumption that the production process involves common scanning.

The present invention has been made in view of the above current state of the art and aims to provide a liquid crystal display panel that exhibits a high transmittance and rapid response, can sufficiently remove a mark left by pushing with a finger, and is easily manufacturable; and a manufacturing method thereof.

Solution to Problem

The inventors of the present invention have made various studies on a liquid crystal display panel which can achieve a high transmittance and rapid response while maintaining the simplicity of the alignment treatment process for the alignment films. As a result, they have focused on a four domain-electrically controlled birefringence (4D-ECB) alignment liquid crystal display panel which is birefringent for light passing through the liquid crystal display panel. In this liquid crystal display panel, the alignment region in each pixel or half pixel is divided into four, and photo-alignment films are used which align liquid crystal molecules in the direction approximately perpendicular to the film surfaces with no voltage applied while providing a pre-tilt angle to the liquid crystal molecules in regions subjected to photo-alignment treatment. The films align the liquid crystal molecules in the direction more parallel to the alignment film surfaces with voltage higher than the threshold value applied. The inventors have decided to employ a new 4D-ECB alignment structure producible with a conventional exposure device and employed slit electrodes. They have then found that 4D-ECB alignment in a specific direction can eliminate irregular alignment regions in the edge portions and the slit electrodes can reduce the width of the dark lines in the main portion. This enables stable alignment even in a high-definition liquid crystal display panel with a small pixel size. As a result, a high transmittance and rapid response can be achieved, so that the above problems (1) and (2) can be solved. The inventors have also found that a mark left by pushing with a finger can be sufficiently removed by setting the pre-tilt direction of the liquid crystal molecules to be at the same azimuth as the direction in which liquid crystal molecules are rotated for alignment by electric fields generated by slit electrodes. Furthermore, the inventors have found that the scanning exposure can be performed with a conventional exposure device by slight modification of the device and thus the above problems (3) and (4) can be solved. Thereby, the inventors have arrived at the present invention.

In other words, one aspect of the present invention may be a liquid crystal display panel including multiple pixels arranged in a matrix, including in the given order: a first polarizing plate; a first substrate including pixel electrodes each provided with a slit; a first alignment film; a liquid crystal layer containing liquid crystal molecules having negative anisotropy of dielectric constant; a second alignment film; a second substrate including a counter electrode; and a second polarizing plate, the first polarizing plate and the second polarizing plate being arranged such that their polarization axes are perpendicular to each other, with an azimuth in a transverse direction of each pixel defined as 0°, the pixel electrode in each of the pixels including a first linear electrode group extending parallel to an azimuth of approximately 45°, a second linear electrode group extending parallel to an azimuth of approximately 135°, a third linear electrode group extending parallel to an azimuth of approximately 225°, and a fourth linear electrode group extending parallel to an azimuth of approximately 315°, the first alignment film and the second alignment film each aligning the liquid crystal molecules in a direction approximately perpendicular to a film surface with no voltage applied to the liquid crystal layer while providing a pre-tilt angle to the liquid crystal molecules in at least one region, one of the first alignment film and the second alignment film including a first alignment region superimposed on the first linear electrode group in a plan view and provided with a pre-tilt angle at an azimuth of approximately 225°, a third alignment region superimposed on the third linear electrode group in a plan view and provided with a pre-tilt angle at an azimuth of approximately 45°, and a region superimposed on the second or fourth linear electrode group in a plan view and provided with substantially no pre-tilt angle or a pre-tilt angle at an azimuth approximately perpendicular to the linear electrode group on which the region is superimposed, the other of the first alignment film and the second alignment film including a second alignment region superimposed on the second linear electrode group in a plan view and provided with a pre-tilt angle at an azimuth of approximately 135°, a fourth alignment region superimposed on the fourth linear electrode group in a plan view and provided with a pre-tilt angle at an azimuth of approximately 315°, and a region superimposed on the first or third linear electrode group in a plan view and provided with substantially no pre-tilt angle or a pre-tilt angle at an azimuth approximately perpendicular to the linear electrode group on which the region is superimposed. The pre-tilt angle means a tilt angle provided in advance to liquid crystal molecules near the substrates with no voltage applied, such that the liquid crystal molecules in the liquid crystal layer are tilted at a desired azimuth when voltage higher than the threshold voltage is applied. The liquid crystal molecules near the alignment films in regions provided with a pre-tilt angle are aligned in the direction substantially perpendicular to the alignment films and at a tilt when no voltage is applied to the liquid crystal layer. Upon application of voltage to the liquid crystal layer, the liquid crystal molecules are further significantly tilted at the tilt azimuth.

Another aspect of the present invention may be a method for manufacturing the liquid crystal display panel of the present invention, including a photo-alignment treatment step of irradiating a first substrate provided with a first alignment film on a surface and a second substrate provided with a second alignment film on a surface with light emitted by a light source through a polarizer, wherein the photo-alignment treatment step is performed while the first substrate or the second substrate is moved or the light source is moved relative to the first substrate or the second substrate, the light irradiation direction for the first substrate or the second substrate is parallel to the moving direction of the first substrate or the second substrate or the moving direction of the light source, and a polarization axis of the polarizer and the light irradiation direction are different from each other. The difference here is preferably 10° or greater, more preferably 15° or greater, still more preferably 30° or greater. The polarization axis of the polarizer and the light irradiation direction particularly preferably form an angle of approximately 45°. Furthermore, a polarization axis of the polarizer projected on a surface of the first substrate or a surface of the second substrate and the light irradiation direction may form an angle of approximately 45°. The present invention is described in detail below.

The expression "approximately 45°" means any value falling within the range of 45°±15°, preferably 45°. The expression "approximately 135°" means any value falling within the range of 135°±15°, preferably 135°. The expression "approximately 225°" means any value falling within the range of 225°±150, preferably 225°. The expression "approximately 315°" means any value falling within the range of 315°±15°, preferably 315°. The "plan view" means a view from the top (surface facing the viewer) of a liquid crystal panel including the first substrate and the second substrate bonded to each other.

In the liquid crystal display panel of the present invention, the liquid crystal layer contains liquid crystal molecules having negative anisotropy of dielectric constant and each of the first alignment film and the second alignment film aligns the liquid crystal molecules in the direction approximately perpendicular to the film surface with no voltage applied to the liquid crystal layer while providing a pre-tilt angle to the liquid crystal molecules in a region subjected to photo-alignment treatment. Such a liquid crystal layer and alignment films enable production of a 4D-ECB alignment liquid crystal display panel which aligns liquid crystal molecules in the direction approximately perpendicular to the substrate surfaces and provides hybrid alignment or twist alignment between the substrates.

In the liquid crystal display panel of the present invention, each pixel electrode preferably includes a cross-shaped electrode portion superimposed on boundaries between the first alignment region, the second alignment region, the third alignment region, and the fourth alignment region in a plan view, and the first linear electrode group, the second linear electrode group, the third linear electrode group, and the fourth linear electrode group which extend from the cross-shaped electrode portion. The boundaries between the first alignment region, the second alignment region, the third alignment region, and the fourth alignment region are the boundary between the first alignment region and the second alignment region, the boundary between the second alignment region and the third alignment region, the boundary between the third alignment region and the fourth alignment region, and the boundary between the fourth alignment region and the first alignment region in each pixel.

In the liquid crystal display panel of the present invention, the first linear electrode group, the second linear electrode group, the third linear electrode group, and the fourth linear electrode group are preferably line-symmetric about at least one of two linear portions constituting the cross-shaped electrode portion, more preferably about each of the two linear portions constituting the cross-shaped electrode portion.

In the liquid crystal display panel of the present invention, the first linear electrode group, the second linear electrode group, the third linear electrode group, and the fourth linear electrode group are preferably alternately connected to opposite sides of at least one of two linear portions constituting the cross-shaped electrode portion, more preferably from each of the two linear portions constituting the cross-shaped electrode portion.

In the liquid crystal display panel of the present invention, each pixel electrode preferably includes a quadrangular portion, linear electrode portions extending from the quadrangular portion to be superimposed on boundaries between the first alignment region, the second alignment region, the third alignment region, and the fourth alignment region in a plan view, and the first linear electrode group, the second linear electrode group, the third linear electrode group, and the fourth linear electrode group which extend from the quadrangular portion and the linear electrode portions.

Advantageous Effects of Invention

The liquid crystal display panel of the present invention can exhibit a high transmittance and rapid response and sufficiently remove a mark left by pushing with a finger. The method for manufacturing the liquid crystal display panel of the present invention can easily produce a liquid crystal display panel that can exhibit a high transmittance and rapid response and sufficiently remove a mark left by pushing with a finger.

BRIEF DESCRIPTION OF DRAWINGS

FIG. 6 is a conceptual view showing pre-tilt directions of liquid crystal molecules provided by first exposure, second exposure, and both of the exposure treatments of a photo-alignment film of a TFT substrate, together with exposure directions and scanning directions, in each half pixel in the liquid crystal display panel of Embodiment 1.

FIG. 7 is a conceptual view showing pre-tilt directions of liquid crystal molecules provided by first exposure, second exposure, and both of the exposure treatments of a photo-alignment film of a CF substrate, together with exposure directions and scanning directions, in each half pixel in the liquid crystal display panel of Embodiment 1.

FIG. 41 includes schematic views showing second exposure in Embodiment 1.

FIG. 45 is a conceptual view showing pre-tilt directions of liquid crystal molecules provided by first exposure, second exposure, third exposure, fourth exposure, and all the exposure treatments of a photo-alignment film of a TFT substrate, together with exposure directions and scanning directions, in each half pixel in a liquid crystal display panel of Embodiment 4.

FIG. 46 is a conceptual view showing pre-tilt directions of liquid crystal molecules provided by first exposure, second exposure, third exposure, fourth exposure, and all the exposure treatments of a photo-alignment film of a CF substrate, together with exposure directions and scanning directions, in each half pixel in the liquid crystal display panel of Embodiment 4.

FIG. 58 shows alignment of liquid crystal molecules near the TFT substrate and in the liquid crystal layer upon pushing with a finger and upon removal of the finger in the liquid crystal display panel shown in FIG. 55.

DESCRIPTION OF EMBODIMENTS

Figure 1:
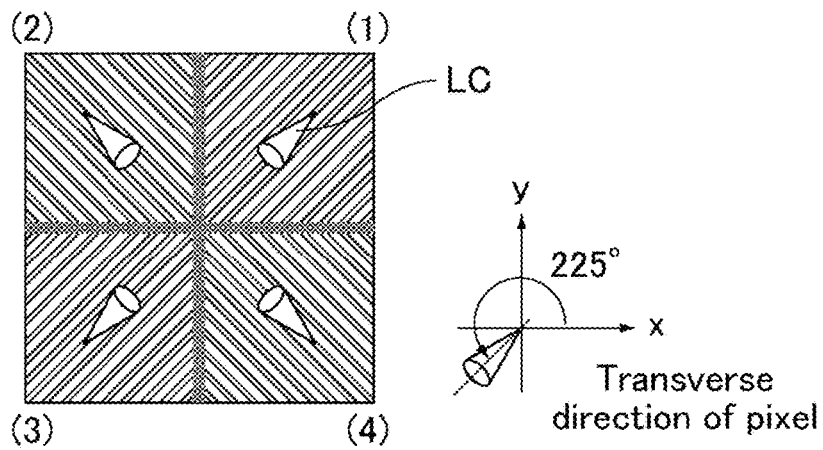
FIG. 1 is a schematic plan view showing the relation between four domains, the alignment directions of liquid crystal molecules, and an electrode provided with slits in each half pixel in a liquid crystal display panel of Embodiment 1.

The present invention is described in more detail below with reference to embodiments which, however, are not intended to limit the scope of the present invention.

The "azimuth" as used herein means a direction in a plane parallel to the substrate surfaces without consideration of a tilt angle (polar angle, pre-tilt angle) from the normal direction of the substrate surfaces. For example, if an x-axis and a y-axis perpendicular to the x-axis form an xy plane, the x-axis lies at an azimuth in the transverse direction of a pixel, and if the xy plane is parallel to the substrate surfaces, the azimuth is determined counterclockwise in a positive value from the x-axis direction defined as 0°. The "tilt azimuth" of a liquid crystal molecule near the first substrate means an azimuth at which the liquid crystal molecule is tilted relative to the first substrate (the azimuth obtained by projecting on the first substrate the liquid crystal molecule tilted from its end near the first substrate to its end away from the first substrate). The "tilt azimuth" of a liquid crystal molecule near the center of the liquid crystal layer in the thickness direction means an azimuth at which the liquid crystal molecule is tilted relative to the first substrate. The "tilt azimuth" of a liquid crystal molecule near the second substrate means an azimuth at which the liquid crystal molecule is tilted relative to the second substrate (the azimuth obtained by projecting on the second substrate the liquid crystal molecule tilted from its end near the second substrate to its end away from the second substrate). For example, the tilt azimuth of a liquid crystal molecule LC directly indicated as "LC" in FIG. 1 near the center of the liquid crystal layer in the thickness direction is 225°. The "pre-tilt angle" means an angle formed by an alignment film surface and the long-axis direction of a liquid crystal molecule near the alignment film when no voltage is applied to the liquid crystal layer. The "threshold voltage" means a voltage level giving, for example, a transmittance of 5% when the transmittance in the bright state is set to 100%. The "pre-tilt angle azimuth (pre-tilt direction)" means a tilt azimuth of a liquid crystal molecule near the first substrate or a liquid crystal molecule near the second substrate when no voltage is applied to the liquid crystal layer. The "liquid crystal layer alignment" as used herein means a tilt azimuth of a liquid crystal molecule near the center of the liquid crystal layer in the thickness direction.

A "pixel" corresponds to a region including a filter of one color (e.g., red, green, blue, or yellow). In the embodiments below, a counter substrate is referred to as a color filter (CF) substrate because it includes color filters. The color filters, however, may not be included in the counter substrate but in a thin-film transistor (TFT) substrate including TFTs for the respective pixels. One of the first substrate and the second substrate may be a TFT substrate and the other may be a CF substrate.

In the OFF state, the liquid crystal display panels of the embodiments below align the liquid crystal molecules having negative anisotropy of dielectric constant in the direction approximately perpendicular to the alignment film surfaces while providing a pre-tilt angle to the liquid crystal molecules in regions subjected to photo-alignment treatment. In the ON state, the liquid crystal display panels align the liquid crystal molecules in the direction more parallel to the alignment film surfaces according to the applied voltage (voltage applied by the pixel electrode and the counter electrode) so that the liquid crystal molecules become birefringent for light passing through the liquid crystal display panel.

The liquid crystal display panels of the embodiments below each basically include multiple pixels arranged in a matrix, and include, in the following order, a first polarizing plate, a TFT substrate including pixel electrodes provided with slits, an alignment film on or adjacent to a surface of the TFT substrate facing liquid crystal layer, a liquid crystal layer containing liquid crystal molecules having negative anisotropy of dielectric constant, an alignment film on or adjacent to a surface of a CF substrate facing the liquid crystal layer, the CF substrate including a counter electrode, and a second polarizing plate. The first polarizing plate and the second polarizing plate are arranged such that their polarization axes are perpendicular to each other. The counter electrode may include alignment control structures such as ribs or slits, but is preferably a planar electrode with no alignment control structures.

Embodiment 1

Figure 2:
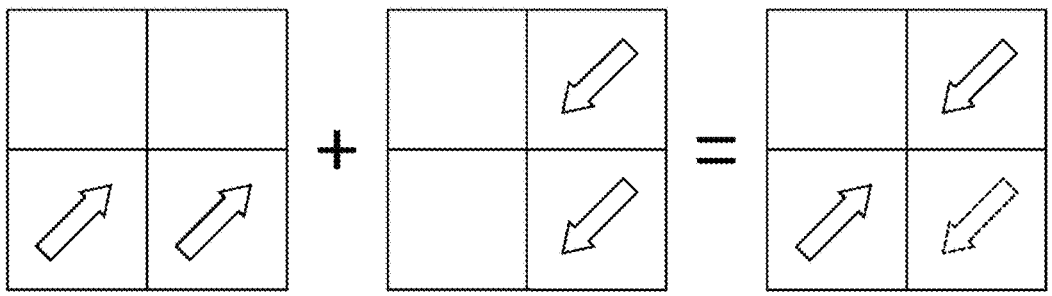
FIG. 2 is a schematic plan view showing pre-tilt directions of liquid crystal molecules provided by first exposure, second exposure, and both of the exposure treatments of a photo-alignment film of a TFT substrate in each half pixel in the liquid crystal display panel of Embodiment 1.
Figure 3:
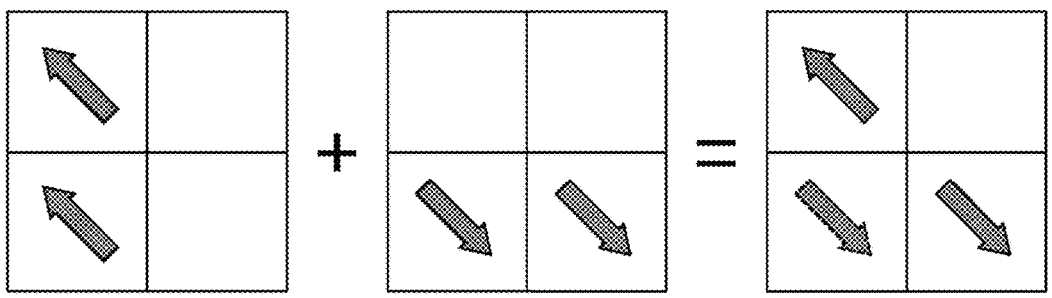
FIG. 3 is a schematic plan view showing pre-tilt directions of liquid crystal molecules provided by first exposure, second exposure, and both of the exposure treatments of a photo-alignment film of a CF substrate in each half pixel in the liquid crystal display panel of Embodiment 1.

FIG. 1 is a schematic plan view showing the relation between four domains, the alignment directions of liquid crystal molecules, and an electrode provided with slits in each half pixel in a liquid crystal display panel of Embodiment 1. FIG. 1 shows the above relation in the ON state (in white display). FIG. 1 also shows dark lines between alignment regions. FIG. 2 is a schematic plan view showing pre-tilt directions of liquid crystal molecules provided by first exposure, second exposure, and both of the exposure treatments of a photo-alignment film of a TFT substrate in each half pixel in the liquid crystal display panel of Embodiment 1. FIG. 3 is a schematic plan view showing pre-tilt directions of liquid crystal molecules provided by first exposure, second exposure, and both of the exposure treatments of a photo-alignment film of a CF substrate in each half pixel in the liquid crystal display panel of Embodiment 1. Here, a pixel in Embodiment 1 includes two of the half pixels shown in FIGS. 1 to 3 in the vertical direction but may include two of the half pixels in the horizontal direction.

The liquid crystal display panel of Embodiment 1 has the following features.

(1) The liquid crystal molecules are radially aligned.

(2) With the azimuth in the transverse direction of a pixel defined as 0°, a first alignment region (1) and a third alignment region (3) in FIG. 1 (quadrangular regions shown with the signs (1) and (3) in FIG. 1) are provided with a pre-tilt direction at an azimuth of 225° and at an azimuth of 45°, respectively, near the TFT substrate. Also, a second alignment region (2) and a fourth alignment region (4) in FIG. 1 (quadrangular regions shown with the signs (2) and (4) in FIG. 1) are provided with a pre-tilt direction at an azimuth of 135° and at an azimuth of 315°, respectively, near the CF substrate.

These four alignment regions are arranged in the order of the first alignment region (1), the second alignment region (2), the third alignment region (3), and the fourth alignment region (4) in the counterclockwise direction in a view from the surface facing the viewer.

(3) With the azimuth in the transverse direction of a pixel defined as 0°, the directions in which slits (linear electrode groups) of each pixel electrode (slit electrode) in the TFT substrate in the first alignment region (1), the second alignment region (2), the third alignment region (3), and the fourth alignment region (4) shown in FIG. 1 are at an azimuth of 45°, an azimuth of 135°, an azimuth of 225°, and an azimuth of 315°, respectively. The direction in which each linear electrode group extends is parallel to the pre-tilt direction in the corresponding alignment region. Also, the direction in which liquid crystal molecules are rotated for alignment by electric fields generated by the slit electrode is the same as the pre-tilt direction(s) provided by the photo-alignment film(s) on or adjacent to the TFT substrate and/or the CF substrate.

The pre-tilt angle of liquid crystal molecules is preferably, for example, 85° to 89.5°. The pre-tilt angle is more preferably 88.5° or greater.

The "radial" alignment as used herein means that the liquid crystal molecules near the center of the liquid crystal layer in the thickness direction are aligned at an azimuth of approximately 225°, an azimuth of approximately 315°, an azimuth of approximately 45°, and an azimuth of approximately 135° in the first alignment region (1), the second alignment region (2), the third alignment region (3), and the fourth alignment region (4) shown in FIG. 1, respectively.

Figure 4:
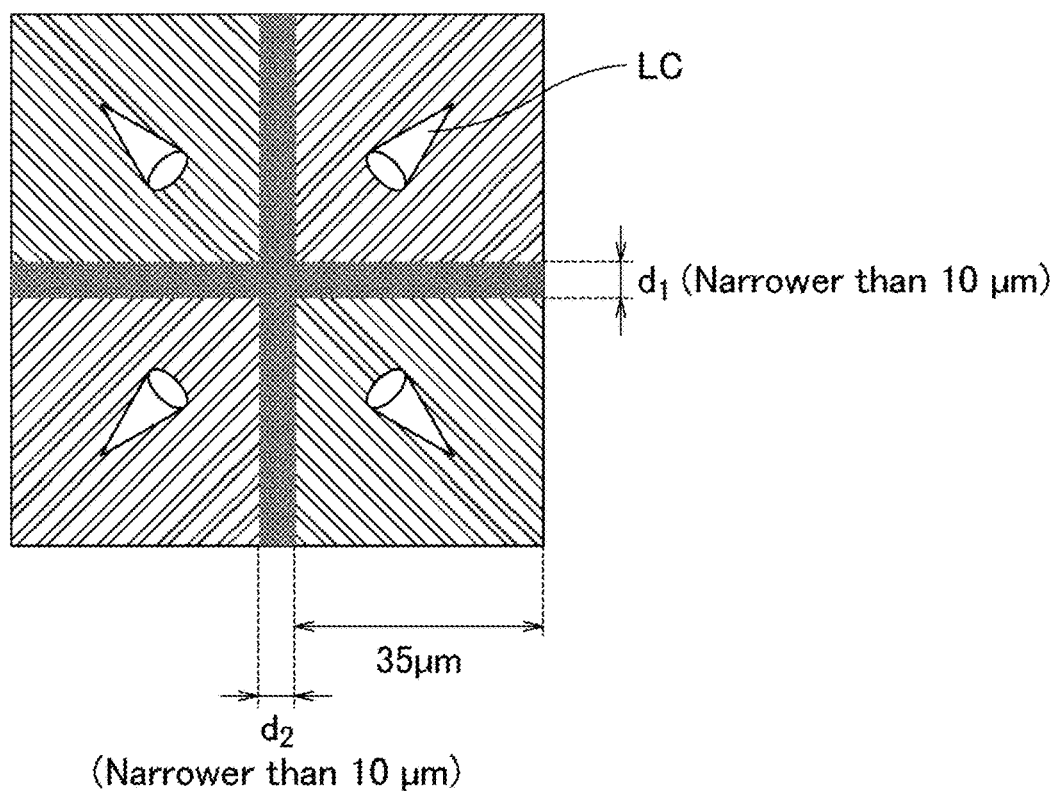
FIG. 4 is an enlarged detailed view of FIG. 1.
Figure 5:
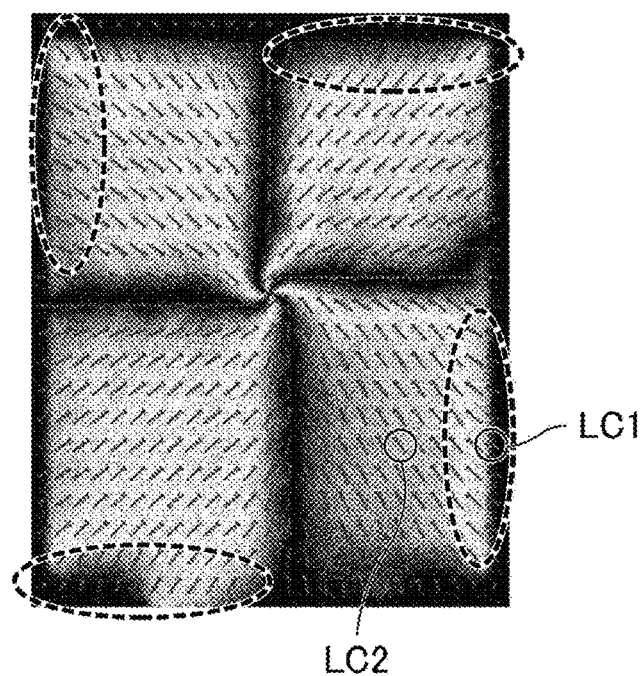
FIG. 5 is a simulation result corresponding to FIG. 4.

FIG. 4 is an enlarged detailed view of FIG. 1. FIG. 5 is a simulation result corresponding to FIG. 4.

The liquid crystal display panel of Embodiment 1 includes radially aligned liquid crystal molecules. With this configuration, as shown in FIG. 5, the twist angle formed by the long-axis directions of liquid crystal molecules affected by oblique electric fields generated in the edge portion of the slit electrode (liquid crystal molecules LC1 on the outline of the quadrangular half pixel) and the long-axis directions of liquid crystal molecules LC2 in the domain is smaller than 90°, so that the irregular alignment regions can be eliminated from the portions surrounded by dashed lines in FIG. 5, as compared with the later-described liquid crystal display panel of Comparative Example 1. Thereby, the alignment regions in the domains are expanded and thus stable alignment is achieved.

The liquid crystal display panel of Embodiment 1 includes electrodes provided with radial slits. Such electrodes can reduce the width of dark lines at the center (for example, as shown in FIG. 4, the widths of d1 and d2 are each reduced to narrower than 10 μm) and expand the alignment regions in the domains.

The liquid crystal display panel of Embodiment 1 has an increased transmittance owing to reduced dark line regions. The liquid crystal display panel also exhibits enhanced response performance owing to stable alignment.

The liquid crystal display panel of Embodiment 1 has a structure in which the pre-tilt directions of liquid crystal molecules near the TFT substrate and liquid crystal molecules near the CF substrate are at the same azimuth as the direction in which the liquid crystal molecules are rotated for alignment by electric fields generated by the slit electrode. Thereby, the liquid crystal display panel can sufficiently remove a mark left by pushing with a finger and exhibit improved display quality as compared with the later-described liquid crystal display panel of Comparative Example 2.

FIG. 6 is a conceptual view showing pre-tilt directions of liquid crystal molecules provided by first exposure, second exposure, and both of the exposure treatments of a photo-alignment film of a TFT substrate, together with exposure directions and scanning directions, in each half pixel in the liquid crystal display panel of Embodiment 1. FIG. 7 is a conceptual view showing pre-tilt directions of liquid crystal molecules provided by first exposure, second exposure, and both of the exposure treatments of a photo-alignment film of a CF substrate, together with exposure directions and scanning directions, in each half pixel in the liquid crystal display panel of Embodiment 1.

In manufacture of the liquid crystal display panel of Embodiment 1, as described below, the polarization axis of the exposure device is rotated by 45° such that the exposure direction for the photo-alignment film of the substrate and the scanning direction (moving direction of the substrate) are parallel to each other. In this manner, performing scanning exposure using a simply modified conventional exposure device enables manufacture of the liquid crystal display panel of Embodiment 1. Thereby, the liquid crystal display panel of Embodiment 1 can be easily manufactured.

Figure 8:
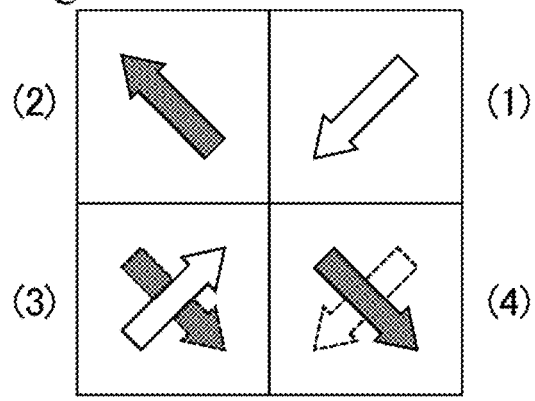
FIG. 8 is a schematic plan view showing a pre-tilt direction of liquid crystal molecules near the TFT substrate and a pre-tilt direction of liquid crystal molecules near the CF substrate in each half pixel in the liquid crystal display panel of Embodiment 1.

FIG. 8 is a schematic plan view showing a pre-tilt direction of liquid crystal molecules near the TFT substrate and a pre-tilt direction of liquid crystal molecules near the CF substrate in each half pixel in the liquid crystal display panel of Embodiment 1.

The liquid crystal display panel of Embodiment 1 achieves a four-division alignment structure as shown in FIG. 8 only by ultraviolet light (UV) exposure as shown in FIG. 6 and FIG. 7.

In the liquid crystal display panel of Embodiment 1, only one of the alignment film of the TFT substrate and the alignment film of the CF substrate provides a pre-tilt angle in each of two regions (first alignment region (1) and second alignment region (2)) of the first alignment region (1), the second alignment region (2), the third alignment region (3), and the fourth alignment region (4) (four quadrangular regions shown with the signs (1), (2), (3), and (4) in FIG. 8), and the alignment film of the TFT substrate and the alignment film of the CF substrate provide different pre-tilt angles at azimuths perpendicular to each other in each of the other two regions (third alignment region (3) and fourth alignment region (4)) of the four regions. These configurations are summarized in the following Table 1. The exposure states corresponding to the "large", "small", and "none" under "pre-tilt" in the following Table 1 are shown in the following Table 2. The "hybrid alignment" alignment region means an alignment region in which liquid crystal molecules near the alignment films of the paired substrates are aligned in the direction approximately perpendicular to the respective substrates and one of the alignment films is exposed to UV light such that the liquid crystal molecules near the exposed alignment film are pre-tilted.

TABLE 1

| Region | Pre-tilt | | Alignment achieved by pre-tilt (UV exposure effect) |
| | TFT | CF | |
| --- | --- | --- | --- |
| (1) | Large | None | Tilt near TFT is dominant (hybrid alignment) |
| (2) | None | Large | Tilt near CF is dominant (hybrid alignment) |
| (3) | Large | Small | Tilt near TFT is dominant (slightly twisted alignment) |
| (4) | Small | Large | Tilt near CF is dominant (slightly twisted alignment) |

TABLE 2

| Pre-tilt | Exposure state |
| --- | --- |
| Large | Normal exposure |
| Small | Double exposure (opposite directions) |
| None | No exposure |

Figure 9:
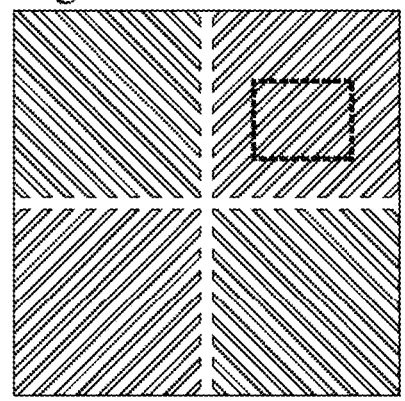
FIG. 9 is a schematic plan view of an electrode provided with slits in each half pixel in the liquid crystal display panel of Embodiment 1.

FIG. 9 is a schematic plan view of an electrode provided with slits in each half pixel in the liquid crystal display panel of Embodiment 1. In the liquid crystal display panel of Embodiment 1, upon generation of electric fields by a slit electrode (transverse electric field component generated in the direction perpendicular to the slits in a plan view), liquid crystal molecules are aligned in the direction parallel to the slits when voltage is applied to the liquid crystal layer, whereby the twist is eliminated.

Figure 10:
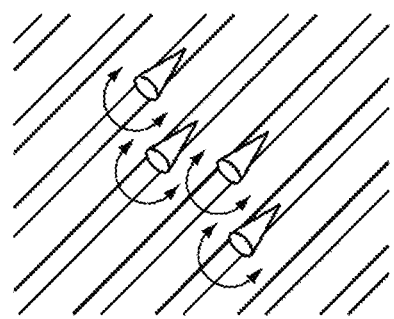
FIG. 10 is an enlarged view of a portion surrounded by a dashed line in FIG. 9.

FIG. 10 is an enlarged view of a portion surrounded by a dashed line in FIG. 9. As shown in FIG. 10, the slit electrode generates transverse electric field components perpendicular to the direction in which the slits extend. This means that the liquid crystal molecules in the liquid crystal layer are aligned in the direction parallel to the direction in which the slits extend (in the direction perpendicular to the transverse electric field components).

As described above, the liquid crystal display panel of Embodiment 1 utilizes a four-division alignment (pre-tilt) structure achieved by UV exposure with specific exposure directions and polarization axes in combination with the alignment provided by electric fields generated by slit electrodes to achieve the 4D-ECB alignment shown in FIG. 1.

In the liquid crystal display panel of Embodiment 1, the alignment film of the TFT substrate and the alignment film of the CF substrate are photo-alignment films having a bonded structure of photosensitive groups. The "photo-alignment film" as used herein means a film formed of a material whose alignment controlling force changes when irradiated with light. A "photo-alignment film having a bonded structure of photosensitive groups" means a photo-alignment film having a structure in which photosensitive functional groups contained in the constituent molecules are bonded to each other. The liquid crystal display panel of the present invention may employ an alignment film formed of an organic material, an alignment film formed of an inorganic material, or an alignment film obtained by alignment treatment such as rubbing, for example, instead of the photo-alignment film. Also with such alignment films, the liquid crystal display panel can achieve the effect of the present invention.

In the present invention, the alignment film of the TFT substrate and the alignment film of the CF substrate each preferably have a bonded structure of at least one photosensitive group selected from the group consisting of 4-chalcone, 4'-chalcone, coumarin, and cinnamoyl (also referred to as cinnamate) groups.

The photosensitive groups are dimerized or crosslinked when irradiated with light and thereby effectively minimize pre-tilt angle variation. As a result, a liquid crystal display panel having a stable transmittance can be produced.

In the present invention, the alignment film of the TFT substrate and the alignment film of the CF substrate each include three alignment regions provided with different pre-tilt azimuths and a region provided with substantially no pre-tilt in each half pixel or each pixel. As a result, in the case of dividing each half pixel or pixel into four domains, the alignment treatment step for alignment division is required only twice for each of the first alignment film and the second alignment film, i.e., a total of four times.

(Mark Left by Pushing with Finger in 4D-ECB Alignment Liquid Crystal Display Panel)

Figure 11:
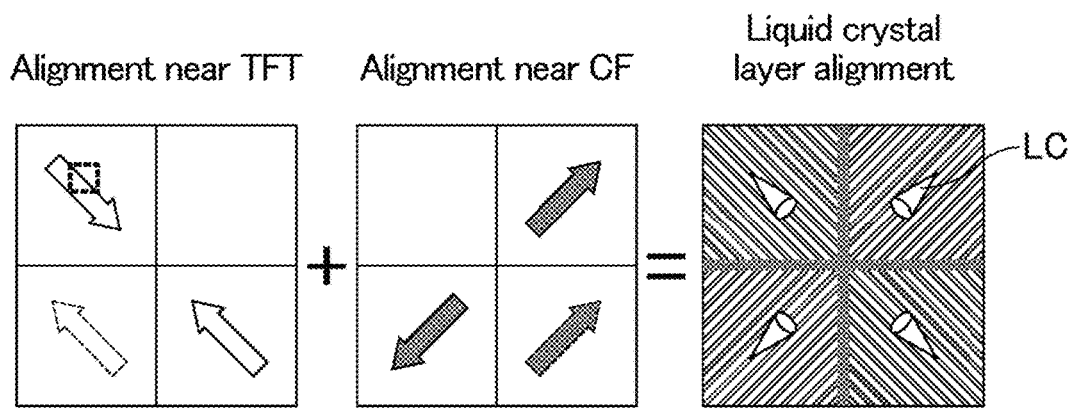
FIG. 11 is a conceptual view showing a pre-tilt direction of liquid crystal molecules near the TFT substrate, a pre-tilt direction of liquid crystal molecules near the CF substrate, and liquid crystal layer alignment, in each half pixel in a 4D-ECB alignment liquid crystal display panel.
Figure 12:
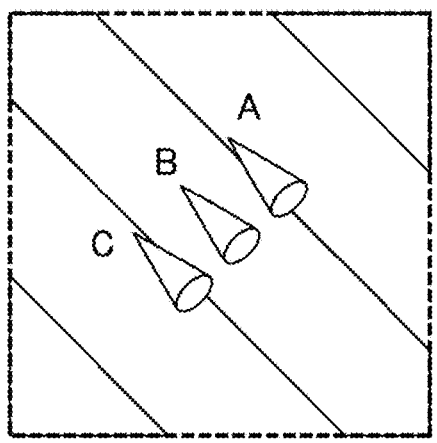
FIG. 12 shows alignment of liquid crystal molecules achieved by the pre-tilt provided by the TFT substrate of the liquid crystal display panel shown in FIG. 11.
Figure 13:
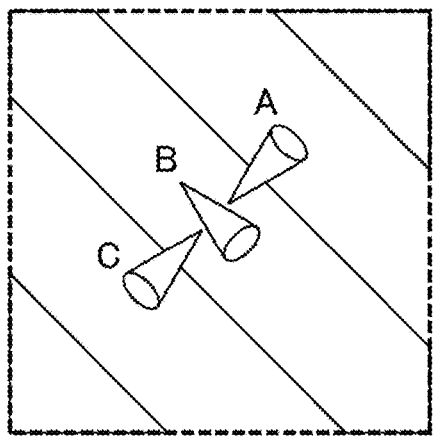
FIG. 13 shows alignment of liquid crystal molecules achieved by electric fields generated by a slit electrode of the TFT substrate in the liquid crystal display panel shown in FIG. 11.

FIG. 11 is a conceptual view showing a pre-tilt direction of liquid crystal molecules near the TFT substrate, a pre-tilt direction of liquid crystal molecules near the CF substrate, and liquid crystal layer alignment, in each half pixel in a 4D-ECB alignment liquid crystal display panel. The liquid crystal display panel shown in FIG. 11 is similar to that in Embodiment 1, except that the pre-tilt direction of the liquid crystal molecules is changed as shown in FIG. 11. This liquid crystal display panel corresponds to a first modified example of Embodiment 1. FIG. 12 shows alignment of liquid crystal molecules achieved by the pre-tilt provided by the TFT substrate of the liquid crystal display panel shown in FIG. 11. FIG. 13 shows alignment of liquid crystal molecules achieved by electric fields generated by a slit electrode of the TFT substrate in the liquid crystal display panel shown in FIG. 11. FIG. 12 and FIG. 13 are enlarged views of the portion surrounded by a dashed line in FIG. 11, showing the alignment of the liquid crystal molecules near the slit electrode and the TFT substrate.

The alignment of the liquid crystal molecules near the TFT substrate including slit electrodes is set depending on the balance between (1) alignment achieved by the pre-tilt and (2) alignment achieved by electric fields generated by the slit electrodes. In the normal state (when the finger is removed), the alignment (1) achieved by the pre-tilt is dominant, whereas upon pushing with a finger, the gap between the TFT substrate and the CF substrate becomes narrow and thus the alignment (2) achieved by electric fields generated by the slit electrode is dominant.

Figure 14:
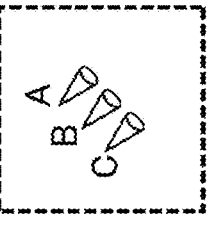
FIG. 14 shows alignment of liquid crystal molecules near the TFT substrate and in the liquid crystal layer upon pushing with a finger and upon removal of the finger in the liquid crystal display panel shown in FIG. 11.

FIG. 14 shows alignment of liquid crystal molecules near the TFT substrate and in the liquid crystal layer upon pushing with a finger and upon removal of the finger in the liquid crystal display panel shown in FIG. 11. In FIG. 14, the "provided" state for the "slit" means that the liquid crystal display panel includes the slit electrode shown in FIG. 11. The "not provided" state for the "slit" means that a liquid crystal display panel includes no slit electrode but includes a planar electrode (a liquid crystal display panel different from the liquid crystal display panel shown in FIG. 11 only in terms of including a planar electrode instead of the slit electrode). The "alignment near TFT substrate" means the alignment of liquid crystal molecules near the TFT substrate in the liquid crystal layer. The "liquid crystal layer alignment" means the alignment of liquid crystal molecules in the liquid crystal layer or the alignment of liquid crystal molecules in the center portion, which is other than the portion near the TFT substrate and the portion near the CF substrate, in the liquid crystal layer. The "liquid crystal layer/TFT alignment (matched)" means that the alignment of liquid crystal molecules in the center portion of the liquid crystal layer matches (is the same as) the alignment of liquid crystal molecules near the TFT substrate in the liquid crystal layer, and shows the alignments. In the 4D-ECB alignment liquid crystal display panel including the slit electrode shown in FIG. 11, liquid crystal molecules in the portion indicated by the letter "A", liquid crystal molecules in the portion indicated by the letter "B", and liquid crystal molecules in the portion indicated by the letter "C" are all shifted from Alignment a to Alignment b without stopping when the states shift from pushing with a finger to removal of the finger. This configuration is presumed to avoid a mark left by pushing with a finger. In the liquid crystal display panel including a planar electrode instead of a slit electrode, the alignment in any of the portions does not change between pushing with a finger and removal of the finger, and thus no mark is left by pushing with a finger.

(Cross-Sectional View of 4D-ECB Alignment Liquid Crystal Display Panel)

Cross-sectional views of the liquid crystal display panel of the first modified example of Embodiment 1 are described.

Figure 15:
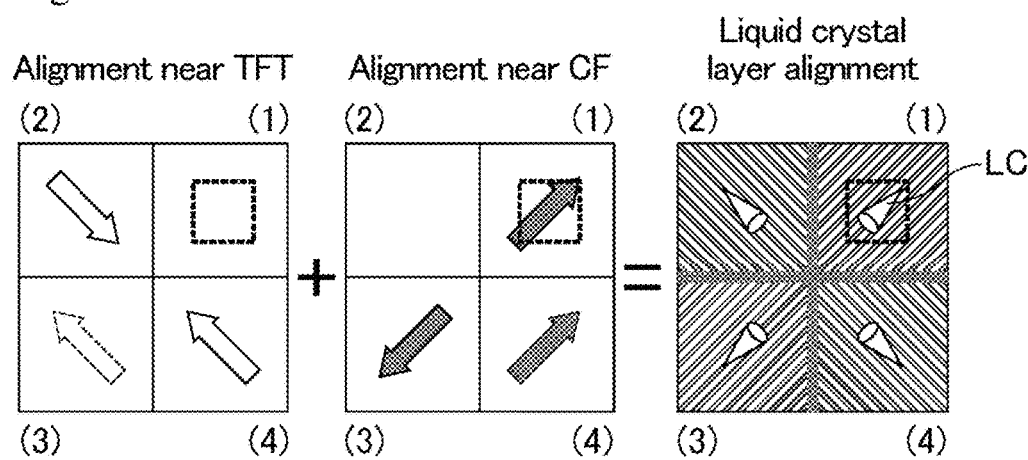
FIG. 15 is a conceptual view showing a pre-tilt direction of liquid crystal molecules near the TFT substrate, a pre-tilt direction of liquid crystal molecules near the CF substrate, and liquid crystal layer alignment, in each half pixel in a liquid crystal display panel of a first modified example of Embodiment 1.
Figure 16:
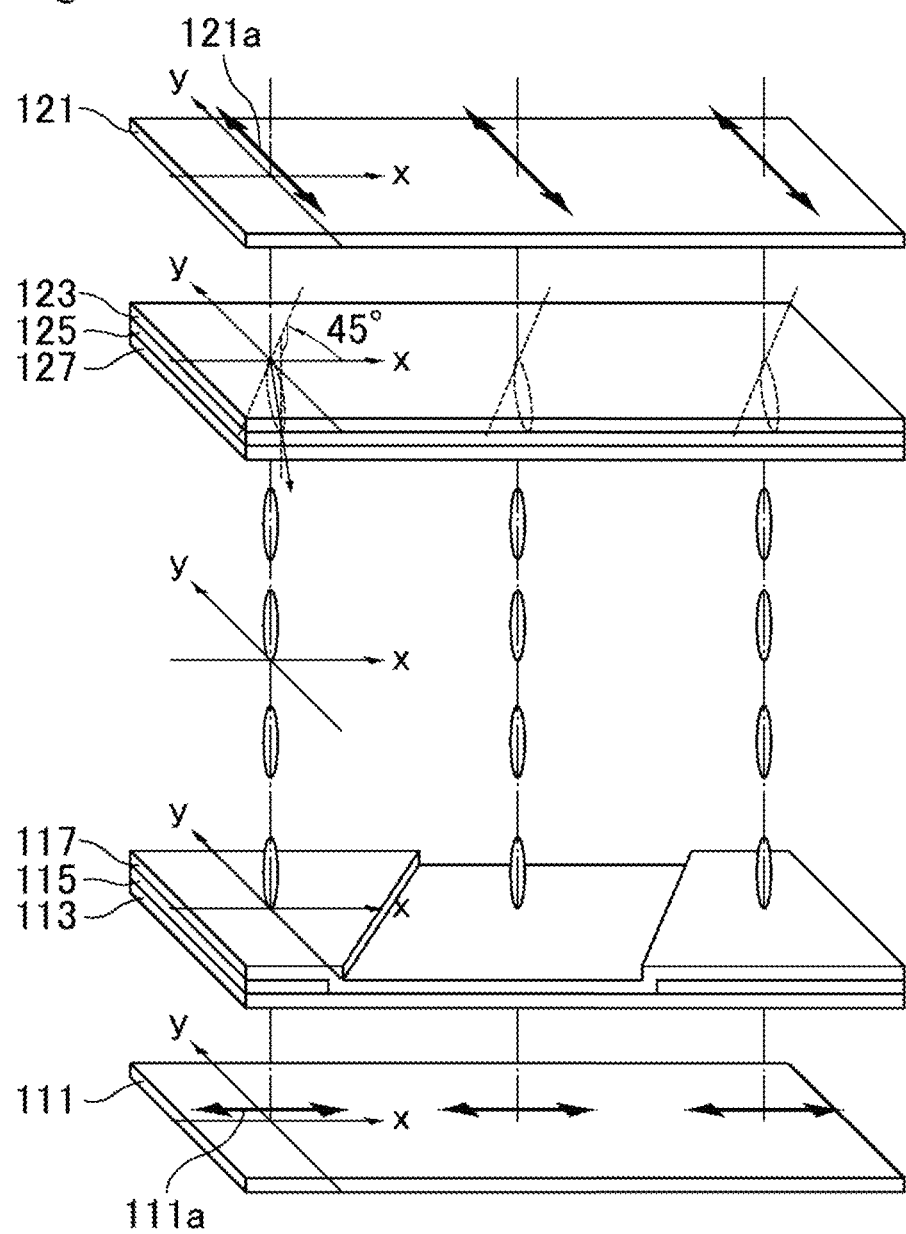
FIG. 16 is a schematic cross-sectional view showing an OFF state in a region (1) in each half pixel in the liquid crystal display panel of the first modified example of Embodiment 1.
Figure 17:
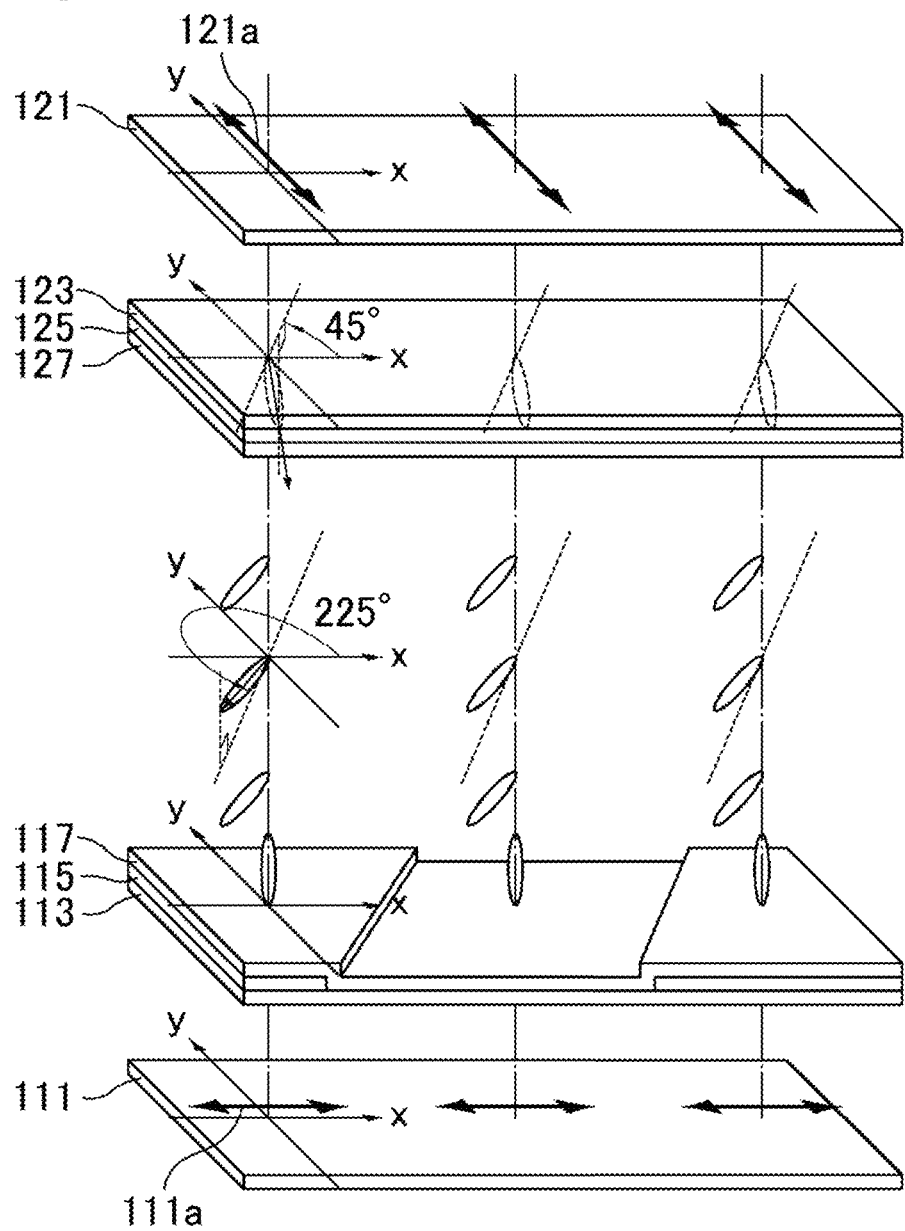
FIG. 17 is a schematic cross-sectional view showing an ON state in the region (1) in each half pixel in the liquid crystal display panel of the first modified example of Embodiment 1.

FIG. 15 is a conceptual view showing a pre-tilt direction of liquid crystal molecules near the TFT substrate, a pre-tilt direction of liquid crystal molecules near the CF substrate, and liquid crystal layer alignment, in each half pixel in a liquid crystal display panel of the first modified example of Embodiment 1. FIG. 16 is a schematic cross-sectional view showing an OFF state in the first alignment region (1) in each half pixel in the liquid crystal display panel of the first modified example of Embodiment 1. FIG. 17 is a schematic cross-sectional view showing an ON state in the first alignment region (1) in each half pixel in the liquid crystal display panel of the first modified example of Embodiment 1.

In FIG. 16 and FIG. 17, a polarization axis 111a of a first polarizing plate 111 is at the azimuth of the x-axis and a polarization axis 121a of a second polarizing plate 121 is at the azimuth of the y-axis. In the display region of the TFT substrate, indium tin oxide (ITO) 115 is partially provided and a photo-alignment film 117 is entirely provided to a substrate 113 including TFTs. In the display region of the CF substrate, ITO 125 and a photo-alignment film 127 are entirely provided to a substrate 123 (to the surface facing the liquid crystal layer) including CFs. The ITO may be replaced by another transparent electrode material such as indium zinc oxide (IZO). The same applies to FIG. 19, FIG. 20, FIG. 22, FIG. 23, FIG. 25, and FIG. 26 described below.

The liquid crystal molecules in the first alignment region (1) are pre-tilted near the CF substrate but are not pre-tilted near the TFT substrate due to no exposure.

Figure 18:
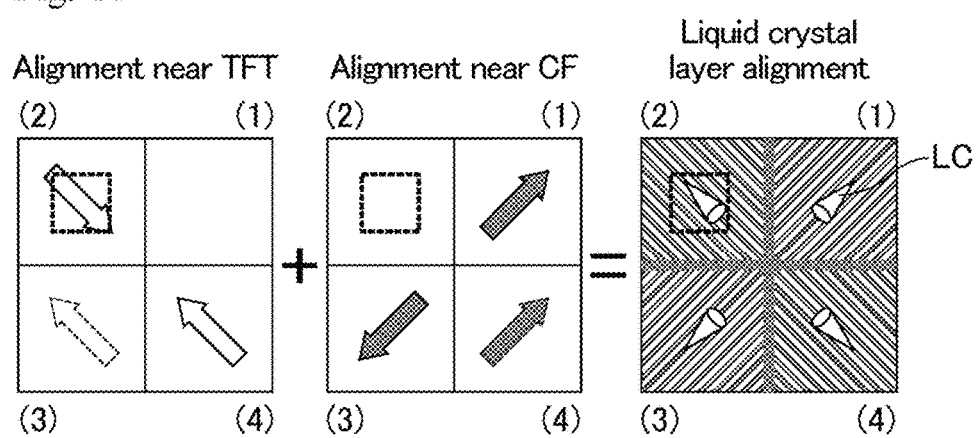
FIG. 18 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of the first modified example of Embodiment 1.
Figure 19:
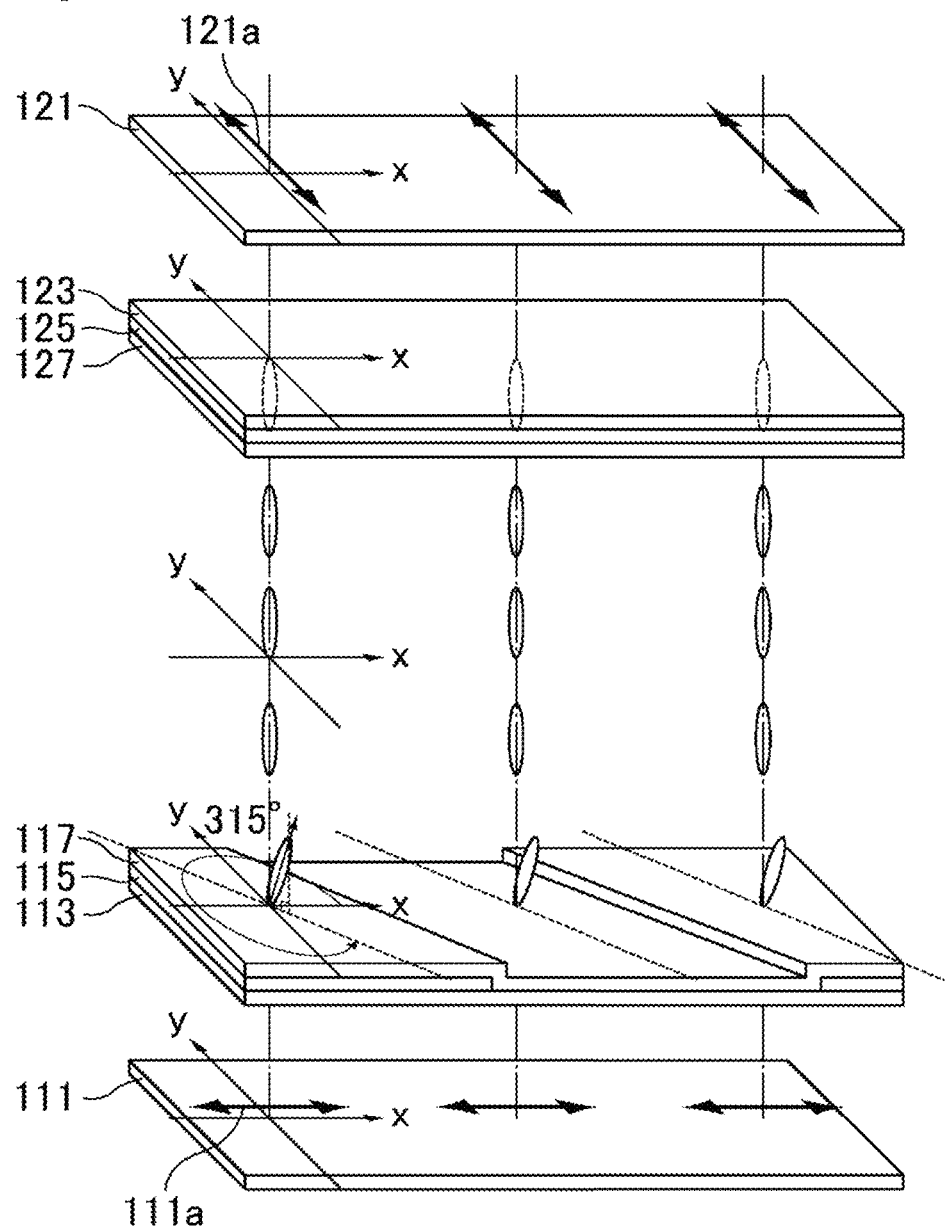
FIG. 19 is a schematic cross-sectional view showing an OFF state in a region (2) in each half pixel in the liquid crystal display panel of the first modified example of Embodiment 1.
Figure 20:
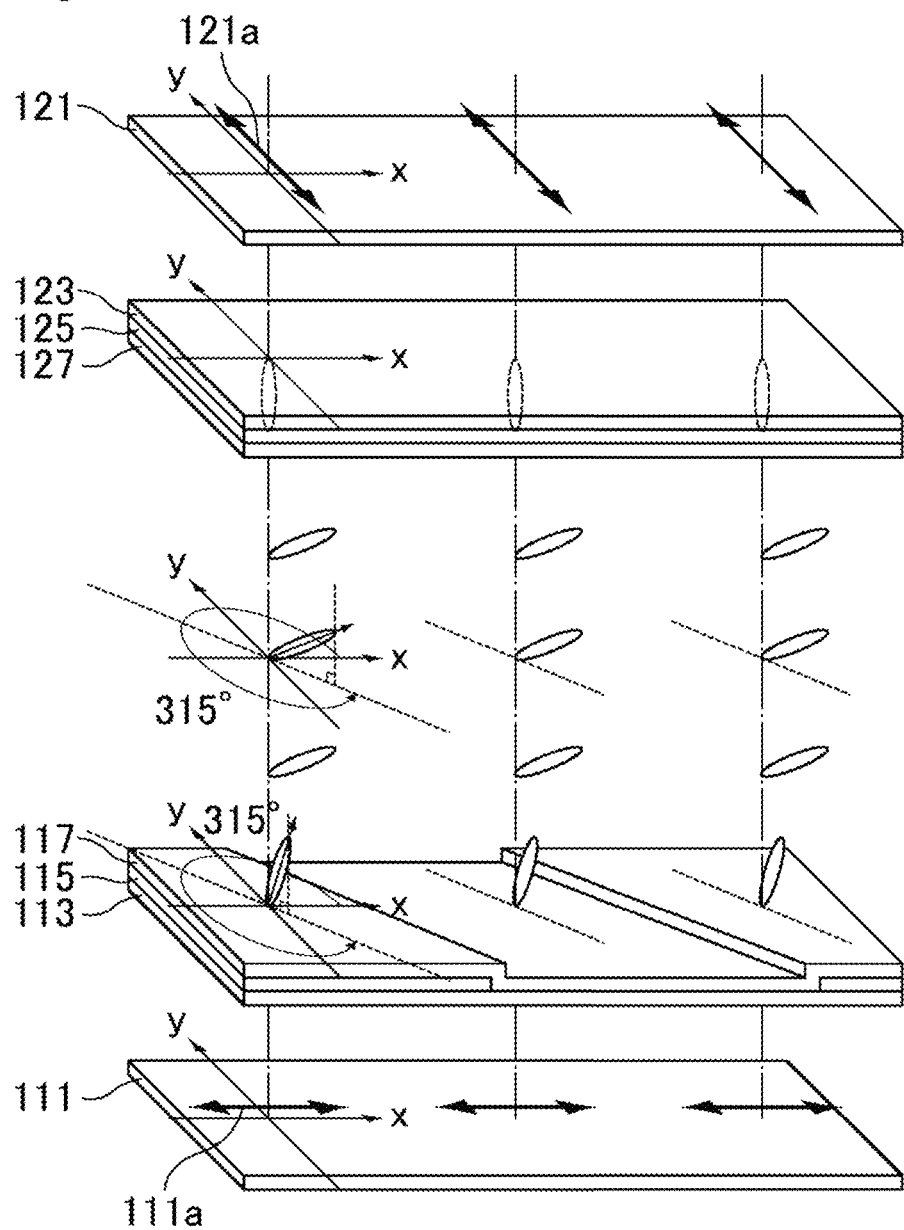
FIG. 20 is a schematic cross-sectional view showing an ON state in the region (2) in each half pixel in the liquid crystal display panel of the first modified example of Embodiment 1.

FIG. 18 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of the first modified example of Embodiment 1. FIG. 19 is a schematic cross-sectional view showing an OFF state in the second alignment region (2) in each half pixel in the liquid crystal display panel of the first modified example of Embodiment 1. FIG. 20 is a schematic cross-sectional view showing an ON state in the second alignment region (2) in each half pixel in the liquid crystal display panel of the first modified example of Embodiment 1.

The liquid crystal molecules in the second alignment region (2) are pre-tilted near the TFT substrate and are not pre-tilted near the CF substrate due to no exposure.

Figure 21:
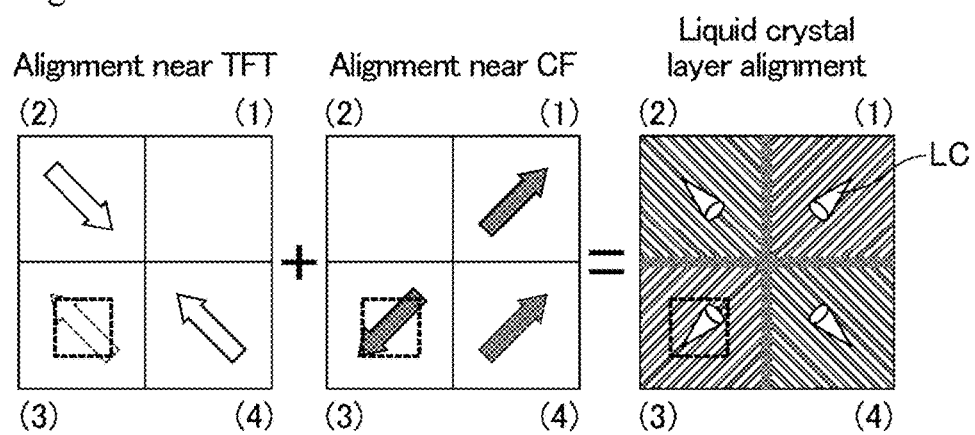
FIG. 21 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of the first modified example of Embodiment 1.
Figure 22:
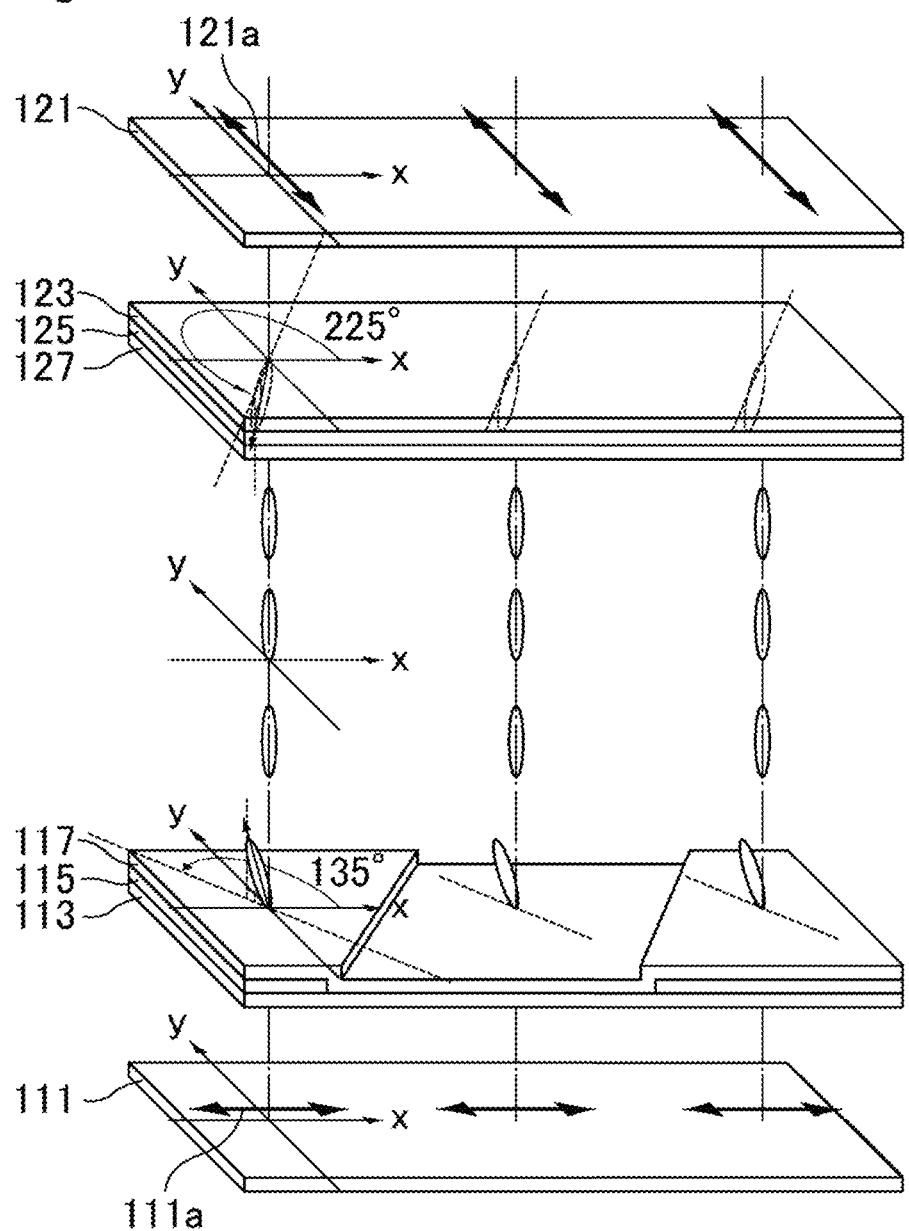
FIG. 22 is a schematic cross-sectional view showing an OFF state in a region (3) in each half pixel in the liquid crystal display panel of the first modified example of Embodiment 1.
Figure 23:
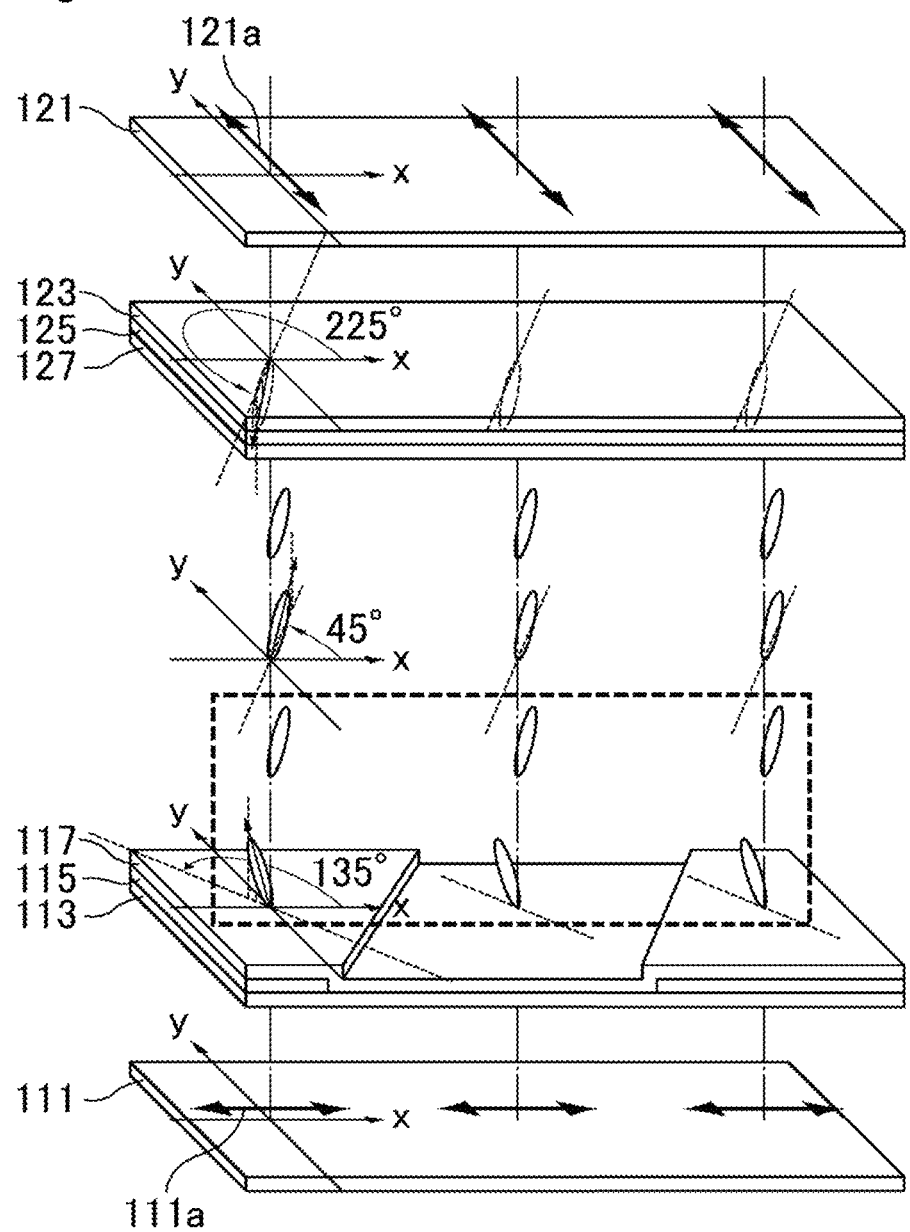
FIG. 23 is a schematic cross-sectional view showing an ON state in the region (3) in each half pixel in the liquid crystal display panel of the first modified example of Embodiment 1.

FIG. 21 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of the first modified example of Embodiment 1. FIG. 22 is a schematic cross-sectional view showing an OFF state in the third alignment region (3) in each half pixel in the liquid crystal display panel of the first modified example of Embodiment 1. FIG. 23 is a schematic cross-sectional view showing an ON state in the third alignment region (3) in each half pixel in the liquid crystal display panel of the first modified example of Embodiment 1.

The liquid crystal molecules in the third alignment region (3) are pre-tilted near the CF substrate and are less pre-tilted near the TFT substrate than near the CF substrate due to double exposure. The slit electrode further reduces the influence of the pre-tilt provided by the TFT substrate, causing slightly twisted alignment overall. The twist occurs in the portion surrounded by the dashed line near the TFT substrate in FIG. 23.

The electric fields generated by the slit electrodes can reduce the influence of the pre-tilt alignment near the TFT substrate.

Figure 24:
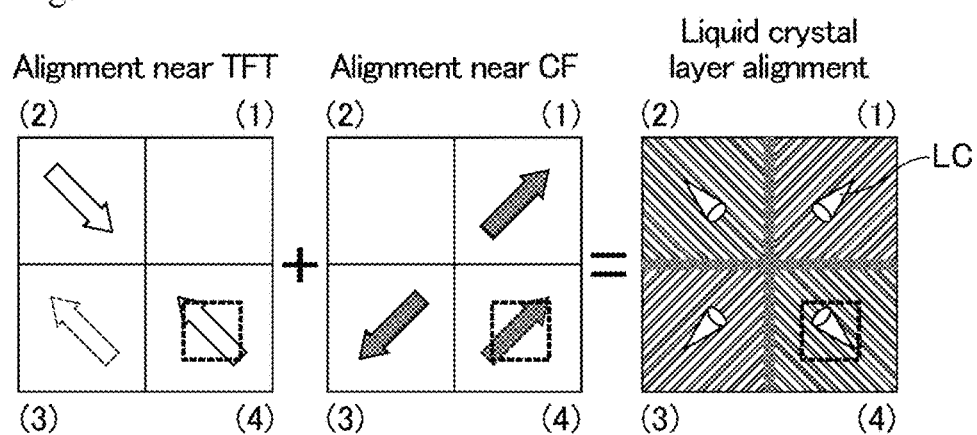
FIG. 24 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of the first modified example of Embodiment 1.
Figure 25:
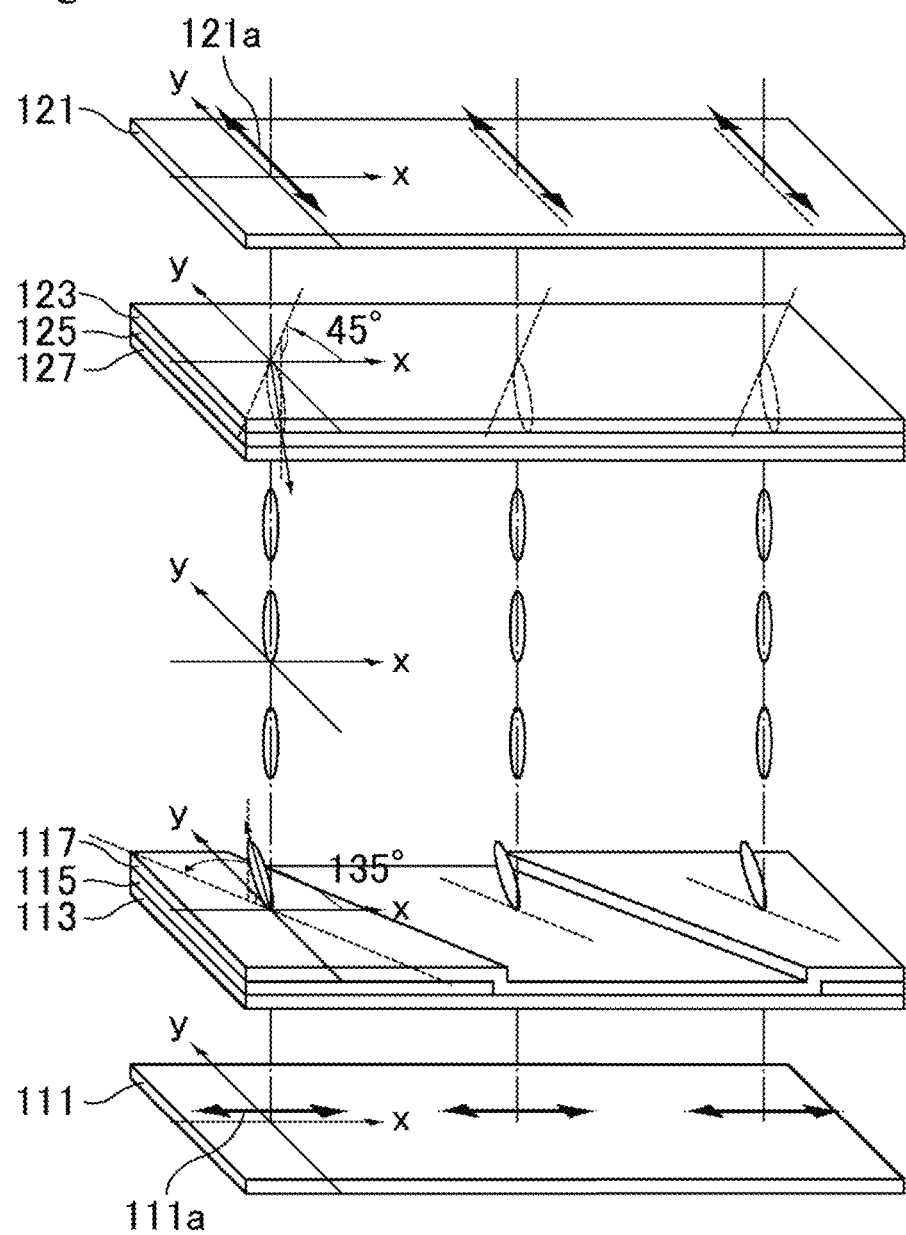
FIG. 25 is a schematic cross-sectional view showing an OFF state in a region (4) in each half pixel in the liquid crystal display panel of the first modified example of Embodiment 1.
Figure 26:
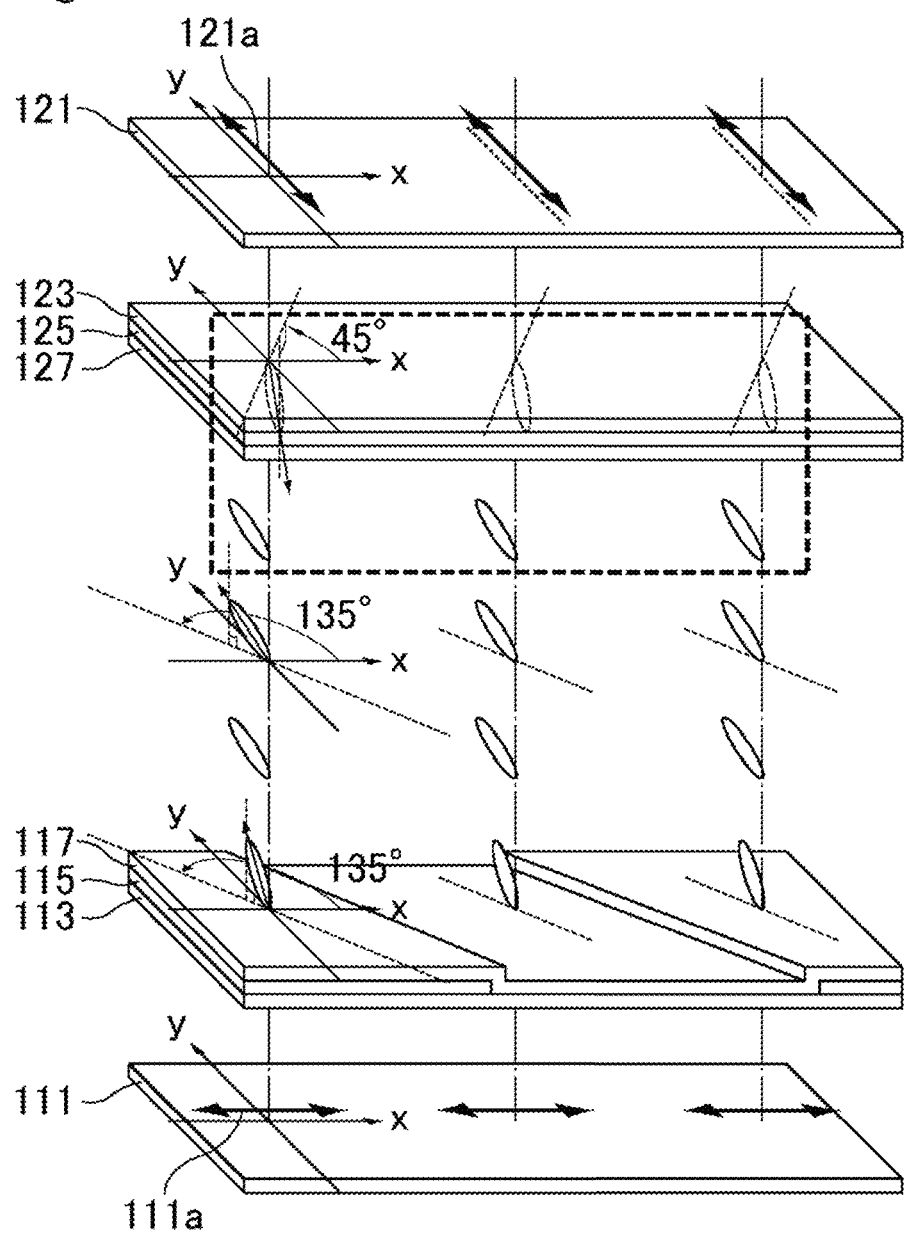
FIG. 26 is a schematic cross-sectional view showing an ON state in the region (4) in each half pixel in the liquid crystal display panel of the first modified example of Embodiment 1.

FIG. 24 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of the first modified example of Embodiment 1. FIG. 25 is a schematic cross-sectional view showing an OFF state in the fourth alignment region (4) in each half pixel in the liquid crystal display panel of the first modified example of Embodiment 1. FIG. 26 is a schematic cross-sectional view showing an ON state in the fourth alignment region (4) in each half pixel in the liquid crystal display panel of the first modified example of Embodiment 1.

The liquid crystal molecules in the fourth alignment region (4) are pre-tilted near the TFT substrate and are less pre-tilted near the CF substrate than near the TFT substrate due to double exposure. The slit electrode further reduces the influence of the pre-tilt provided by the CF substrate, causing slightly twisted alignment overall. The twist occurs in the portion surrounded by the dashed line near the CF substrate in FIG. 26.

The electric fields generated by the slit electrodes can reduce the influence of the pre-tilt alignment near the CF substrate.

Reference Example 1

Reference Example 1 is similar to the first modified example of Embodiment 1, except that a planar electrode is used instead of a slit electrode as the electrode of the TFT substrate.

Figure 27:
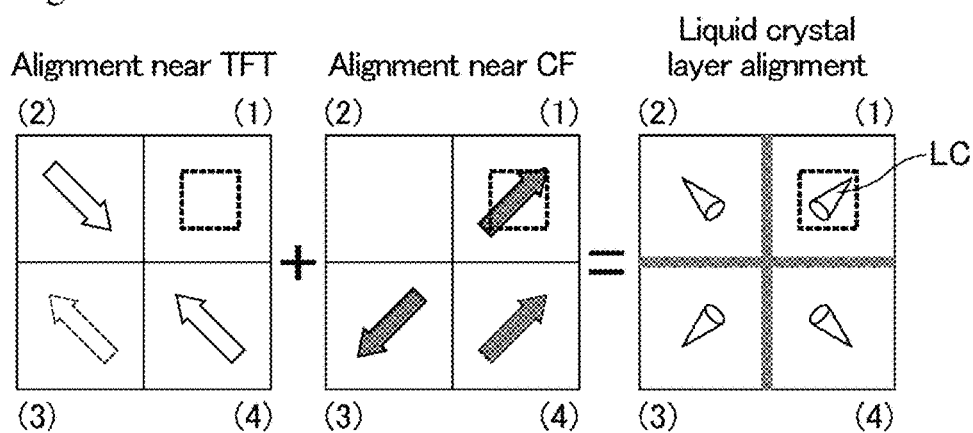
FIG. 27 is a conceptual view showing a pre-tilt direction of liquid crystal molecules near the TFT substrate, a pre-tilt direction of liquid crystal molecules near the CF substrate, and liquid crystal layer alignment, in each half pixel in a liquid crystal display panel of Reference Example 1.
Figure 28:
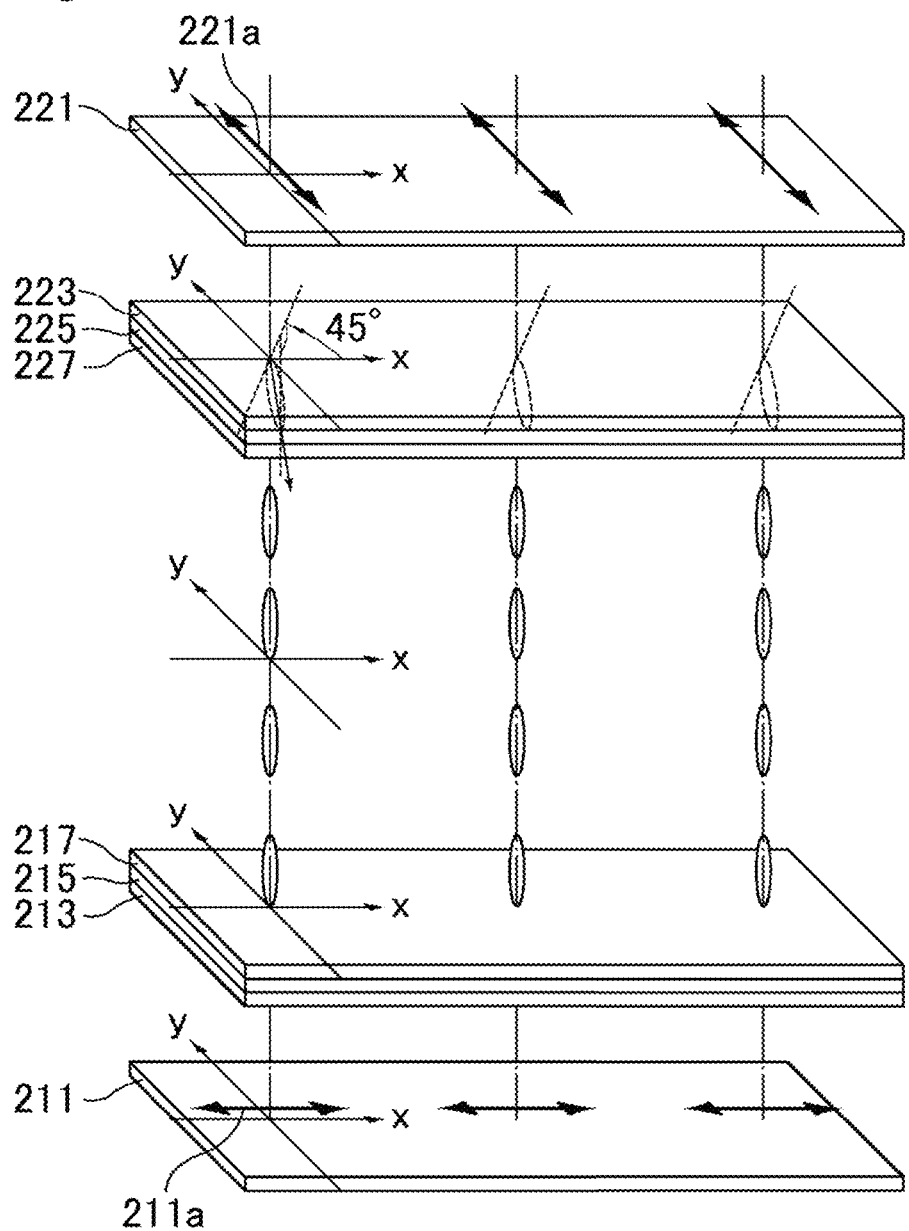
FIG. 28 is a schematic cross-sectional view showing an OFF state in a region (1) in each half pixel in the liquid crystal display panel of Reference Example 1.
Figure 29:
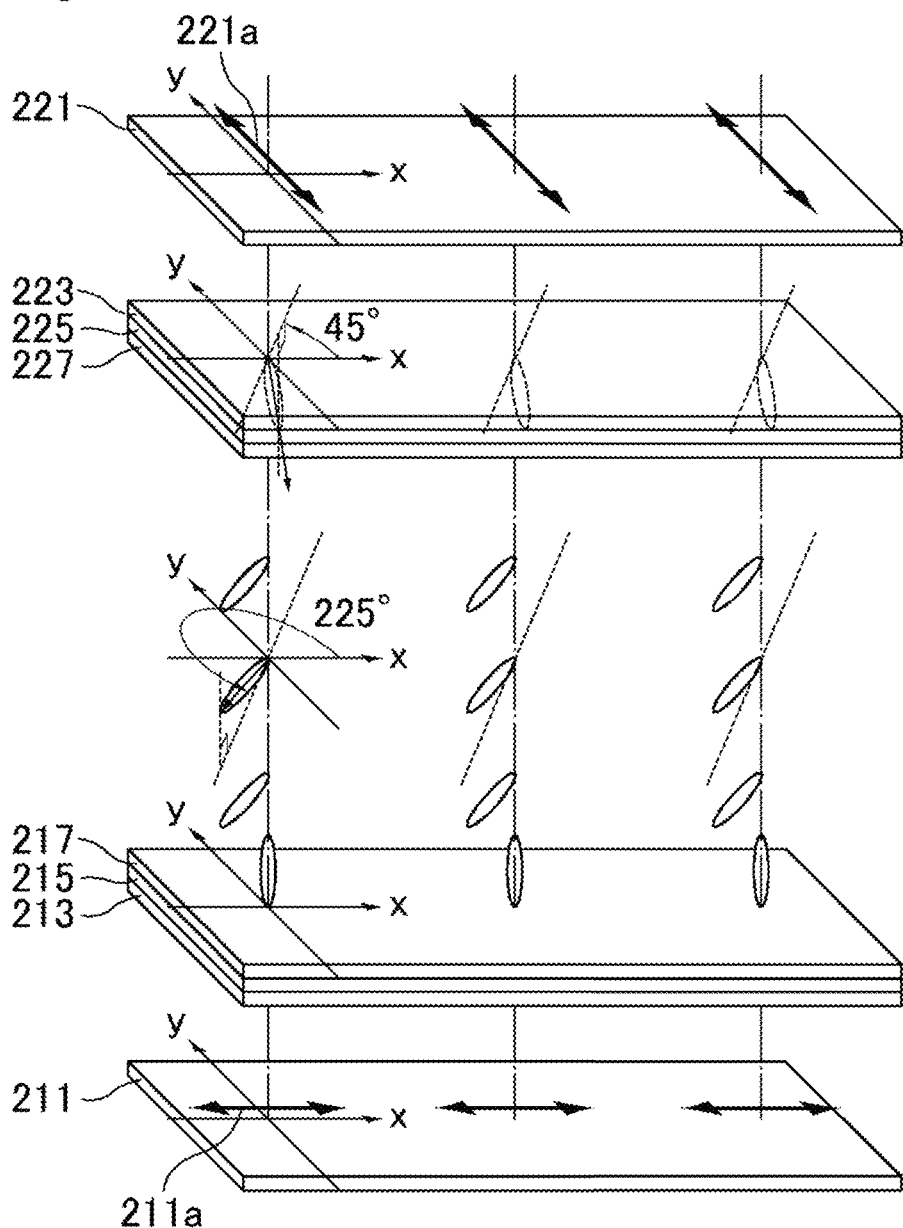
FIG. 29 is a schematic cross-sectional view showing an ON state in the region (1) in each half pixel in the liquid crystal display panel of Reference Example 1.

FIG. 27 is a conceptual view showing a pre-tilt direction of liquid crystal molecules near the TFT substrate, a pre-tilt direction of liquid crystal molecules near the CF substrate, and liquid crystal layer alignment, in each half pixel in a liquid crystal display panel of Reference Example 1. FIG. 28 is a schematic cross-sectional view showing an OFF state in the first alignment region (1) in each half pixel in the liquid crystal display panel of Reference Example 1. FIG. 29 is a schematic cross-sectional view showing an ON state in the first alignment region (1) in each half pixel in the liquid crystal display panel of Reference Example 1.

In FIG. 28 and FIG. 29, a polarization axis 211a of a first polarizing plate 211 is at the azimuth of the x-axis and a polarization axis 221a of a second polarizing plate 221 is at the azimuth of the y-axis. In the display region of the TFT substrate, ITO 215 and a photo-alignment film 217 are entirely provided to a substrate 213 including TFTs. In the display region of the CF substrate, ITO 225 and a photo-alignment film 227 are entirely provided to a substrate 223 (to the surface facing the liquid crystal) including CFs. The ITO may be replaced by another transparent electrode material such as indium zinc oxide (IZO). The same applies to FIG. 31, FIG. 32, FIG. 34, FIG. 35, FIG. 37, and FIG. 38 described below.

The liquid crystal molecules in the first alignment region (1) are pre-tilted near the CF substrate but are not pre-tilted near the TFT substrate due to no exposure.

Figure 30:
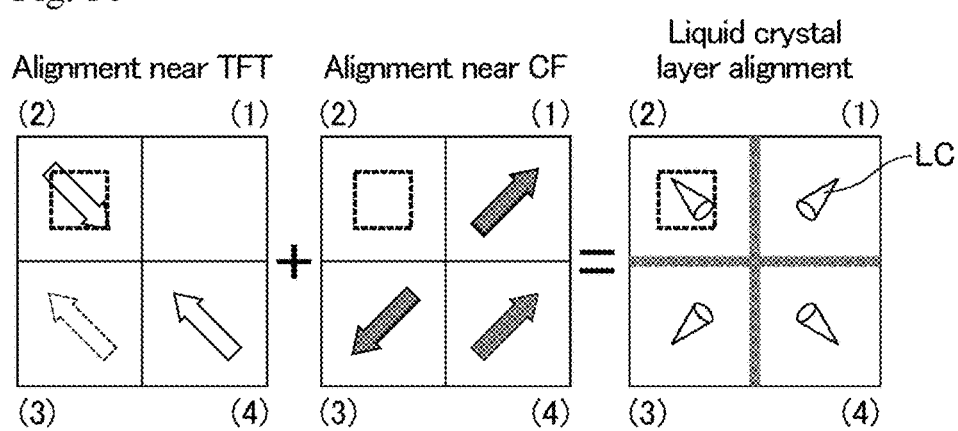
FIG. 30 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of Reference Example 1.
Figure 31:
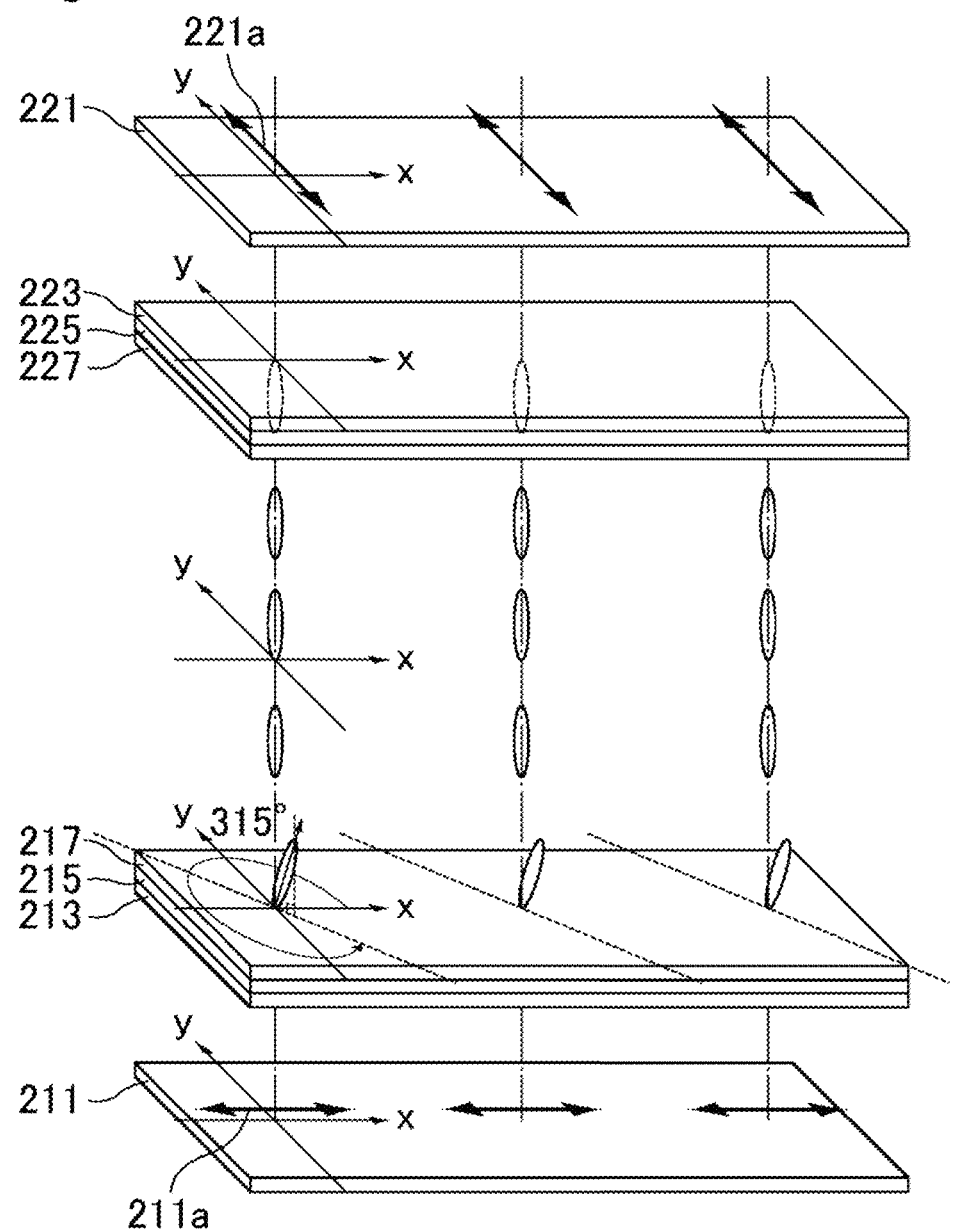
FIG. 31 is a schematic cross-sectional view showing an OFF state in a region (2) in each half pixel in the liquid crystal display panel of Reference Example 1.
Figure 32:
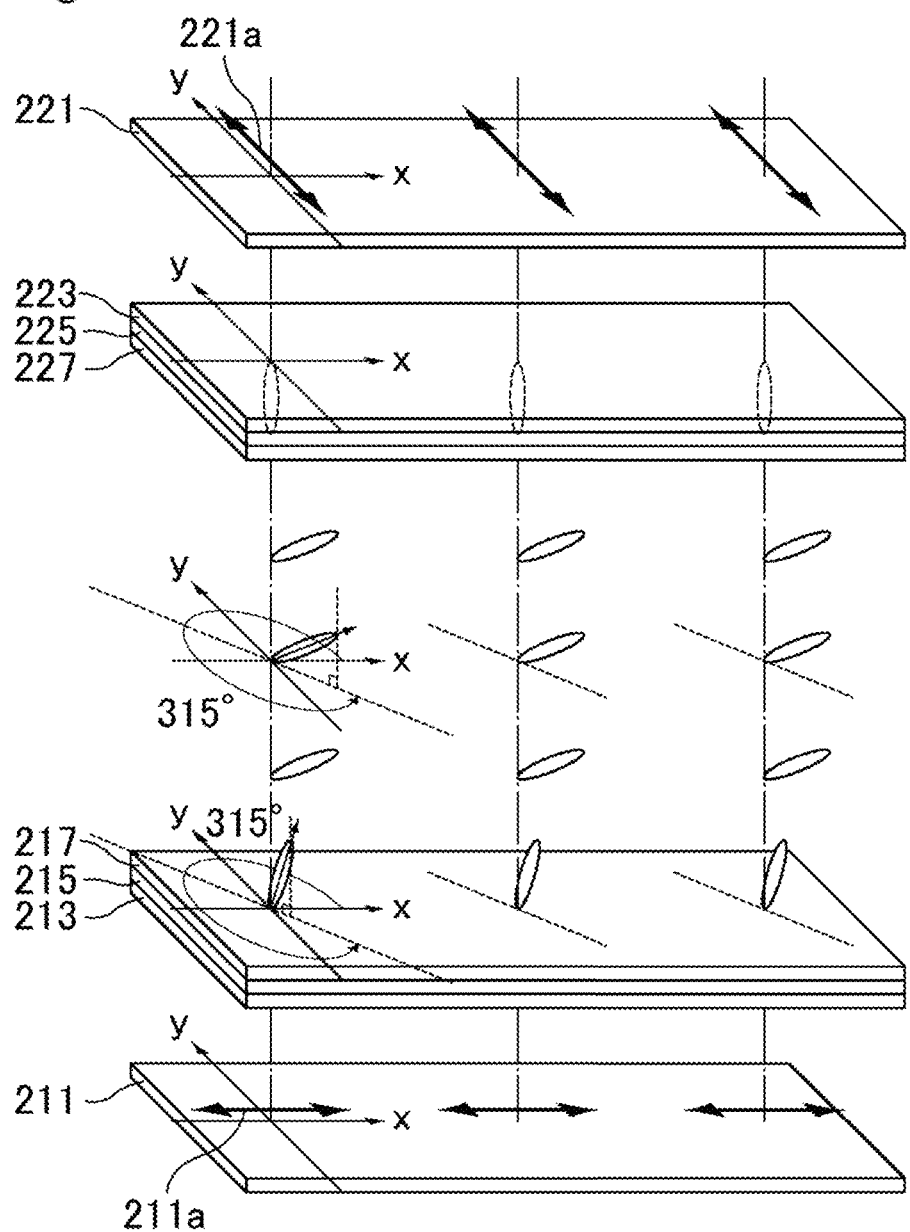
FIG. 32 is a schematic cross-sectional view showing an ON state in the region (2) in each half pixel in the liquid crystal display panel of Reference Example 1.

FIG. 30 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of Reference Example 1. FIG. 31 is a schematic cross-sectional view showing an OFF state in the second alignment region (2) in each half pixel in the liquid crystal display panel of Reference Example 1. FIG. 32 is a schematic cross-sectional view showing an ON state in the second alignment region (2) in each half pixel in the liquid crystal display panel of Reference Example 1.

The liquid crystal molecules in the second alignment region (2) are pre-tilted near the TFT substrate and are not pre-tilted near the CF substrate due to no exposure.

Figure 33:
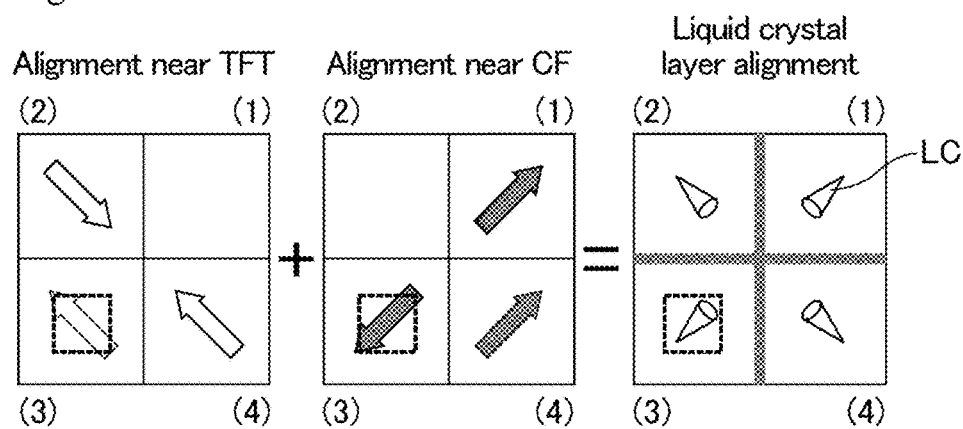
FIG. 33 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of Reference Example 1.
Figure 34:
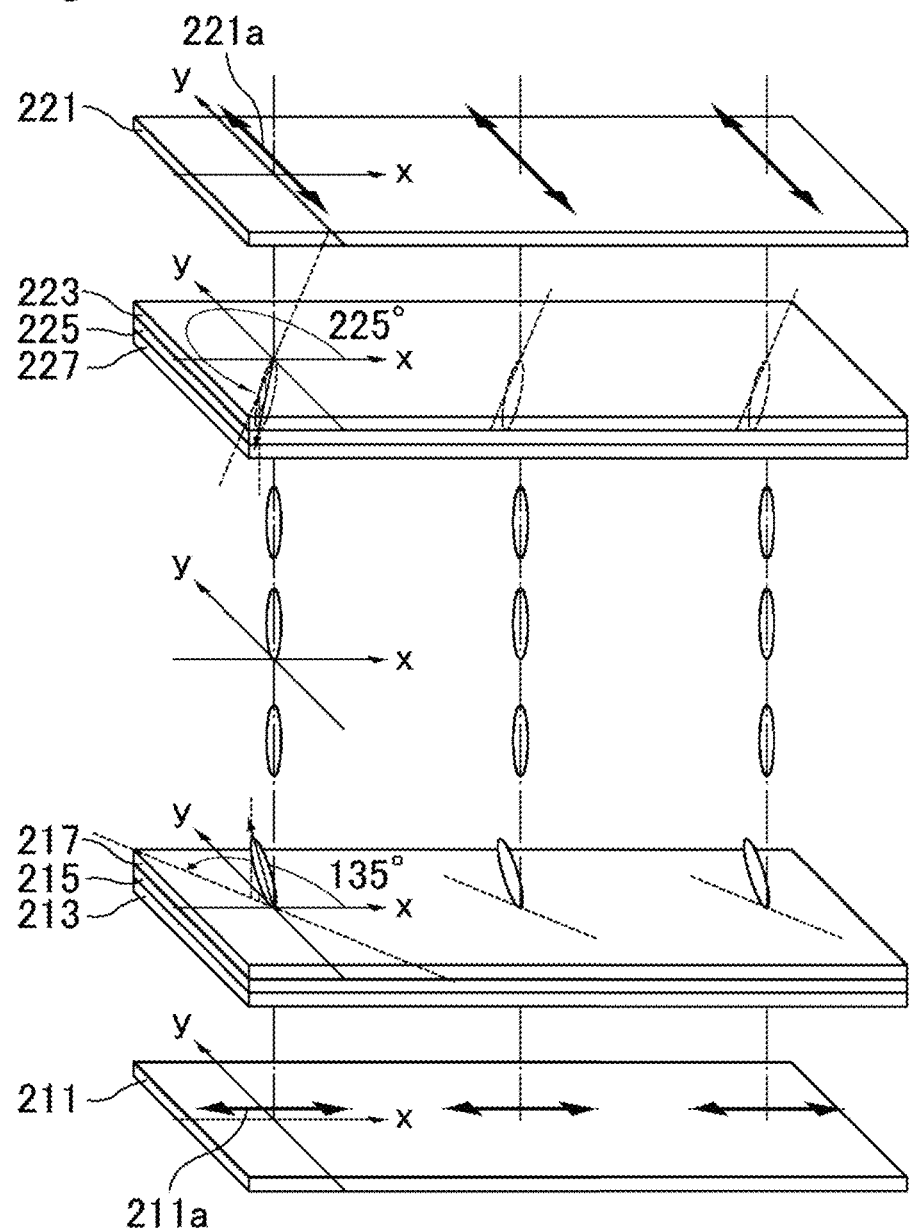
FIG. 34 is a schematic cross-sectional view showing an OFF state in a region (3) in each half pixel in the liquid crystal display panel of Reference Example 1.
Figure 35:
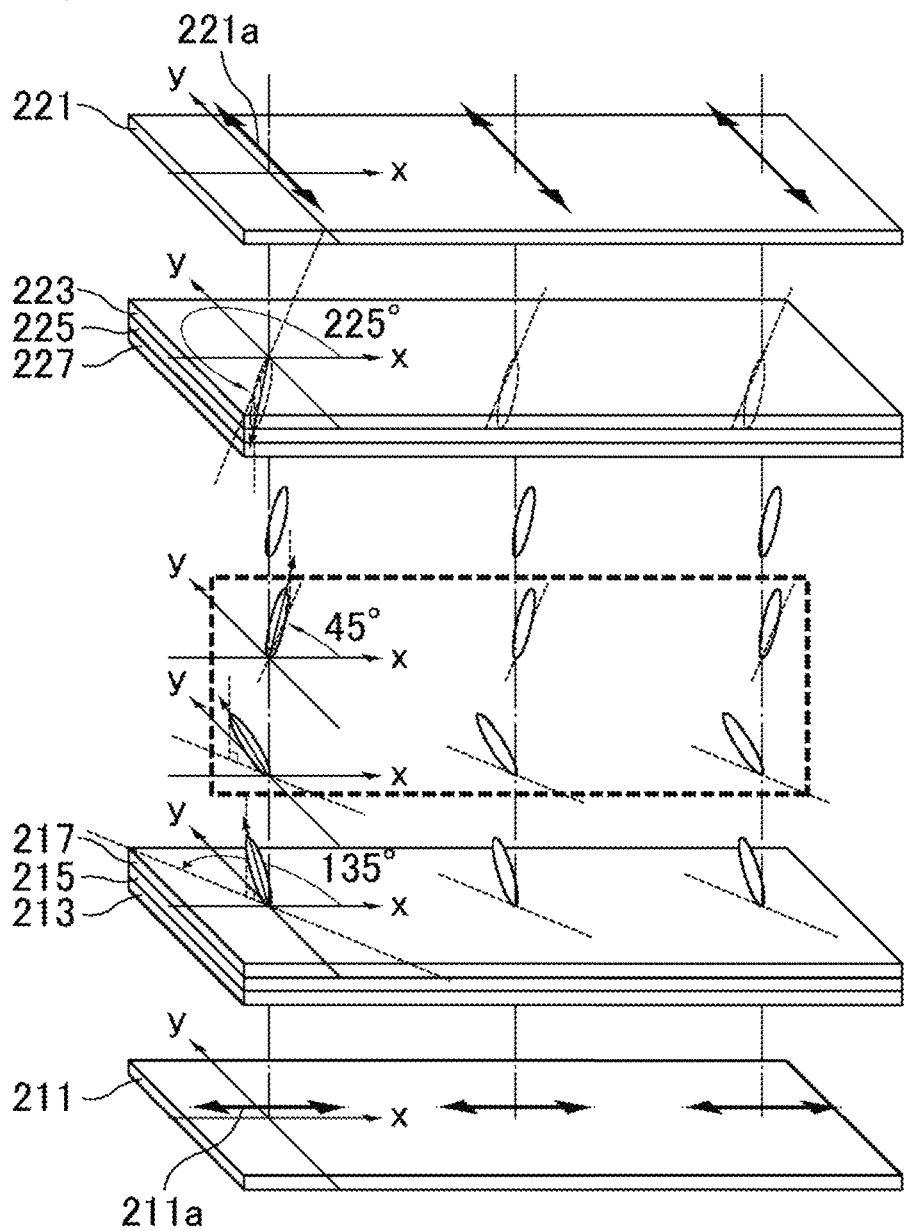
FIG. 35 is a schematic cross-sectional view showing an ON state in the region (3) in each half pixel in the liquid crystal display panel of Reference Example 1.

FIG. 33 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of Reference Example 1. FIG. 34 is a schematic cross-sectional view showing an OFF state in the third alignment region (3) in each half pixel in the liquid crystal display panel of Reference Example 1. FIG. 35 is a schematic cross-sectional view showing an ON state in the third alignment region (3) in each half pixel in the liquid crystal display panel of Reference Example 1.

The liquid crystal molecules in the third alignment region (3) are pre-tilted near the CF substrate and are less pre-tilted near the TFT substrate than near the CF substrate due to double exposure, causing slightly twisted alignment overall. The twist occurs over the range from the portion surrounded by the dashed line near the TFT substrate to the portion near the center of the liquid crystal layer in the thickness direction in FIG. 35.

Figure 36:
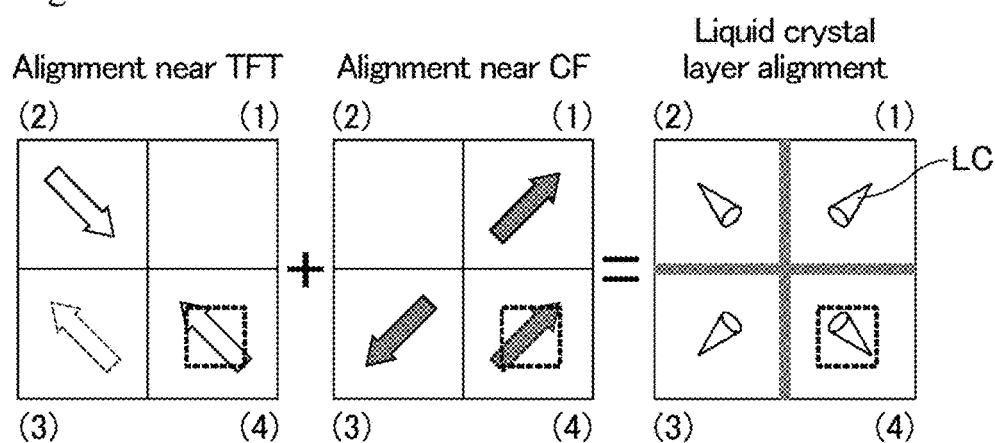
FIG. 36 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of Reference Example 1.
Figure 37:
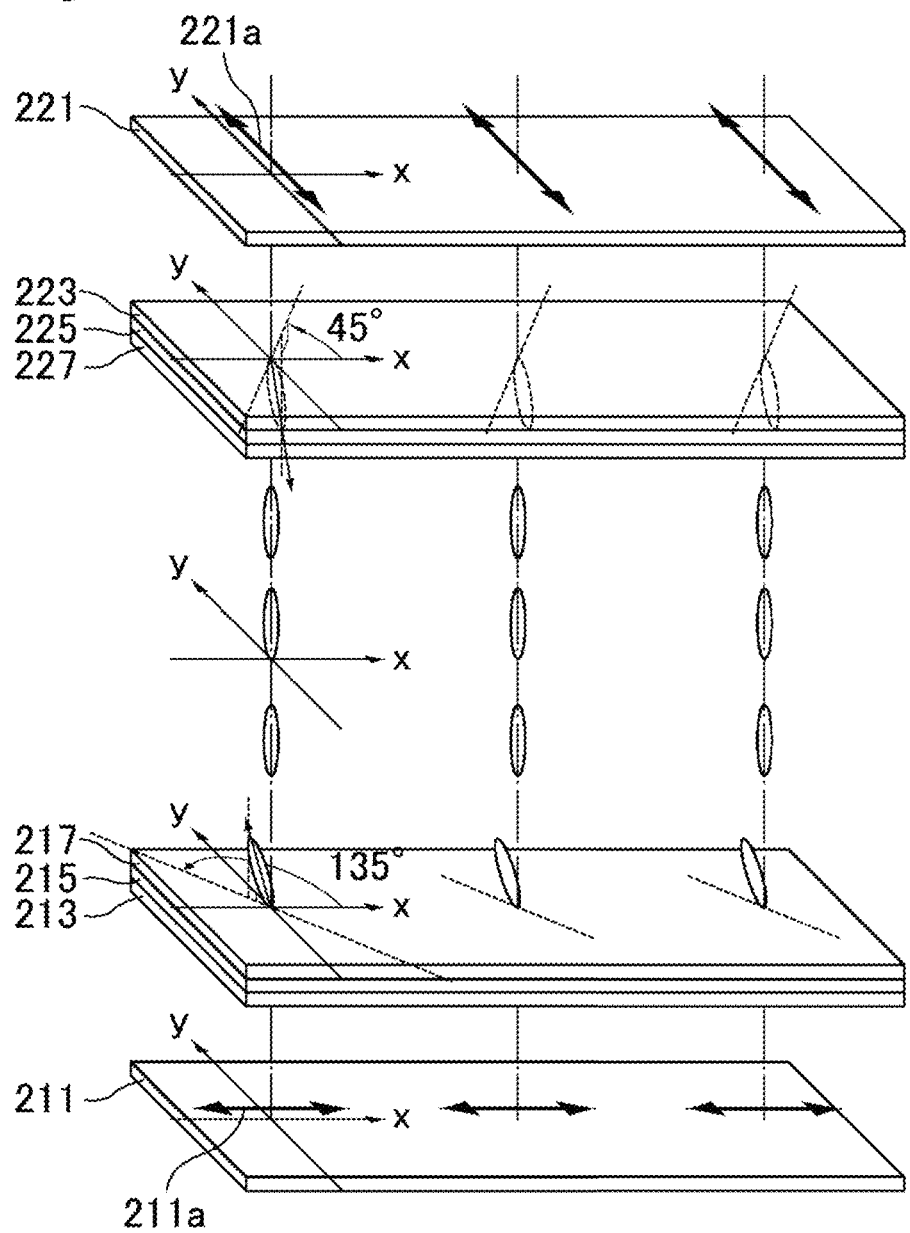
FIG. 37 is a schematic cross-sectional view showing an OFF state in a region (4) in each half pixel in the liquid crystal display panel of Reference Example 1.
Figure 38:
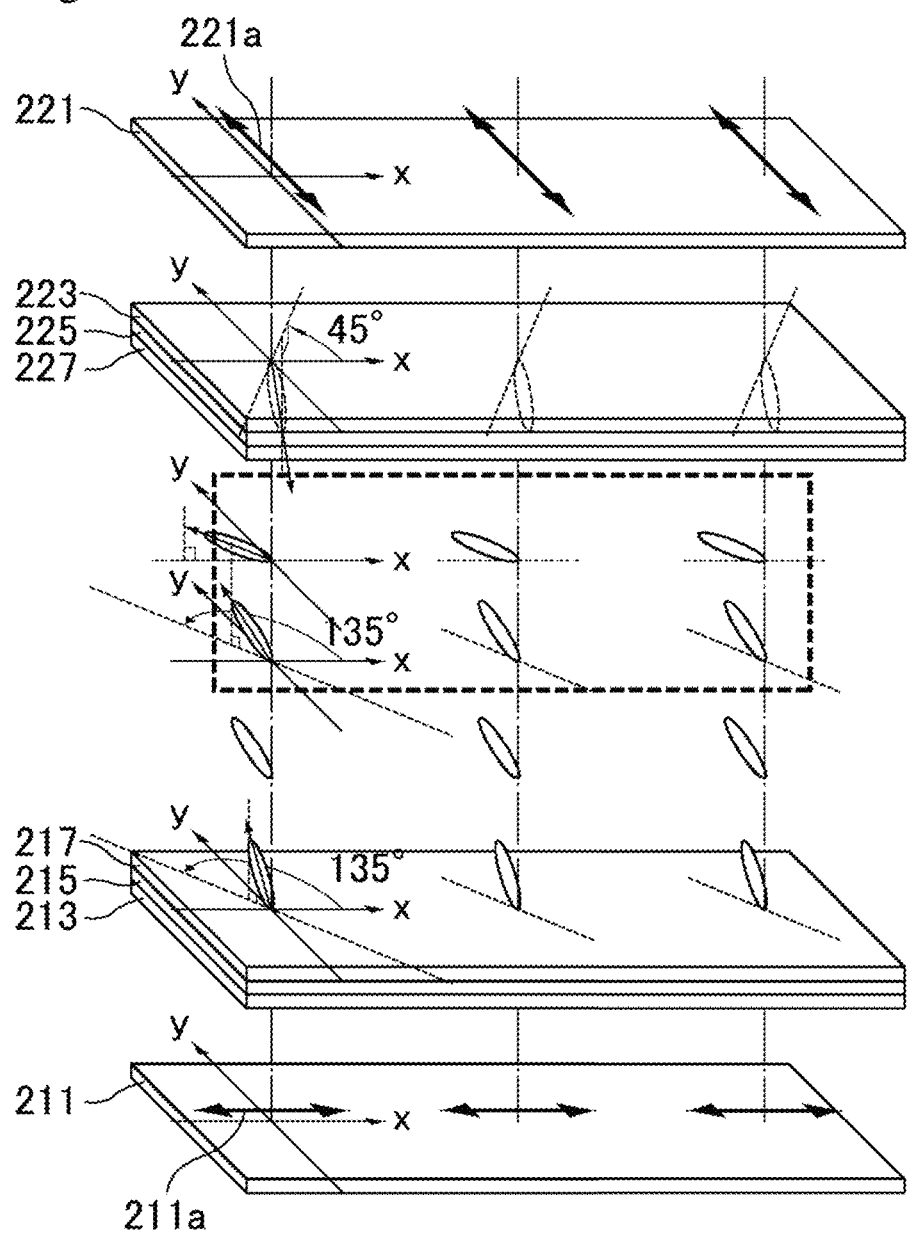
FIG. 38 is a schematic cross-sectional view showing an ON state in the region (4) in each half pixel in the liquid crystal display panel of Reference Example 1.

FIG. 36 is a conceptual view showing a pre-tilt direction of liquid crystal molecules near the TFT substrate, a pre-tilt direction of liquid crystal molecules near the CF substrate, and liquid crystal layer alignment, in each half pixel in the liquid crystal display panel of Reference Example 1. FIG. 37 is a schematic cross-sectional view showing an OFF state in the fourth alignment region (4) in each half pixel in the liquid crystal display panel of Reference Example 1. FIG. 38 is a schematic cross-sectional view showing an ON state in the fourth alignment region (4) in each half pixel in the liquid crystal display panel of Reference Example 1.

The liquid crystal molecules in the fourth alignment region (4) are pre-tilted near the TFT substrate and are less pre-tilted near the CF substrate due to double exposure, causing slightly twisted alignment overall. The twist occurs over the range from the portion surrounded by the dashed line near the CF substrate to the portion near the center of the liquid crystal layer in the thickness direction in FIG. 38.

In the liquid crystal display panel of the first modified example of Embodiment 1 and the liquid crystal display panel of Reference Example 1, only one of the photo-alignment film of the TFT substrate and the photo-alignment film of the CF substrate provides a pre-tilt angle in each of two regions (first alignment region (1) and second alignment region (2)) of the four regions, and the photo-alignment film of the TFT substrate and the photo-alignment film of the CF substrate provide different pre-tilt angles at azimuths perpendicular to each other in each of the other two regions (third alignment region (3) and fourth alignment region (4)) of the four regions. These configurations are summarized in the following Table 3. The exposure states corresponding to the "large", "small", and "none" under "pre-tilt" in the following Table 3 are the same as those in the above Table 2.

TABLE 3

| Region | Pre-tilt TFT | Pre-tilt CF | Alignment achieved by pre-tilt (UV exposure effect) |
|---|---|---|---|
| (1) | None | Large | Tilt near CF is dominant (hybrid alignment) |
| (2) | Large | None | Tilt near TFT is dominant (hybrid alignment) |
| (3) | Small | Large | Tilt near CF is dominant (slightly twisted alignment) |
| (4) | Large | Small | Tilt near TFT is dominant (slightly twisted alignment) |

Hereinafter, the method for manufacturing the liquid crystal display panel of Embodiment 1 is described.

In Embodiment 1, paired substrates before formation of alignment films were prepared by a common method.

The first substrate, which is one of the paired substrates, was produced as a thin-film transistor array substrate in which scanning signal lines and data signal lines were formed to intersect each other in a grid shape on a glass substrate with an insulating film in between and thin-film transistors and pixel electrodes were formed at the respective intersections. The first substrate was produced by forming a laminate of thin films and patterning the films through repetition of the following steps: (1) thin-film formation by a technique such as sputtering, plasma-enhanced chemical vapor deposition (PVCD), or vapor deposition; (2) resist application which includes coating such as spin coating or roll coating, followed by baking; (3) exposure by a method such as lens projection (stepper), mirror projection, or proximity; (4) development; (5) etching such as dry etching or wet etching; and (6) resist removal by a method such as plasma (dry) ashing or wet removal.

The second substrate, which is the other of the paired substrates, was produced as a color filter substrate by sequentially forming, on a glass substrate, (1) a black matrix, (2) RGB color patterns, (3) a protective film, and (4) a transparent electrode film.

To each of the first substrate and the second substrate was applied a solution of an alignment film material by spin casting, following by baking at 200° C. Thereby, alignment films were formed.

The alignment films were each partially irradiated with polarized light (alignment treatment by light irradiation) such that the first alignment film and the second alignment film can provide pre-tilt directions to liquid crystal molecules near them. The constituent molecules of the alignment films have photo-functional groups (photosensitive groups) in a side chain of a polymer. The alignment treatment causes dimerization of the photo-functional groups such that they are dimerized and form a crosslinked structure.

Processes such as sealing and spacer scattering were performed, and then the first substrate and the second substrate were bonded to each other in the substrate-bonding step. After this step, four domains provided with different pre-tilt directions for the liquid crystal molecules can be formed in each pixel.

Between the bonded first substrate and second substrate were injected liquid crystal molecules having negative anisotropy of dielectric constant. Polarizing plates were bonded to the substrates so that the azimuths of pre-tilt angles provided by the alignment films and the polarization axes of the polarizing plates form four domain regions, namely a first alignment region provided with a pre-tilt direction at an azimuth of 225°, a second alignment region provided with a pre-tilt direction at an azimuth of 135°, a third alignment region provided with a pre-tilt direction at an azimuth of 45°, and a fourth alignment region provided with a pre-tilt direction at an azimuth of 315°, with the azimuth in the transverse direction of pixels defined as 0°. Thereby, the liquid crystal display panel of Embodiment 1 was completed. Thereafter, a mounting step was performed to complete a liquid crystal display device.

The alignment treatment in the method for manufacturing the liquid crystal display panel of Embodiment 1 is described in detail below.

Figure 39:
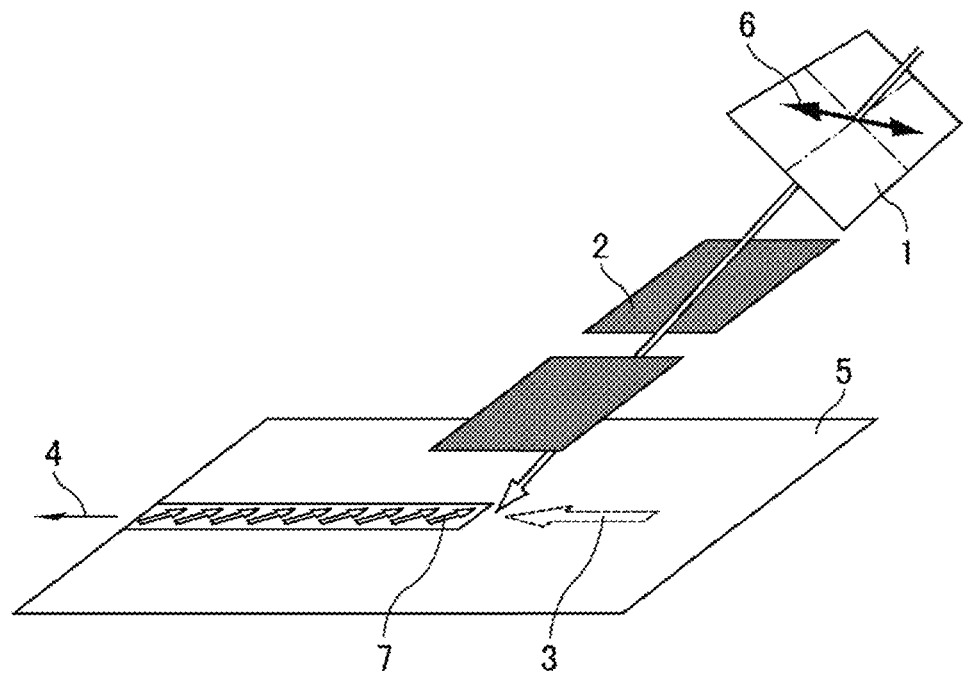
FIG. 39 is a schematic view of an UV exposure device in Embodiment 1.

FIG. 39 is a schematic view of an UV exposure device in Embodiment 1. The UV light applied through a UV polarizer 1 is passed through a UV exposure mask 2 to be applied to a substrate 5. The substrate 5 may be the first substrate or the second substrate. The UV light irradiation direction (light irradiation direction) 3 indicates the UV light irradiation direction in a plan view of the main surface of the substrate 5. The light irradiation direction can also be referred to as a light traveling direction when the light emitted by the light source is projected on the surface of the substrate 5. The substrate 5 is moved in a substrate-moving direction 4. In Embodiment 1, the UV light irradiation direction 3 and the substrate-moving direction 4 are parallel to each other. Instead of the substrate, the light source may be moved.

Figure 40:
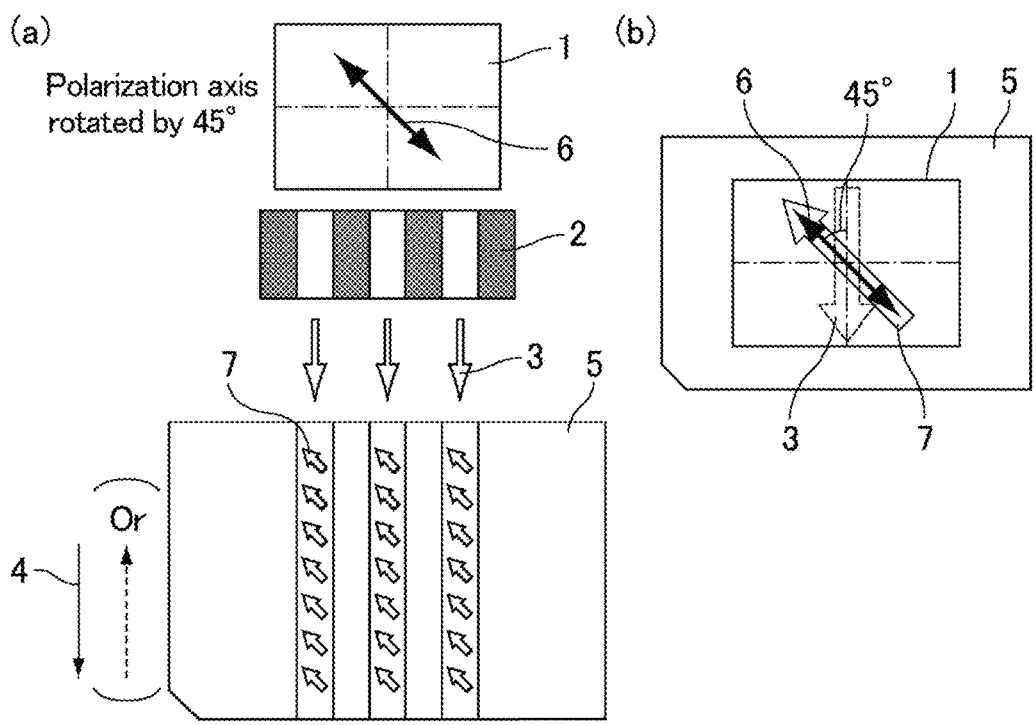
FIG. 40 includes schematic views showing first exposure in Embodiment 1.

FIG. 40(a) is a schematic view showing first exposure in Embodiment 1. FIG. 41(a) is a schematic view showing second exposure in Embodiment 1. FIG. 40(b) and FIG. 41(b) are schematic plan views each showing the polarization axis of the polarizer projected on a surface. In FIG. 39 to FIG. 41, the double-headed arrow on the UV polarizer 1 indicates a polarization axis 6 of the UV polarizer 1, and the white arrow on the substrate 5 indicates a pre-tilt direction 7 of the liquid crystal molecules. The polarization axis 6 of the UV polarizer 1 and the UV light irradiation direction 3 are substantially different from each other, preferably forming an angle of approximately 45°. As shown in FIG. 40(b) and FIG. 41(b), the polarization axis 6 of the UV polarizer 1 projected on the surface of the substrate 5 is preferably the same as a pre-tilt azimuth 7. This configuration allows alignment of liquid crystal molecules at a desired azimuth. Also, the polarization axis 6 of the UV polarizer 1 projected on the surface of the substrate 5 and the light irradiation direction 6 may substantially form an angle of 45°. Thereby, alignment regions can be provided with a pre-tilt angle with higher precision.

Figure 42:
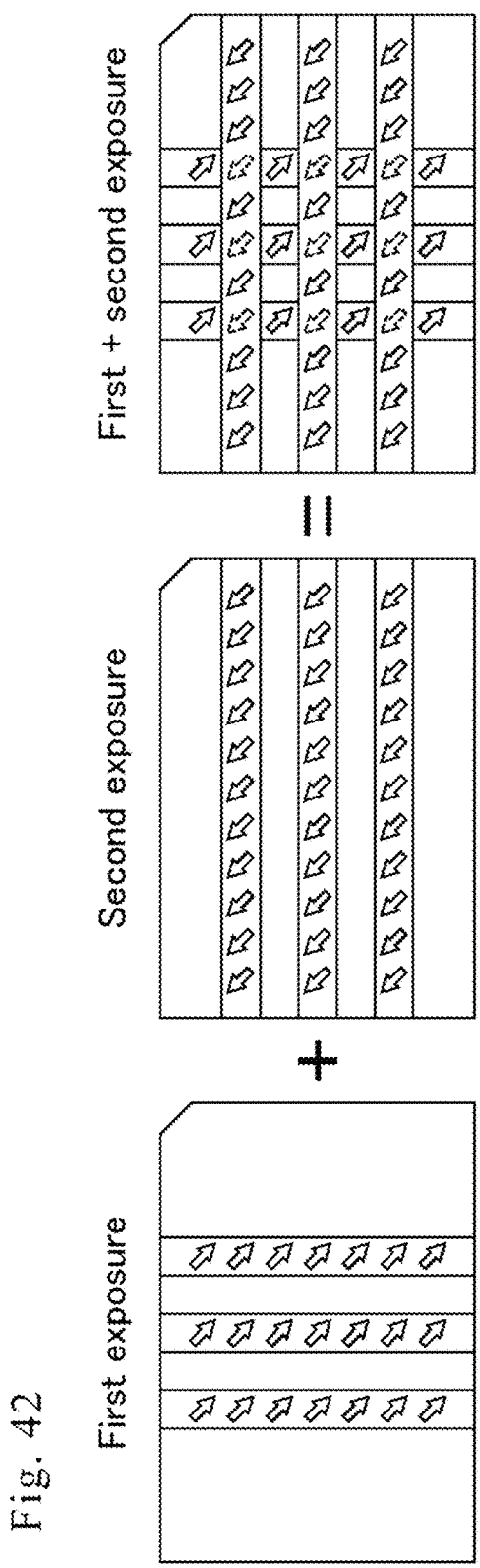
FIG. 42 is a schematic view showing pre-tilt directions of liquid crystal molecules provided by first exposure, second exposure, and both of the exposure treatments of a photo-alignment film of a substrate in the liquid crystal display panel of Embodiment 1.

FIG. 42 is a schematic view showing pre-tilt directions of liquid crystal molecules provided by first exposure, second exposure, and both of the exposure treatments of a photo-alignment film of a substrate in the liquid crystal display panel of Embodiment 1. For example, by a simple modification such as "polarization axis rotated by 45°" shown in FIG. 40, "polarization axis rotated by −45°" or "substrate rotated by 90° before second exposure" shown in FIG. 41, a conventional exposure device can be modified into an exposure device suited to produce the liquid crystal display panel of the present invention.

Embodiment 2

Figure 43:
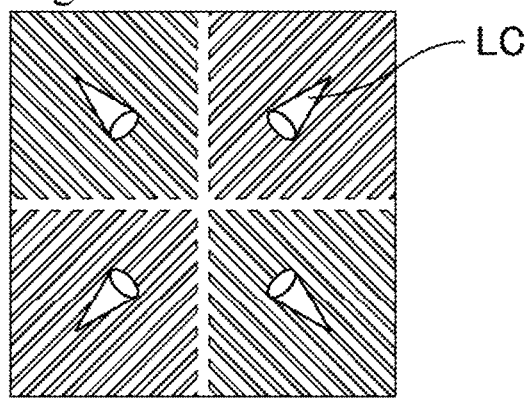
FIG. 43 is a schematic plan view showing the relation between four domains, the alignment directions of liquid crystal molecules, and an electrode provided with slits in each half pixel in a liquid crystal display panel of Embodiment 2.

FIG. 43 is a schematic plan view showing the relation between four domains, the alignment directions of liquid crystal molecules, and an electrode provided with slits in each half pixel in a liquid crystal display panel of Embodiment 2.

In Embodiment 2, linear electrode portions of the electrode are alternately connected to opposite sides of each of two linear electrode portions constituting the cross-shaped electrode portion. This configuration can achieve the effect of the present invention and prevent accidental breaking of the cross-shaped electrode portion in formation of slits by patterning in the production step, enhancing the production yield.

The other configurations of the liquid crystal display panel of Embodiment 2 are similar to those of the liquid crystal display panel of Embodiment 1 described above.

Embodiment 3

Figure 44:
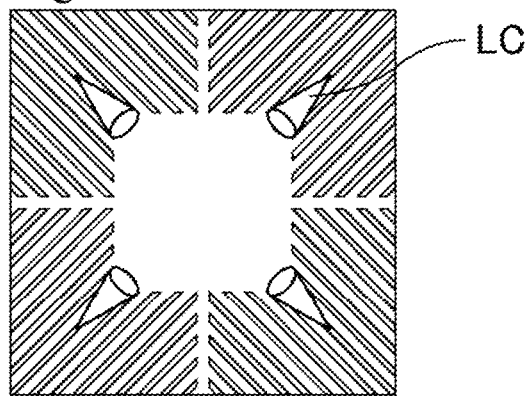
FIG. 44 is a schematic plan view showing the relation between four domains, the alignment directions of liquid crystal molecules, and an electrode provided with slits in each half pixel in a liquid crystal display panel of Embodiment 3.

FIG. 44 is a schematic plan view showing the relation between four domains, the alignment directions of liquid crystal molecules, and an electrode provided with slits in each half pixel in a liquid crystal display panel of Embodiment 3.

In Embodiment 3, the pixel electrodes each have a quadrangular portion, linear electrode portions extending from the quadrangular portion to be superimposed on the boundaries between the four alignment regions, and linear electrode portions extending from the quadrangular portion into the respective four alignment regions. Such an electrode shape also enables achievement of the effect of the present invention.

The other configurations of the liquid crystal display panel of Embodiment 3 are similar to those of the liquid crystal display panel of Embodiment 1 described above.

Although the liquid crystal display panels of Embodiments 1 to 3 described above include four alignment regions in each half pixel, the liquid crystal display panels may include four alignment regions in each pixel. Such liquid crystal display panels can also achieve the effect of the present invention.

In Embodiments 1 to 3 described above, one of the TFT substrate and the CF substrate is exposed to light and the other is not exposed to light in the first alignment region (1) and the second alignment region (2).

The past studies have revealed that such a region in which only one of the substrates is exposed to light can cause image sticking due to residual direct current (DC). The method can be improved to avoid such image sticking, and a method solving this problem can be the following Embodiment 4.

Embodiment 4

Figure 46:
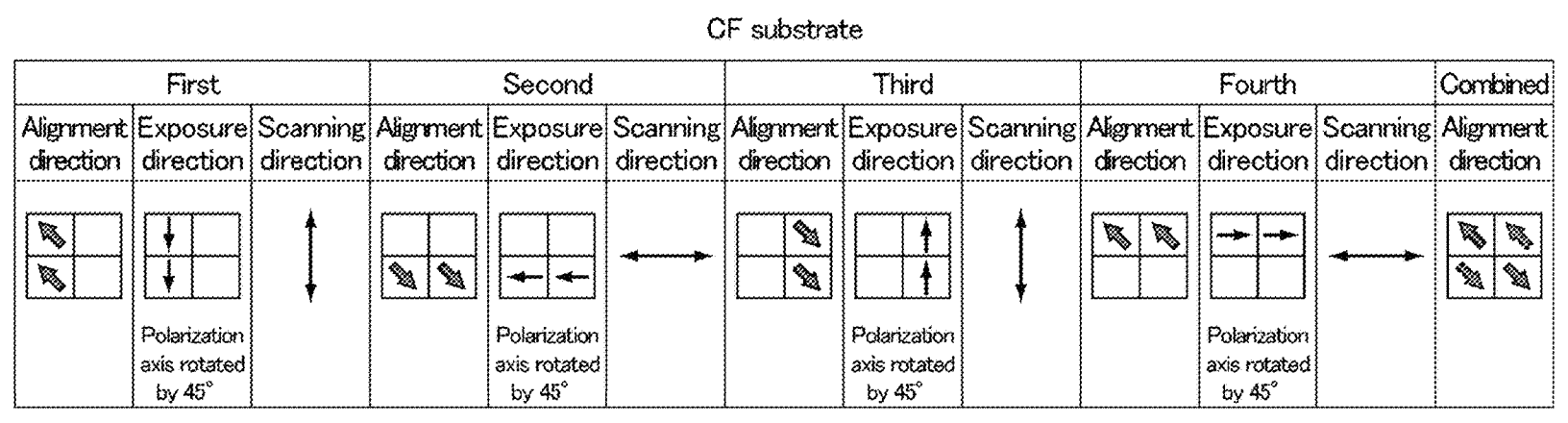
Figure 47:
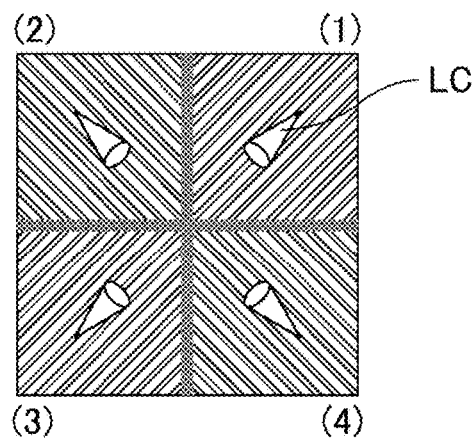
FIG. 47 is a schematic plan view showing the relation between four domains, the alignment directions of liquid crystal molecules, and an electrode provided with slits in each half pixel in the liquid crystal display panel of Embodiment 4.

FIG. 45 is a conceptual view showing pre-tilt directions of liquid crystal molecules provided by first exposure, second exposure, third exposure, fourth exposure, and all the exposure treatments of a photo-alignment film of a TFT substrate, together with exposure directions and scanning directions, in each half pixel in a liquid crystal display panel of Embodiment 4. FIG. 46 is a conceptual view showing pre-tilt directions of liquid crystal molecules provided by first exposure, second exposure, third exposure, fourth exposure, and all the exposure treatments of a photo-alignment film of a CF substrate, together with exposure directions and scanning directions, in each half pixel in the liquid crystal display panel of Embodiment 4. FIG. 47 is a schematic plan view showing the relation between four domains, the alignment directions of liquid crystal molecules, and an electrode provided with slits in each half pixel in the liquid crystal display panel of Embodiment 4.

This method can eliminate regions provided with substantially no pre-tilt angle and can achieve the effect of the present invention while avoiding image sticking. Yet, this method has a disadvantage that the number of exposure treatments increases from two as in Embodiments 1 to 3 to four.

In the liquid crystal display panel of Embodiment 4, the photo-alignment film of the TFT substrate and the photo-alignment film of the CF substrate provide different pre-tilt angles at azimuths perpendicular to each other in each of the first alignment region (1), the second alignment region (2), the third alignment region (3), and the fourth alignment region (4) (four quadrangular regions shown with the signs (1), (2), (3), and (4) in FIG. 47). These configurations are summarized in the following Table 4. The exposure states corresponding to the "large", "small", and "none" under "pre-tilt" in the following Table 4 are the same as those in the above Table 2.

TABLE 4

| Region | Pre-tilt TFT | Pre-tilt CF | Alignment achieved by pre-tilt (UV exposure effect) |
|---|---|---|---|
| (1) | Large | Small | Tilt near TFT is dominant (slightly twisted alignment) |
| (2) | Small | Large | Tilt near CF is dominant (slightly twisted alignment) |
| (3) | Large | Small | Tilt near TFT is dominant (slightly twisted alignment) |
| (4) | Small | Large | Tilt near CF is dominant (slightly twisted alignment) |

Comparative Example 1

Figure 48:
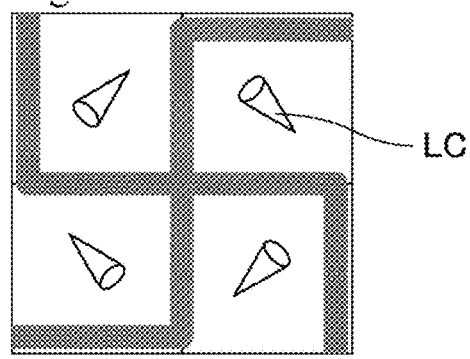
FIG. 48 is a schematic plan view showing the relation between four domains, the alignment directions of liquid crystal molecules, and a planar electrode in each half pixel in a liquid crystal display panel of Comparative Example 1.
Figure 49:
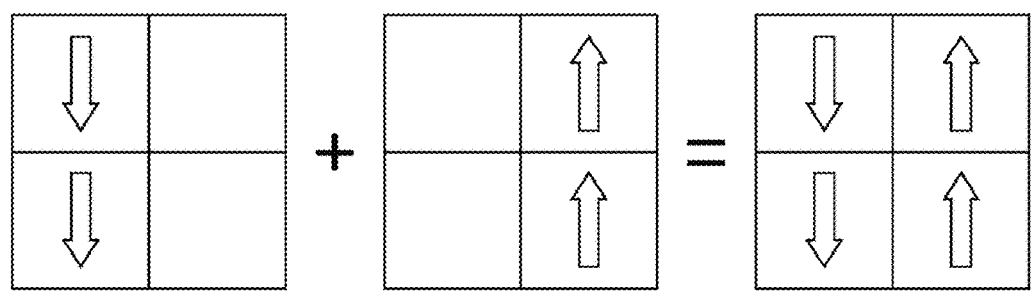
FIG. 49 is a conceptual view showing pre-tilt directions of liquid crystal molecules provided by first exposure, second exposure, and both of the exposure treatments of a photo-alignment film of a TFT substrate in each half pixel in the liquid crystal display panel of Comparative Example 1.
Figure 50:
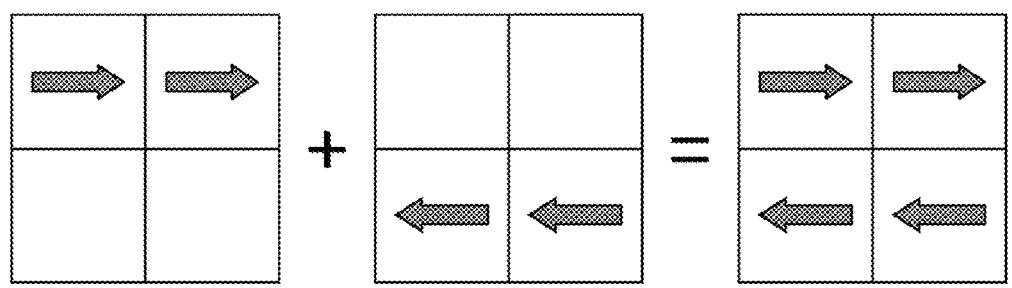
FIG. 50 is a conceptual view showing pre-tilt directions of liquid crystal molecules provided by first exposure, second exposure, and both of the exposure treatments of a photo-alignment film of a CF substrate in each half pixel in the liquid crystal display panel of Comparative Example 1.

FIG. 48 is a schematic plan view showing the relation between four domains, the alignment directions of liquid crystal molecules, and a planar electrode in each half pixel in a liquid crystal display panel of Comparative Example 1. FIG. 49 is a conceptual view showing pre-tilt directions of liquid crystal molecules provided by first exposure, second exposure, and both of the exposure treatments of a photo-alignment film of a TFT substrate in each half pixel in the liquid crystal display panel of Comparative Example 1. FIG. 50 is a conceptual view showing pre-tilt directions of liquid crystal molecules provided by first exposure, second exposure, and both of the exposure treatments of a photo-alignment film of a CF substrate in each half pixel in the liquid crystal display panel of Comparative Example 1. The liquid crystal display panel of Comparative Example 1 causes fylfot dark lines as shown in FIG. 48.

Figure 51:
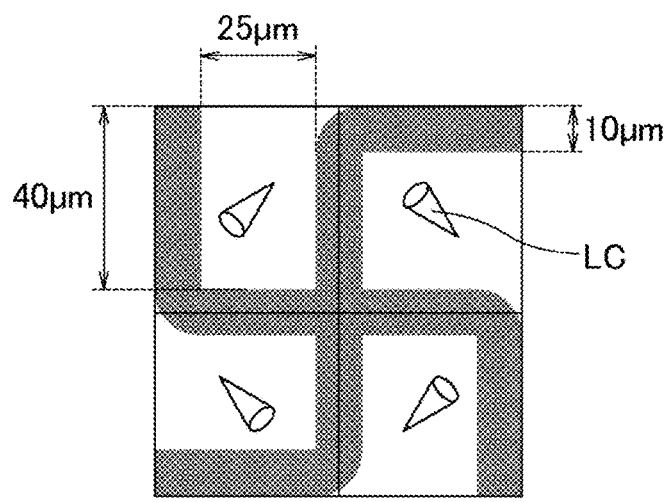
FIG. 51 is a schematic plan view showing the relation between four domains, the alignment directions of liquid crystal molecules, and a planar electrode in each half pixel of 82 μm×245 μm pixels included in the liquid crystal display panel of Comparative Example 1.
Figure 52:
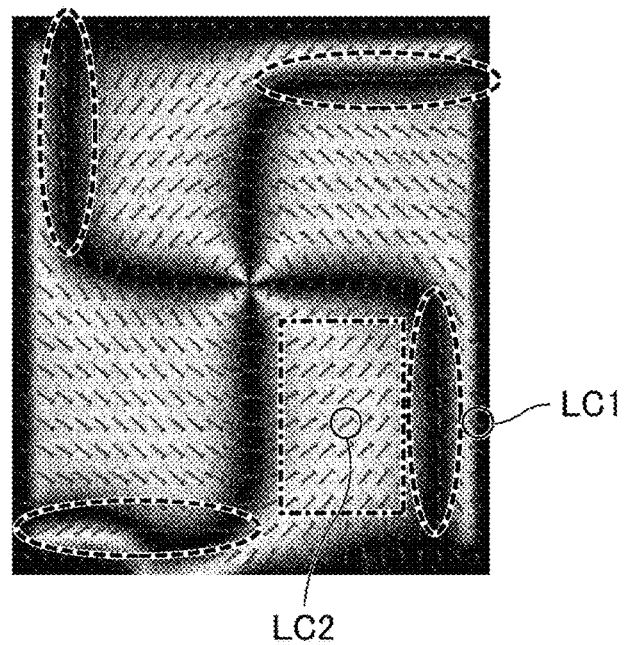
FIG. 52 is a simulation result corresponding to FIG. 51.

FIG. 51 is a schematic plan view showing the relation between four domains, the alignment directions of liquid crystal molecules, and a planar electrode in each half pixel of 82 μm×245 μm pixels included in the liquid crystal display panel of Comparative Example 1. FIG. 52 is a simulation result corresponding to FIG. 51. As the definition of a liquid crystal display panel increases and the pixel size decreases, the proportion of fylfot dark lines, formed by irregular alignment regions generated in the pixel edge portions indicated by dotted lines and dark lines generated in a crossed shape at the center of each pixel, increases in a pixel. This tends to cause unstable alignment and decreases the transmittance and the response performance. Here, irregular alignment regions generated in the pixel edge portions surrounded by dashed lines are due to a twist angle greater than 90° formed by the long-axis directions of liquid crystal molecules affected by oblique electric fields generated by the edge portions of the slit electrodes (liquid crystal molecules LC1 on the outline of the quadrangular half pixel) and the long-axis directions of liquid crystal molecules LC2 in the domain.

Figure 53:
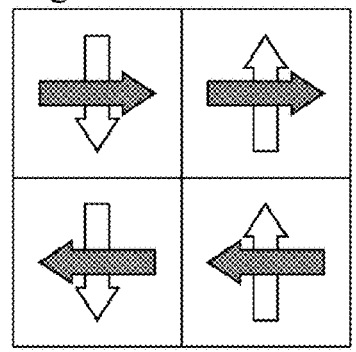
FIG. 53 is a schematic plan view showing a pre-tilt direction of liquid crystal molecules near the TFT substrate and a pre-tilt direction of liquid crystal molecules near the CF substrate, in each half pixel in the liquid crystal display panel of Comparative Example 1.
Figure 54:
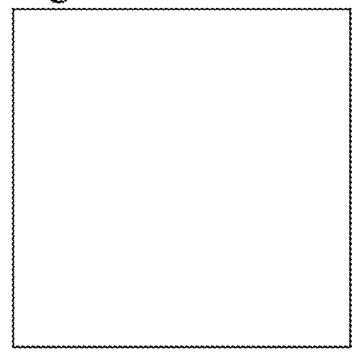
FIG. 54 is a schematic plan view showing a planar electrode in each half pixel in the liquid crystal display panel of Comparative Example 1.

FIG. 53 is a schematic plan view showing a pre-tilt direction of liquid crystal molecules near the TFT substrate and a pre-tilt direction of liquid crystal molecules near the CF substrate, in each half pixel in the liquid crystal display panel of Comparative Example 1. FIG. 54 is a schematic plan view showing a planar electrode in each half pixel in the liquid crystal display panel of Comparative Example 1.

The liquid crystal display panel of Comparative Example 1 can achieve the alignment shown in FIG. 48 by the four-division alignment (pre-tilt) structure of liquid crystal molecules shown in FIG. 53 and the alignment achieved by the electric fields generated by the planar electrode shown in FIG. 54 in combination.

(Mark Left by Pushing with Finger on 4D-RTN Alignment Liquid Crystal Display Panel)

Figure 55:
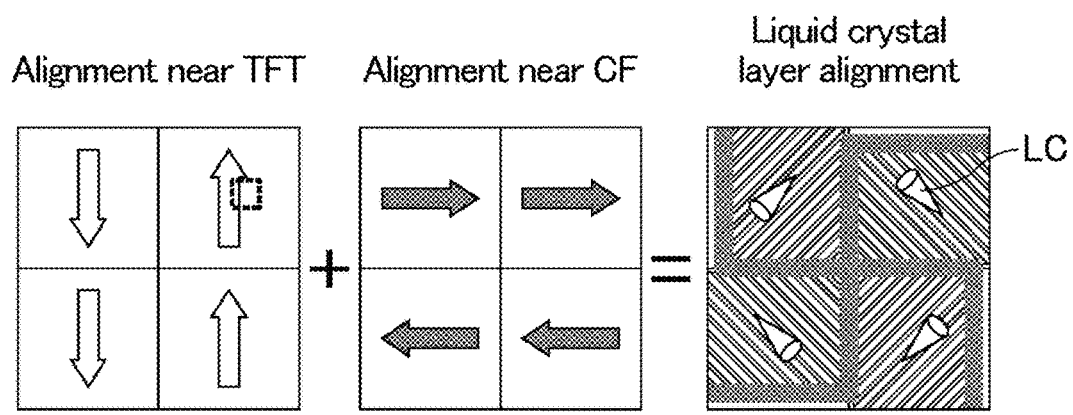
FIG. 55 is a conceptual view showing a pre-tilt direction of liquid crystal molecules near the TFT substrate, a pre-tilt direction of liquid crystal molecules near the CF substrate, and liquid crystal layer alignment, in each half pixel in a 4D-RTN alignment liquid crystal display panel.
Figure 56:
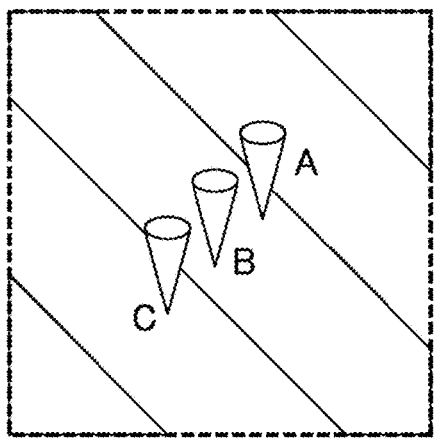
FIG. 56 shows alignment of liquid crystal molecules achieved by the pre-tilt provided by the TFT substrate of the liquid crystal display panel shown in FIG. 55.
Figure 57:
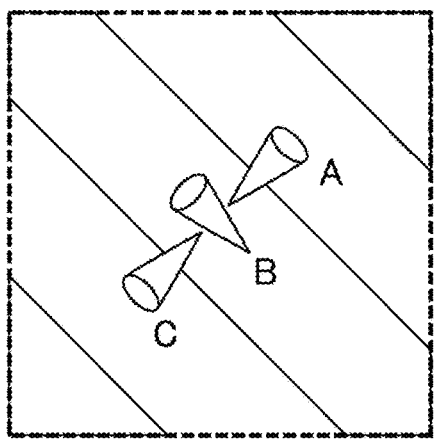
FIG. 57 shows alignment of liquid crystal molecules achieved by electric fields generated by a slit electrode of the TFT substrate in the liquid crystal display panel shown in FIG. 55.

FIG. 55 is a conceptual view showing a pre-tilt direction of liquid crystal molecules near the TFT substrate, a pre-tilt direction of liquid crystal molecules near the CF substrate, and liquid crystal layer alignment, in each half pixel in a 4D-RTN alignment liquid crystal display panel. The liquid crystal display panel shown in FIG. 55 is similar to that of Comparative Example 1, except that the slit electrode shown in FIG. 55 is used instead of the planar electrode as the electrode. This liquid crystal display panel corresponds to a modified example of Comparative Example 1. FIG. 56 shows alignment of liquid crystal molecules achieved by the pre-tilt provided by the TFT substrate of the liquid crystal display panel shown in FIG. 55. FIG. 57 shows alignment of liquid crystal molecules achieved by electric fields generated by a slit electrode of the TFT substrate in the liquid crystal display panel shown in FIG. 55. FIG. 56 and FIG. 57 are enlarged views of the portion surrounded by a dashed line in FIG. 55, showing the alignment of the liquid crystal molecules near the slit electrode and the TFT substrate.

As in the case of a 4D-ECB alignment liquid crystal display panel, the alignment of liquid crystal molecules near the TFT substrate (those adjacent to the TFT substrate) including slit electrodes is set depending on the balance between (1) alignment achieved by the pre-tilt and (2) alignment achieved by electric fields generated by the slit electrodes. In the normal state (when the finger is removed), the alignment (1) achieved by the pre-tilt is dominant, whereas upon pushing with a finger, the gap between the TFT substrate and the CF substrate becomes narrow and thus the alignment (2) achieved by electric fields generated by the slit electrode is dominant.

Figure 58:
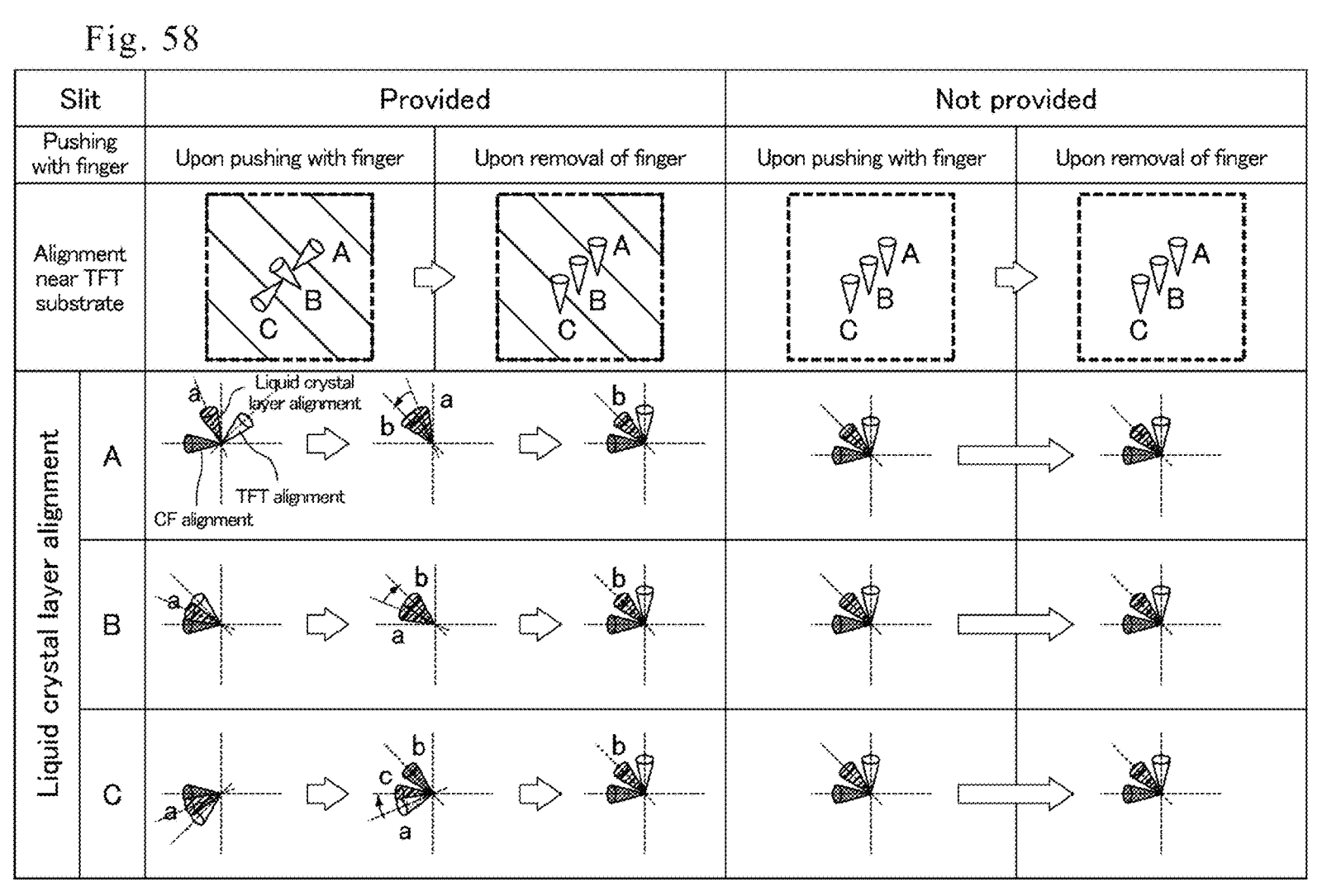

FIG. 58 shows alignment of liquid crystal molecules near the TFT substrate and in the liquid crystal layer upon pushing with a finger and upon removal of the finger in the liquid crystal display panel shown in FIG. 55. In FIG. 58, the "provided" state for the "slit" means that the liquid crystal display panel includes the slit electrode shown in FIG. 55. The "not provided" state for the "slit" means that the liquid crystal display panel of Comparative Example 1 includes no slit electrode but includes a planar electrode (the liquid crystal display panel different from the liquid crystal display panel shown in FIG. 55 only in terms of including a planar electrode instead of the slit electrode). The "alignment near TFT substrate" or "TFT alignment" means the alignment of liquid crystal molecules near the TFT substrate in the liquid crystal layer. The "liquid crystal layer alignment" means the alignment of liquid crystal molecules in the liquid crystal layer or the alignment of liquid crystal molecules in the center portion, which is other than the portion near the TFT substrate and the portion near the CF substrate, in the liquid crystal layer. The "CF alignment" means the alignment of liquid crystal molecules near the CF substrate. In the 4D-RTN alignment liquid crystal display panel including the slit electrode shown in FIG. 55, the liquid crystal layer is provided with twist alignment and liquid crystal molecules in the portion indicated by the letter "A" and liquid crystal molecules in the portion indicated by the letter "B" in the center portion of the liquid crystal layer are considered to be shifted from Alignment a to Alignment b without stopping when the states shift from pushing with a finger to removal of the finger. Liquid crystal molecules in the portion indicated by the letter "C" in the center portion of the liquid crystal layer, however, become parallel to the pre-tilt direction of the liquid crystal molecules near the CF substrate (Alignment c) in the course of the shift from Alignment a to Alignment b. This means that the liquid crystal molecules are trapped in this stable state without a twist and fail to be shifted to Alignment b. This phenomenon is presumed to cause dark lines and a mark left by pushing with a finger. In the liquid crystal display panel including a planar electrode instead of a slit electrode, the alignment of liquid crystal molecules in any of the portions does not change between pushing with a finger and removal of the finger, and thus no mark is left by pushing with a finger.

Figure 59:
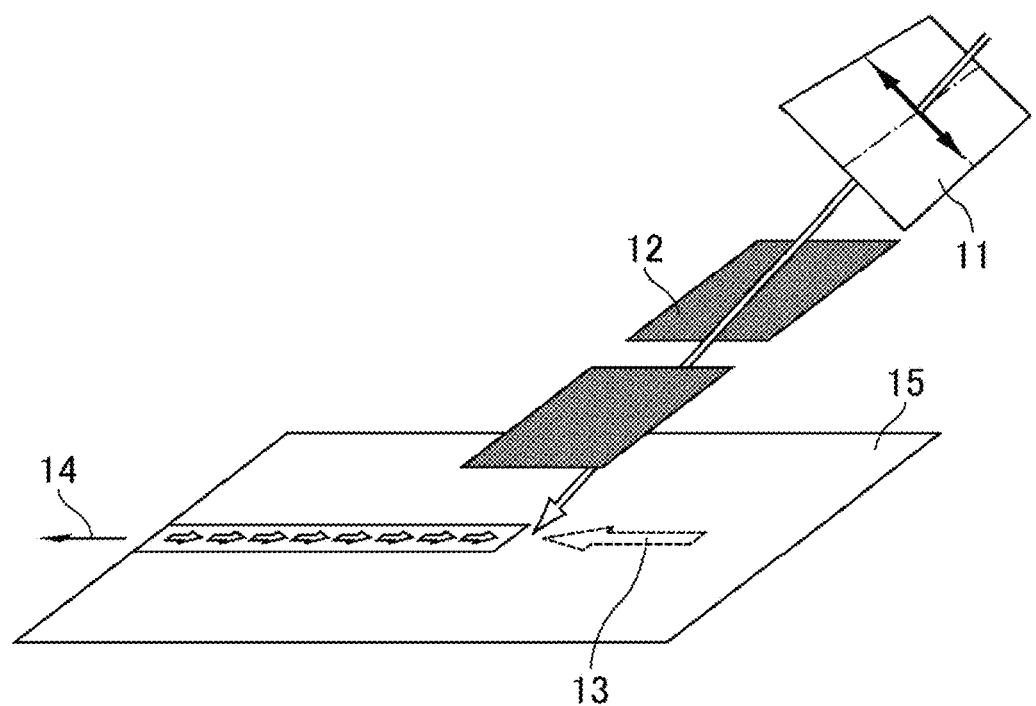
FIG. 59 is a schematic view of an exposure device in Comparative Example 1.
Figure 60:
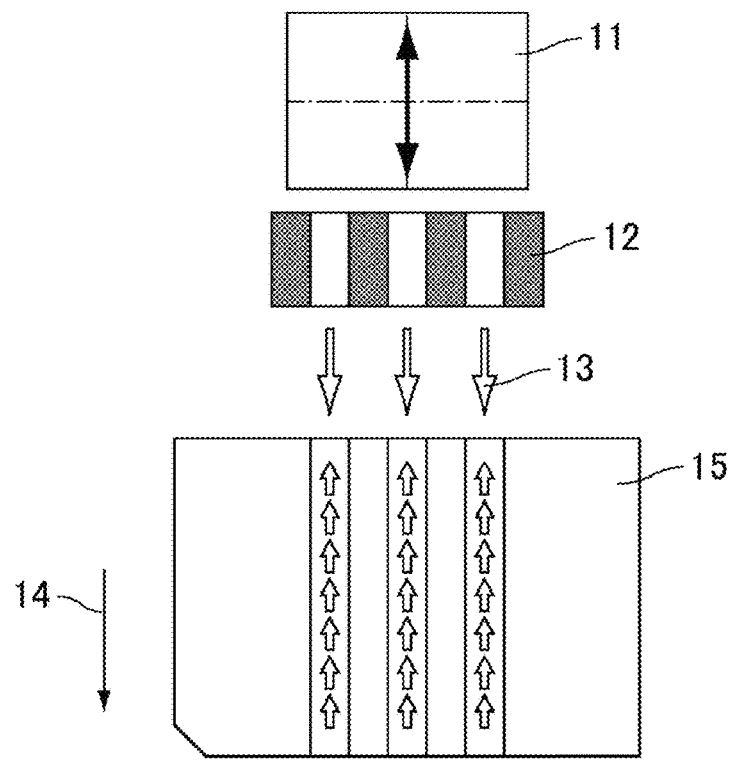
FIG. 60 is a schematic view showing first exposure in Comparative Example 1.
Figure 61:
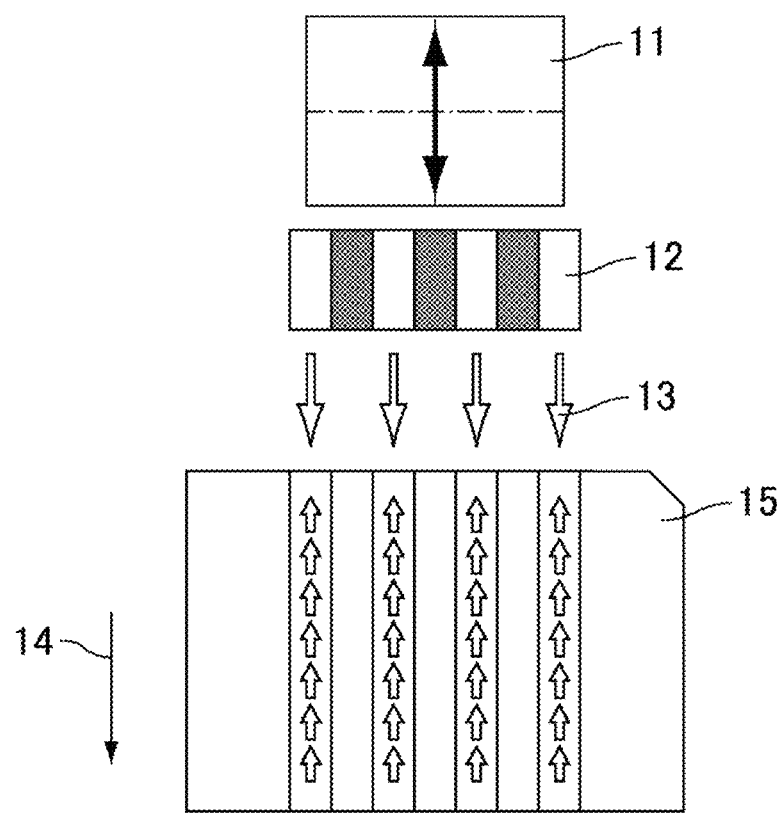
FIG. 61 is a schematic view showing second exposure in Comparative Example 1.
Figure 62:
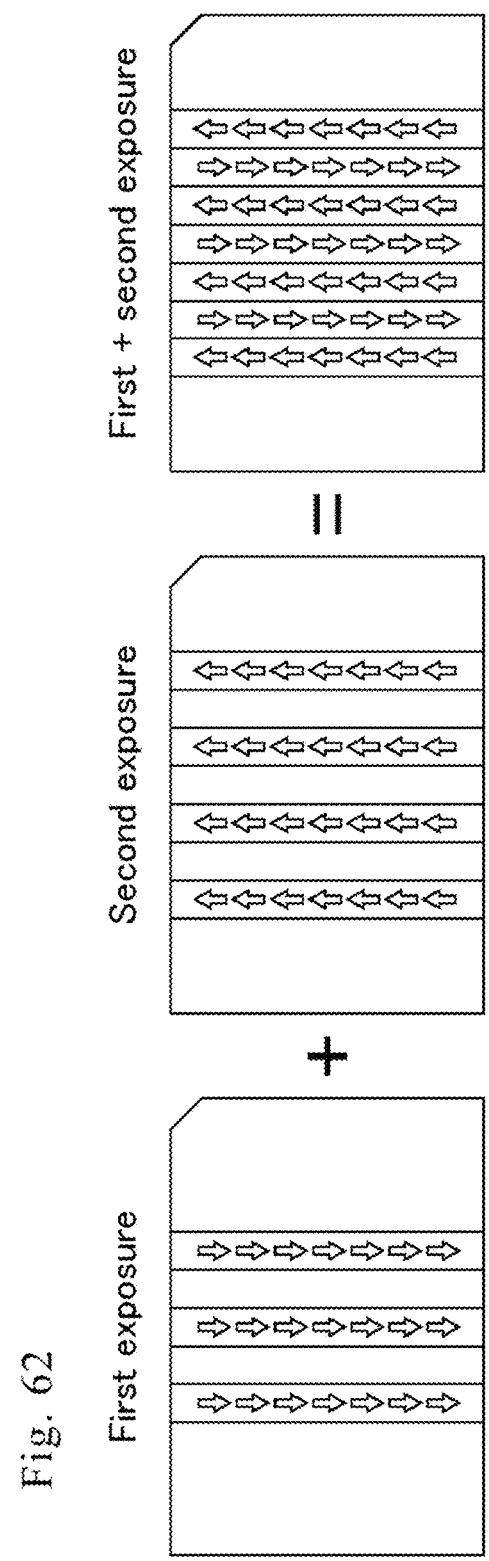
FIG. 62 is a schematic view showing pre-tilt directions of liquid crystal molecules provided by first exposure, second exposure, and both of the exposure treatments of a photo-alignment film of a substrate in the liquid crystal display panel of Comparative Example 1.

FIG. 59 is a schematic view of an exposure device in Comparative Example 1. FIG. 60 is a schematic view showing first exposure in Comparative Example 1. FIG. 61 is a schematic view showing second exposure in Comparative Example 1. FIG. 62 is a schematic view showing pre-tilt directions of liquid crystal molecules provided by first exposure, second exposure, and both of the exposure treatments of a photo-alignment film of a substrate in the liquid crystal display panel of Comparative Example 1. These exposure treatments can be performed using a conventional exposure device.

(Reason for Difficulty in Scanning in Direction Perpendicular to Exposure Direction)

(1) In the Case where Exposure Direction and Scanning Direction are Parallel

Figure 63:
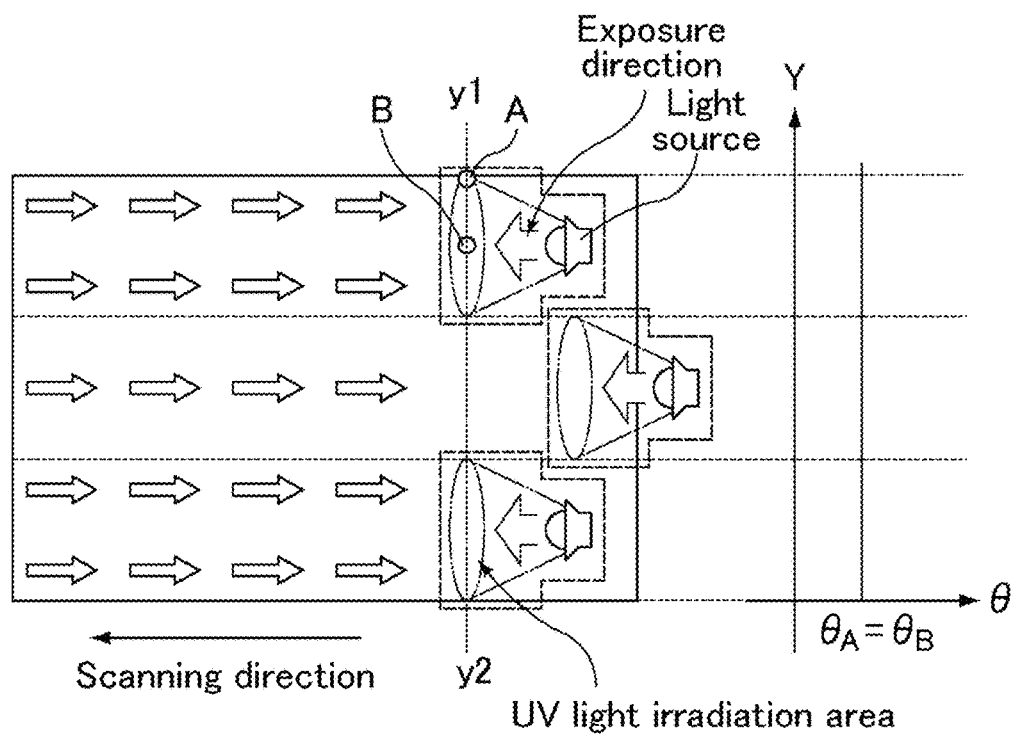
FIG. 63 is a schematic plan view whose left part shows exposure of a photo-alignment film in the case of parallel exposure direction and scanning direction viewed from directly above the photo-alignment film and whose right part shows incident angle distribution of light from a light source along the y1-y2 axis in the left part.
Figure 64:
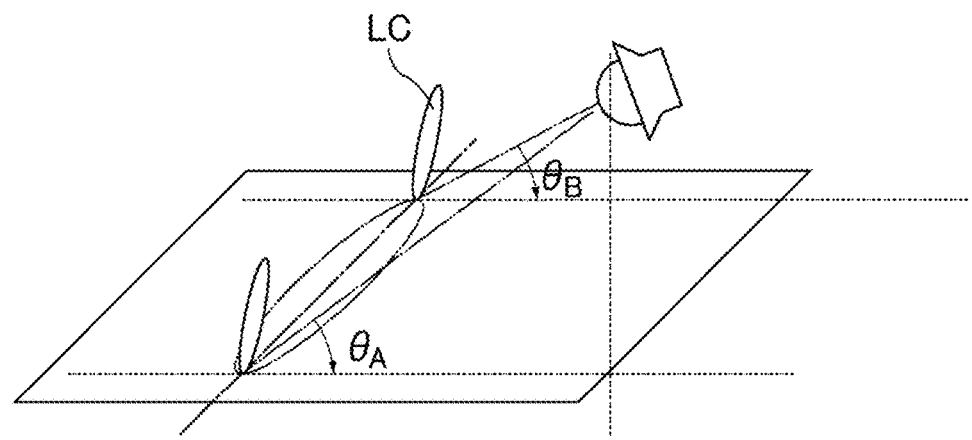
FIG. 64 is a perspective view of exposure of a photo-alignment film in the case of parallel exposure direction and scanning direction.

FIG. 63 is a schematic plan view whose left part shows exposure of a photo-alignment film in the case of parallel exposure direction and scanning direction viewed from directly above the photo-alignment film and whose right part is a graph showing incident angle distribution of light from a light source along the y1-y2 axis in the left part. FIG. 64 is a perspective view of exposure of a photo-alignment film in the case of parallel exposure direction and scanning direction.

As shown in FIG. 64, in an ultraviolet light (UV light) irradiation area by one light source, the incident angle is almost the same at any position ($\theta_A \approx \theta_B$). Hence, the pre-tilt angle of the liquid crystal molecules LC does not vary, and thus the liquid crystal display device including the photo-alignment films obtained in this manner can exhibit excellent display quality.

Figure 65:
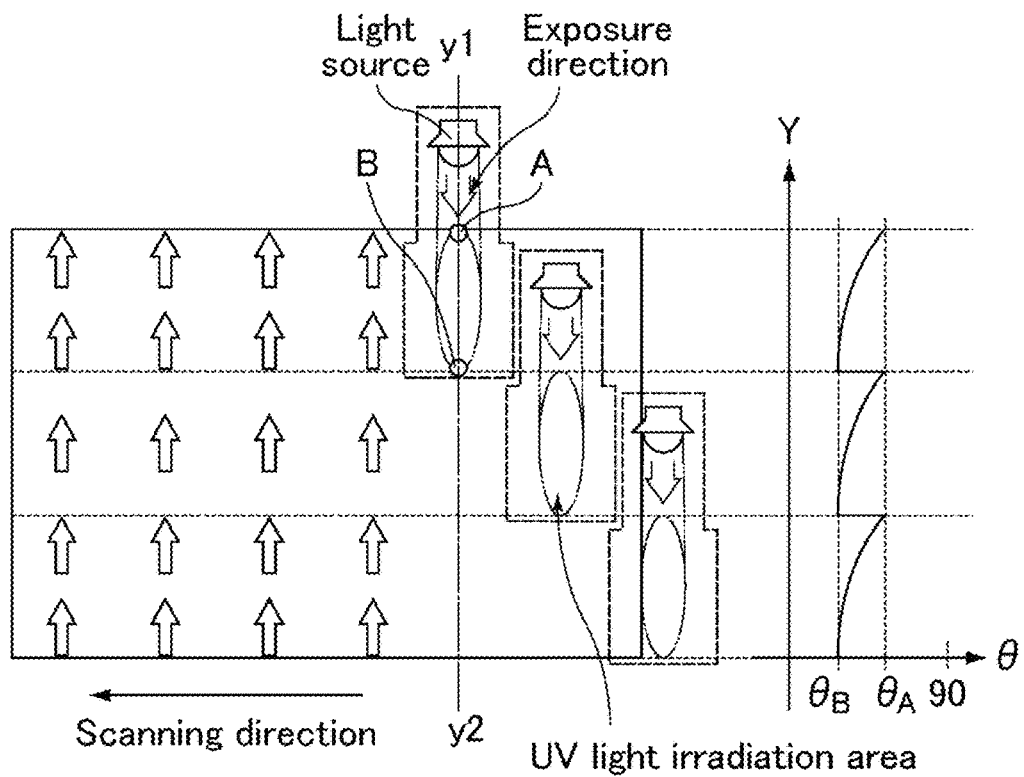
FIG. 65 is a schematic plan view whose left part shows exposure of a photo-alignment film in the case of perpendicular exposure direction and scanning direction viewed from directly above the photo-alignment film and whose right part shows incident angle distribution of light from a light source along the y1-y2 axis in the left part.
Figure 66:
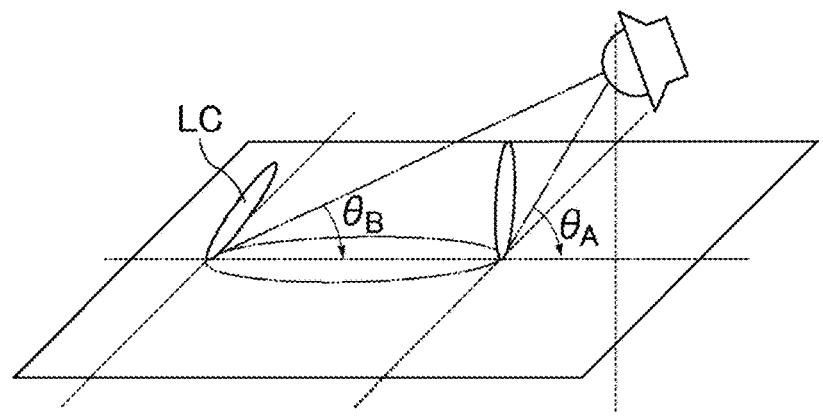
FIG. 66 is a perspective view of exposure of a photo-alignment film in the case of perpendicular exposure direction and scanning direction.

(2) In the Case where Exposure Direction and Scanning Direction are Perpendicular FIG. 65 is a schematic plan view whose left part shows exposure of a photo-alignment film in the case of perpendicular exposure direction and scanning direction viewed from directly above the photo-alignment film and whose right part is a graph showing incident angle distribution of light from a light source along the y1-y2 axis in the left part. FIG. 66 is a perspective view of exposure of a photo-alignment film in the case of perpendicular exposure direction and scanning direction.

As shown in FIG. 66, in a UV light irradiation area by one light source, the incident angle varies in the irradiation area ($\theta_A \neq \theta_B$). More specifically, the incident angle is smaller at a position farther from the light source, showing incident angle distribution in the Y direction. This increases variation of the pre-tilt angle of liquid crystal molecules LC, and thus the resulting liquid crystal display device including the photo-alignment films obtained in this manner exhibits poor display quality.

Comparative Example 2

Figure 67:
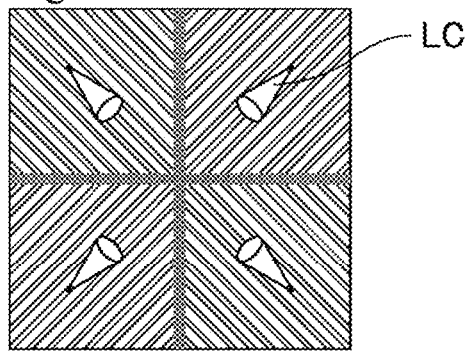
FIG. 67 is a schematic plan view showing the relation between four domains, the alignment directions of liquid crystal molecules, and an electrode provided with slits in each half pixel in a liquid crystal display panel of Comparative Example 2.
Figure 68:
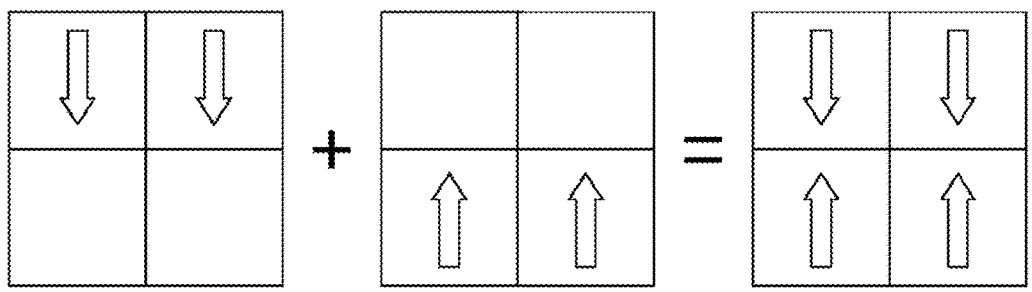
FIG. 68 is a schematic plan view showing pre-tilt directions of liquid crystal molecules provided by first exposure, second exposure, and both of the exposure treatments of a photo-alignment film of a TFT substrate in each half pixel in the liquid crystal display panel of Comparative Example 2.
Figure 69:
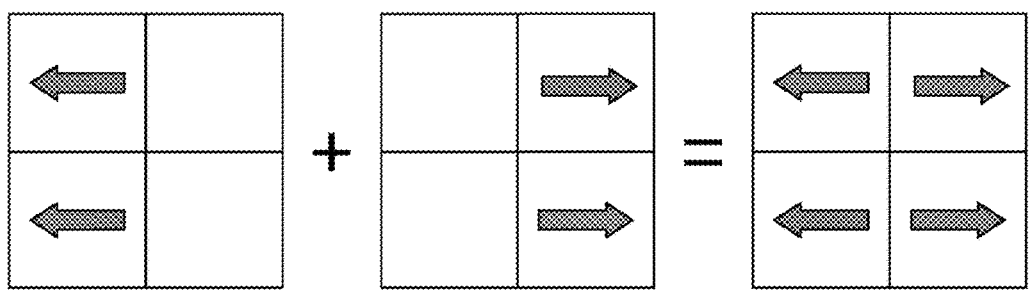
FIG. 69 is a schematic plan view showing pre-tilt directions of liquid crystal molecules provided by first exposure, second exposure, and both of the exposure treatments of a photo-alignment film of a CF substrate in each half pixel in the liquid crystal display panel of Comparative Example 2.

FIG. 67 is a schematic plan view showing the relation between four domains, the alignment directions of liquid crystal molecules, and an electrode provided with slits in each half pixel in a liquid crystal display panel of Comparative Example 2. FIG. 67 shows the above relation in the ON state (in white display). FIG. 68 is a schematic plan view showing pre-tilt directions of liquid crystal molecules provided by first exposure, second exposure, and both of the exposure treatments of a photo-alignment film of a TFT substrate in each half pixel in the liquid crystal display panel of Comparative Example 2. FIG. 69 is a schematic plan view showing pre-tilt directions of liquid crystal molecules provided by first exposure, second exposure, and both of the exposure treatments of a photo-alignment film of a CF substrate in each half pixel in the liquid crystal display panel of Comparative Example 2.

In the liquid crystal display panel of Comparative Example 2, the liquid crystal layer is provided with twist alignment, and the direction in which liquid crystal molecules are rotated for alignment by electric fields generated by slit electrodes is different from the pre-tilt direction provided by the photo-alignment film(s) of the TFT substrate and/or the CF substrate. Hence, a mark left by pushing with a finger was not removed as in the case of the modified example of Comparative Example 1.

Figure 70:
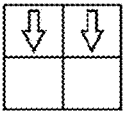
FIG. 70 is a conceptual view showing pre-tilt directions of liquid crystal molecules provided by first exposure, second exposure, and both of the exposure treatments of a photo-alignment film of a TFT substrate, together with exposure directions and scanning directions, in each half pixel in the liquid crystal display panel of Comparative Example 2.
Figure 71:
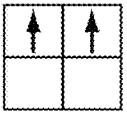
FIG. 71 is a conceptual view showing pre-tilt directions of liquid crystal molecules provided by first exposure, second exposure, and both of the exposure treatments of a photo-alignment film of a CF substrate, together with exposure directions and scanning directions, in each half pixel in the liquid crystal display panel of Comparative Example 2.
Figure 72:
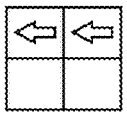
FIG. 72 is a conceptual view showing pre-tilt directions of liquid crystal molecules provided by first exposure, second exposure, and both of the exposure treatments of a photo-alignment film of a TFT substrate, together with exposure directions and scanning directions, in each pixel in the liquid crystal display device shown in FIG. 6 of Patent Literature 2.
Figure 73:
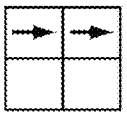
FIG. 73 is a conceptual view showing pre-tilt directions of liquid crystal molecules provided by first exposure, second exposure, and both of the exposure treatments of a photo-alignment film of a CF substrate, together with exposure directions and scanning directions, in each pixel in the liquid crystal display device shown in FIG. 7 of Patent Literature 2.
Figure 74:
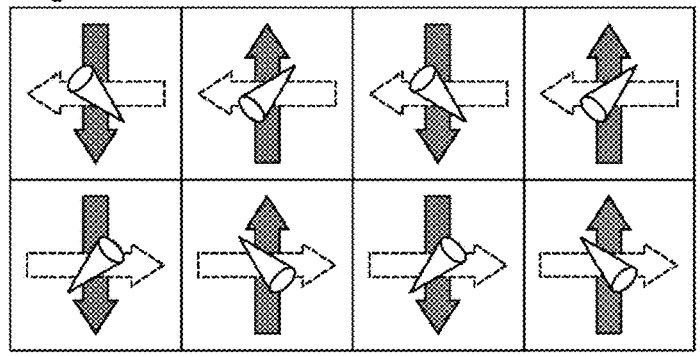
FIG. 74 is a conceptual view showing liquid crystal layer alignment achieved by the photo-alignment film of the TFT substrate in FIG. 72 and the photo-alignment film of the CF substrate in FIG. 73 in combination.
Figure 75:
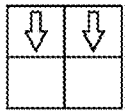
FIG. 75 is a conceptual view showing pre-tilt directions of liquid crystal molecules provided by first exposure, second exposure, and both of the exposure treatments of a photo-alignment film of a TFT substrate, together with exposure directions and scanning directions, in each pixel in the liquid crystal display device described in paragraph [0040] of Patent Literature 2.
Figure 76:
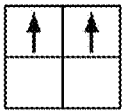
FIG. 76 is a conceptual view showing pre-tilt directions of liquid crystal molecules provided by first exposure, second exposure, and both of the exposure treatments of a photo-alignment film of a CF substrate, together with exposure directions and scanning directions, in each pixel in the liquid crystal display device described in paragraph [0040] of Patent Literature 2.
Figure 77:
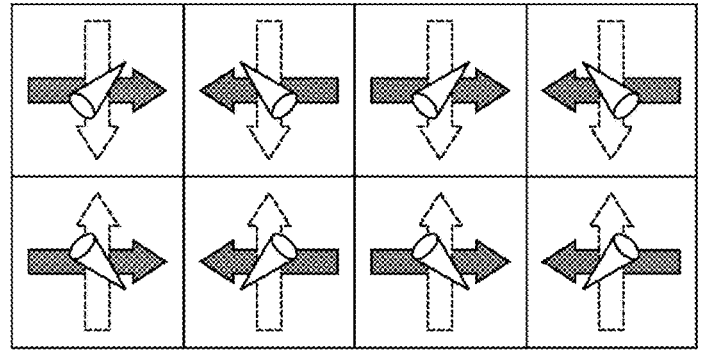
FIG. 77 is a conceptual view showing liquid crystal layer alignment achieved by the photo-alignment film of the TFT substrate in FIG. 75 and the photo-alignment film of the CF substrate in FIG. 76 in combination.

FIG. 70 is a conceptual view showing pre-tilt directions of liquid crystal molecules provided by first exposure, second exposure, and both of the exposure treatments of a photo-alignment film of a TFT substrate, together with exposure directions and scanning directions, in each half pixel in the liquid crystal display panel of Comparative Example 2. FIG. 71 is a conceptual view showing pre-tilt directions of liquid crystal molecules provided by first exposure, second exposure, and both of the exposure treatments of a photo-alignment film of a CF substrate, together with exposure directions and scanning directions, in each half pixel in the liquid crystal display panel of Comparative Example 2.

In the liquid crystal display panel of Comparative Example 2, the scanning direction and the exposure direction are perpendicular to each other, so that scanning with a conventional exposure device is difficult and therefore production is difficult.

Examples of the liquid crystal display device including the liquid crystal display panel of the present invention include on-board devices such as automotive navigation systems, electronic book readers, digital photo frames, industrial equipment, televisions, personal computers, smartphones, and tablet PCs. The present invention is preferably applied to devices that can be used both at high temperatures and low temperatures, including on-board devices such as automotive navigation systems.

By observation of the TFT substrate with a microscope such as a scanning electric microscope (SEM), the electrode structure, for example, of the liquid crystal display panel of the present invention can be determined.

REFERENCE SIGNS LIST

LC: liquid crystal molecule
A, B, C: position (of liquid crystal molecules)
a, b, c: alignment
1, 11: UV polarizer
2, 12: UV exposure mask
3, 13: UV light irradiation direction
4, 14: moving direction of substrate
5, 15: substrate
6: polarization axis
7: pre-tilt azimuth
111, 211: first polarizing plate
111a, 211a: polarization axis
113, 213: substrate including TFT
115, 125, 215, 225: ITO
117, 127, 217, 227: photo-alignment film
121, 221: second polarizing plate
121a, 221a: polarization axis
123, 223: substrate including CF

The invention claimed is:

1. A liquid crystal display panel including multiple pixels arranged in a matrix, comprising in the given order:
a first polarizing plate;
a first substrate including pixel electrodes each provided with a slit;
a first alignment film;
a liquid crystal layer containing liquid crystal molecules having negative anisotropy of dielectric constant;
a second alignment film;
a second substrate including a counter electrode; and
a second polarizing plate,
the first polarizing plate and the second polarizing plate being arranged such that their polarization axes are perpendicular to each other,
with an azimuth in a transverse direction of each pixel defined as 0°, the pixel electrode in each of the pixels including a first linear electrode group extending parallel to an azimuth of approximately 45°, a second linear electrode group extending parallel to an azimuth of approximately 135°, a third linear electrode group extending parallel to an azimuth of approximately 225°, and a fourth linear electrode group extending parallel to an azimuth of approximately 315°,
the first alignment film and the second alignment film each aligning the liquid crystal molecules in a direction approximately perpendicular to a film surface with no voltage applied to the liquid crystal layer while providing a pre-tilt angle to the liquid crystal molecules in at least one region,
the first alignment film and the second alignment film each including a first alignment region superimposed on the first linear electrode group, a second alignment region superimposed on the second linear electrode group, a third alignment region superimposed on the third linear electrode group, and a fourth alignment region superimposed on the fourth linear electrode group,
the first alignment regions, the second alignment regions, the third alignment regions and the fourth alignment regions are arranged sequentially counterclockwise in a matrix shape of two lines and two rows,
one of the first alignment film and the second alignment film including the first alignment region provided with a pre-tilt angle at an azimuth of approximately 225°, the second alignment region provided with substantially no pre-tilt angle, the third alignment region provided with a pre-tilt angle at an azimuth of approximately 45°, and the fourth alignment region provided with a pre-tilt angle at an azimuth approximately perpendicular to the fourth linear electrode group,
the other of the first alignment film and the second alignment film including the first alignment region provided with substantially no pre-tilt angle, the second alignment region provided with a pre-tilt angle at an azimuth of approximately 135°, the third alignment region provided with a pre-tilt angle at an azimuth approximately perpendicular to the third linear electrode group, and the fourth alignment region provided with a pre-tilt angle at an azimuth of approximately 315°,
the azimuth of the third alignment region of the first alignment film being parallel or anti-parallel to the azimuth of the fourth alignment region of the first alignment film and,
the azimuth of the third alignment region of the second alignment film being parallel or anti-parallel to the azimuth of the fourth alignment region of the second alignment film.

2. The liquid crystal display panel according to claim 1, wherein the alignment films are photo-alignment films providing a pre-tilt angle to the liquid crystal molecules in a region subjected to photo-alignment treatment.

3. A method for manufacturing the liquid crystal display panel according to claim 2, comprising
a photo-alignment treatment step of irradiating a first substrate provided with a first alignment film on a surface and a second substrate provided with a second alignment film on a surface with light emitted by a light source through a polarizer,
wherein the photo-alignment treatment step is performed while the first substrate or the second substrate is moved or the light source is moved relative to the first substrate or the second substrate,
the light irradiation direction for the first substrate or the second substrate is parallel to the moving direction of the first substrate or the second substrate or the moving direction of the light source, and
a polarization axis of the polarizer and the light irradiation direction are different from each other.

4. The method according to claim 3, wherein the polarization axis of the polarizer and the light irradiation direction form an angle of approximately 45°.

5. The liquid crystal display panel according to claim 1, wherein each pixel electrode includes a cross-shaped electrode portion superimposed on boundaries between the first alignment region, the second alignment region, the third alignment region, and the fourth alignment region in a plan view, and the first linear electrode group, the second linear electrode group, the third linear electrode group, and the fourth linear electrode group which extend from the cross-shaped electrode portion.

6. The liquid crystal display panel according to claim 5, wherein the first linear electrode group, the second linear electrode group, the third linear electrode group, and the fourth linear electrode group are line-symmetric about at least one of two linear portions constituting the cross-shaped electrode portion.

7. The liquid crystal display panel according to claim 5, wherein the first linear electrode group, the second linear electrode group, the third linear electrode group, and the fourth linear electrode group are alternately connected to opposite sides of at least one of two linear portions constituting the cross-shaped electrode portion.

8. The liquid crystal display panel according to claim 1, wherein each pixel electrode includes a quadrangular portion, linear electrode portions extending from the quadrangular portion to be superimposed on boundaries between the first alignment region, the second alignment region, the third alignment region, and the fourth alignment region in a plan view, and the first linear electrode group, the second linear electrode group, the third linear electrode group, and the fourth linear electrode group which extend from the quadrangular portion and the linear electrode portions.

9. A method for manufacturing a liquid crystal display panel, the liquid crystal display panel including multiple pixels arranged in a matrix, the liquid crystal display panel comprising in the given order: a first polarizing plate; a first substrate including pixel electrodes each provided with a slit; a first alignment film; a liquid crystal layer containing liquid crystal molecules having negative anisotropy of dielectric constant; a second alignment film; a second substrate including a counter electrode; and a second polarizing plate, the first polarizing plate and the second polarizing plate being arranged such that their polarization axes are perpendicular to each other, with an azimuth in a transverse direction of each pixel defined as 0°, the pixel electrode in each of the pixels including a first linear electrode group extending parallel to an azimuth of approximately 45°, a second linear electrode group extending parallel to an azimuth of approximately 135°, a third linear electrode group extending parallel to an azimuth of approximately 225°, and a fourth linear electrode group extending parallel to an azimuth of approximately 315°, the first alignment film and the second alignment film each aligning the liquid crystal molecules in a direction approximately perpendicular to a film surface with no voltage applied to the liquid crystal layer while providing a pre-tilt angle to the liquid crystal molecules in at least one region, the first alignment film and the second alignment film each including a first alignment region superimposed on the first linear electrode group, a second alignment region superimposed on the second linear electrode group, a third alignment region superimposed on the third linear electrode group, and a fourth alignment region superimposed on the fourth linear electrode group, the first alignment regions, the second alignment regions, the third alignment regions and the fourth alignment regions are arranged sequentially counterclockwise in a matrix shape of two lines and two rows, one of the first alignment film and the second alignment film including the first alignment region provided with a pre-tilt angle at an azimuth of approximately 225°, the second alignment region provided with substantially no pre-tilt angle, the third alignment region provided with a pre-tilt angle at an azimuth of approximately 45°, and the fourth alignment region provided with a pre-tilt angle at an azimuth approximately perpendicular to the fourth linear electrode group, the other of the first alignment film and the second alignment film including the first alignment region provided with substantially no pre-tilt angle, the second alignment region provided with a pre-tilt angle at an azimuth of approximately 135°, the third alignment region provided with a pre-tilt angle at an azimuth approximately perpendicular to the third linear electrode group, and the fourth alignment region provided with a pre-tilt angle at an azimuth of approximately 315°, the azimuth of the third alignment region of the first alignment film being parallel or anti-parallel to the azimuth of the fourth alignment region of the first alignment film, the azimuth of the third alignment region of the second alignment film being parallel or anti-parallel to the azimuth of the fourth alignment region of the second alignment film, and the alignment films are photo-alignment films providing a pre-tilt angle to the liquid crystal molecules in a region subjected to photo-alignment treatment, the method comprising
a photo-alignment treatment step of irradiating the first substrate provided with the first alignment film on a surface and the second substrate provided with the second alignment film on a surface with light emitted by a light source through a polarizer,
wherein the photo-alignment treatment step is performed while the first substrate or the second substrate is moved or the light source is moved relative to the first substrate or the second substrate,
the light irradiation direction for the first substrate or the second substrate is parallel to the moving direction of the first substrate or the second substrate or the moving direction of the light source, and
a polarization axis of the polarizer projected on a surface of the first substrate or a surface of the second substrate and the light irradiation direction form an angle of approximately 45°.

10. The method for manufacturing the liquid crystal display panel according to claim 9, wherein the photo-alignment treatment step includes a first exposure of irradiating a first region of the first alignment film or the second alignment with light, and a second exposure of irradiating the first region with light.

11. The method for manufacturing the liquid crystal display panel according to claim 10, wherein light irradiation directions in the first exposure and the second exposure are different from each other.

* * * * *